(12) United States Patent
Buesing et al.

(10) Patent No.: US 10,273,404 B2
(45) Date of Patent: Apr. 30, 2019

(54) MATERIALS FOR ELECTRONIC DEVICES

(75) Inventors: Arne Buesing, Frankfurt am Main (DE); Holger Heil, Frankfurt am Main (DE); Christof Pflumm, Frankfurt am Main (DE); Joachim Kaiser, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 990 days.

(21) Appl. No.: 13/583,404

(22) PCT Filed: Feb. 15, 2011

(86) PCT No.: PCT/EP2011/000706
§ 371 (c)(1),
(2), (4) Date: Sep. 7, 2012

(87) PCT Pub. No.: WO2011/110276
PCT Pub. Date: Sep. 15, 2011

(65) Prior Publication Data
US 2012/0326602 A1   Dec. 27, 2012

(30) Foreign Application Priority Data
Mar. 9, 2010  (DE) ................ 10 2010 010 631

(51) Int. Cl.
| | |
|---|---|
| C09K 11/06 | (2006.01) |
| H05B 33/10 | (2006.01) |
| H05B 33/14 | (2006.01) |
| C09K 11/02 | (2006.01) |
| H01L 51/00 | (2006.01) |
| H05B 33/20 | (2006.01) |
| C09B 57/00 | (2006.01) |
| C09B 1/00 | (2006.01) |
| C09B 3/02 | (2006.01) |
| H01L 51/50 | (2006.01) |

(52) U.S. Cl.
CPC ............... *C09K 11/06* (2013.01); *C09B 1/00* (2013.01); *C09B 3/02* (2013.01); *C09B 57/001* (2013.01); *C09B 57/008* (2013.01); *C09K 11/025* (2013.01); *H01L 51/006* (2013.01); *H01L 51/0058* (2013.01); *H05B 33/14* (2013.01); *H05B 33/20* (2013.01); *C09K 2211/1007* (2013.01); *C09K 2211/1011* (2013.01); *C09K 2211/1014* (2013.01); *H01L 51/5012* (2013.01)

(58) Field of Classification Search
None
See application file for complete search history.

(56) References Cited

U.S. PATENT DOCUMENTS

| | | | |
|---|---|---|---|
| 2007/0087222 A1* | 4/2007 | Kim | ................ C09K 11/06 428/690 |
| 2009/0128010 A1 | 5/2009 | Hyun et al. | |
| 2010/0187505 A1 | 7/2010 | Stoessel et al. | |
| 2012/0068170 A1 | 3/2012 | Pflumm et al. | |

FOREIGN PATENT DOCUMENTS

| | | | | |
|---|---|---|---|---|
| JP | 2001131541 A * | 5/2001 | ............... | C09B 6/00 |
| JP | 2007-015933 A | 1/2007 | | |
| WO | WO-2008/094399 A1 | 8/2008 | | |
| WO | WO-2008145239 A2 | 12/2008 | | |
| WO | WO-2011032686 A1 | 3/2011 | | |

OTHER PUBLICATIONS

Machine English translation of Hosokawa et al. (JP 2001-131541 A). Jun. 14, 2017.*
International Search Report for PCT/EP2011/000706 dated May 26, 2011.

* cited by examiner

*Primary Examiner* — Jay Yang
(74) *Attorney, Agent, or Firm* — Drinker Biddle & Reath LLP

(57) ABSTRACT

The invention relates to an organic electroluminescent device comprising an anode and a cathode and at least one electroluminescent layer arranged between the anode and cathode which comprises at least one compound of the formula (I) and at least one compound of the formula (II). The invention furthermore relates to the production of an organic electroluminescent device by means of a sublimation process and/or by application from solution and to a mixture comprising at least one compound of the formula (I) and at least one compound of the formula (II).

5 Claims, No Drawings

MATERIALS FOR ELECTRONIC DEVICES

CROSS-REFERENCE TO RELATED APPLICATIONS

This application is a national stage application (under 35 U.S.C. § 371) of PCT/EP2011/000706, filed Feb. 15, 2011, which claims benefit of German application 10 2010 010 631.3, filed Mar. 9, 2010.

The invention relates to an organic electroluminescent device comprising an anode and a cathode and at least one electroluminescent layer arranged between the anode and cathode which comprises at least one compound of the formula (I) and at least one compound of the formula (II). The invention furthermore relates to the production of the organic electroluminescent device according to the invention by means of a sublimation process and/or by application from solution and to a mixture comprising at least one compound of the formula (I) and at least one compound of the formula (II).

Organic semiconductor materials, such as the compounds mentioned above, are being developed for a number of different electronic applications. The structure of organic electroluminescent devices (OLEDs) in which these organic semiconductors are employed as functional materials is described, for example, in U.S. Pat. Nos. 4,539,507, 5,151, 629, EP 0676461 and WO 98/27136. However, further improvements are still necessary before these devices can be used for high-quality and long-lifetime displays, such as, for example, televisions. Thus, there is currently still a need for improvement, in particular, in the area of the lifetime, the efficiency and the colour purity of green-emitting organic electroluminescent devices.

A further requirement of light-emitting organic compounds is a small difference between excitation and emission wavelength, which is also known as the "Stokes shift". The green dopant materials known from the prior art exhibit predominantly broad emission bands, which is associated with a loss of efficiency and an impairment of the emission characteristics. The organic electroluminescent devices available today furthermore still require a relatively high operating voltage, which is disadvantageous, in particular, for mobile applications.

For fluorescent OLEDs, condensed aromatic compounds, in particular anthracene derivatives, in particular are used in accordance with the invention as matrix materials. For example, diaminoanthracenes are introduced as dopants into the light-emitting layer of organic electroluminescent devices. The matrix material also influences the emission characteristics of the dopant compound.

WO 2007/021117 describes green-light-emitting organic electroluminescent devices which comprise 2,6-diaminoanthracenes as dopants. These are combined with derivatives of anthracene, benz[a]anthracene or naphthacene in the electroluminescent layer. Substituents used in the anthracene derivatives are phenyl, 2-naphthyl, 2-anthracenyl, 2-fluoranthenyl, 1-pyrenyl, 2-fluorenyl, 4-biphenyl and 3-perylenyl groups.

US 2008/0182129 A1 describes an organic electroluminescent device in whose light-emitting layer a 2-arylanthracene compound is present as matrix material and a further anthracene compound is present as dopant. The light-emitting second anthracene compound is substituted at at least two positions by an amino group, where at least one amino group is arranged at position 2 of the anthracene skeleton. The 2-arylanthracene compound may be substituted in the 9- and 10-position by phenyl-1-naphthyl, 2-naphthyl, 4-biphenyl, perylenyl, fluoranthenyl, and phenanthryl groups.

EP 1 775 334 describes an organic electroluminescent device which comprises a 2,6-diaminoanthracene as dopant in its light-emitting layer. The matrix material used is a naphthalene, anthracene, phenanthrene or pyrene derivative. The anthracene derivatives may be substituted in position 9 and 10. Naphthyl, phenanthryl and p-terphenyl radicals are described as substituents.

The application WO 2008/145239 describes organic electroluminescent devices in whose light-emitting layer benzanthracene derivatives are present as matrix material, where monostyrylamines, distyrylamines, tristyrylamines, tetrastyrylamines, styrylphosphines, styryl ethers and arylamines are mentioned as fluorescent dopants. Arylamines which can be used are, for example, aromatic anthracenamines, aromatic anthracenediamines, aromatic pyrenamines, aromatic pyrenediamines, aromatic chrysenamines or aromatic chrysenediamines. An aromatic anthracenediamine in the sense of this application is taken to mean a compound in which two diarylamino groups are bonded directly to an anthracene group. The application WO 2008/145239 explicitly discloses anthracene derivatives which have a diarylamino group both in the 9-position and in the 10-position for use as dopants.

However, there continues to be a demand for alternative functional materials for organic electroluminescent devices. In particular, there is a demand for material combinations or mixtures which can be employed in the emitting layer of organic electroluminescent devices. This often represents a critical point in improving the properties, such as lifetime, colour purity and efficiency, of the devices.

The invention is based on the object of providing alternative combinations of matrix materials and dopants for use in the emitting layer of organic electroluminescent devices. In particular, it is based on the object of providing improved organic electroluminescent devices, where improvements preferably relate to the power efficiency of the devices and the emission characteristics.

It has been found in accordance with the invention that the combination of 2,6-diaminoanthracene compounds and benz[a]anthracenylanthracene compounds in the electroluminescent layer enables organic electroluminescent devices to be obtained which have high colour purity and high power efficiency.

The invention relates to an organic electroluminescent device comprising an anode and a cathode and at least one electroluminescent layer arranged between the anode and cathode, characterised in that the electroluminescent layer comprises at least one compound of the formula (I)

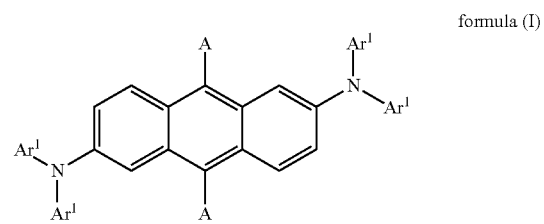

formula (I)

and at least one compound of the formula (II),

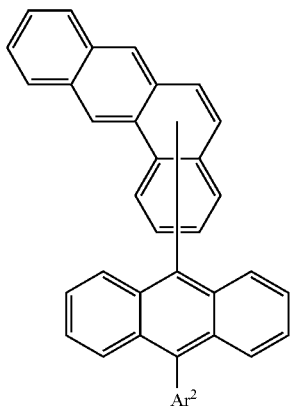

formula (II)

where the compound of the formula (I) may be substituted by a radical $R^2$ at all free positions of the anthracene ring system and where the compound of the formula (II) may be substituted by a radical $R^3$ at all free positions of the anthracene and benzanthracene ring system and where the following furthermore applies to the symbols occurring:

A is on each occurrence, identically or differently, a straight-chain alkyl group having 1 to 40 C atoms or a branched or cyclic alkyl group having 3 to 40 C atoms, each of which may be substituted by one or more radicals $R^1$, where one or more $CH_2$ groups may be replaced by —$R^1C$=$CR^1$—, —C≡C—, $Si(R^1)_2$, $Ge(R^1)_2$, $Sn(R^1)_2$, C=O, C=S, C=Se, C=$NR^1$, P(=O)($R^1$), SO, $SO_2$, $NR^1$, —O—, —S—, —COO— or —$CONR^1$— and where one or more H atoms may be replaced by D, F, Cl, Br, I, CN or $NO_2$, or an aromatic or heteroaromatic ring system having 5 to 60 aromatic ring atoms, which may be substituted by one or more radicals $R^1$;

$Ar^1$, $Ar^2$ is on each occurrence, identically or differently, an aromatic or heteroaromatic ring system having 5 to 60 aromatic ring atoms, which may be substituted by one or more radicals $R^1$, where two radicals $Ar^1$ which are bonded to the same nitrogen atom may be linked to one another by a single bond or a bridge selected from B($R^1$), C($R^1$)$_2$, Si($R^1$)$_2$, C=O, C=$NR^1$, C=C($R^1$)$_2$, O, S, S=O, $SO_2$, N($R^1$), P($R^1$) and P(=O)$R^1$;

$R^1$, $R^2$, $R^3$ are, identically or differently on each occurrence, H, D, F, Cl, Br, I, CHO, N($R^4$)$_2$, C(=O)$R^4$, P(=O)($R^4$)$_2$, S(=O)$R^4$, S(=O)$_2R^4$, $CR^4$=C($R^4$)$_2$, CN, $NO_2$, Si($R^4$)$_3$, B(O$R^4$)$_2$, OSO$_2R^4$, OH, COO$R^4$ or CON($R^4$)$_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals $R^4$, where one or more $CH_2$ groups may be replaced by —$R^4C$=$CR^4$—, —C≡C—, Si($R^4$)$_2$, Ge($R^4$)$_2$, Sn($R^4$)$_2$, C=O, C=S, C=Se, C=$NR^4$, P(=O)($R^4$), SO, $SO_2$, $NR^4$, —O—, —S—, —COO— or —$CONR^4$— and where one or more H atoms may be replaced by D, F, Cl, Br, I, CN or $NO_2$, or an aromatic or heteroaromatic ring system having 5 to 60 aromatic ring atoms, which may in each case be substituted by one or more non-aromatic radicals $R^4$, or an aryloxy or heteroaryloxy group having 5 to 60 aromatic ring atoms, which may be substituted by one or more non-aromatic radicals $R^4$, or a combination of these systems, where two or more radicals $R^1$, $R^2$ or $R^3$ may be linked to one another and may form a ring or ring system;

$R^4$ is, identically or differently on each occurrence, H, D, F or an aliphatic, aromatic and/or heteroaromatic organic radical having 1 to 20 C atoms, in which, in addition, one or more H atoms may be replaced by D or F; two or more identical or different substituents $R^4$ here may also be linked to one another and form a ring or ring system.

The numbering used in this application for the anthracene and benz[a]-anthracene compounds is shown below.

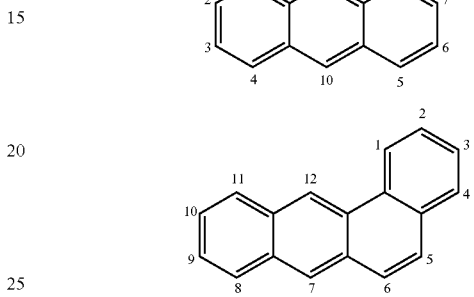

For the purposes of the present application, the term "free position" on a chemical group is taken to mean each atom which has at least one unoccupied bonding position in the structural formula of the relevant group. For example, all numbered positions in the numbered anthracene and benzanthracene compound shown above are free positions in the sense of this definition.

In order to convey that the benzanthracene ring system in formula (II) can be bonded to the anthracene group via one of positions 1, 2, 3, 4, 5 or 6, the bond is depicted as a line through the relevant rings. Thus, the generic formula (II)

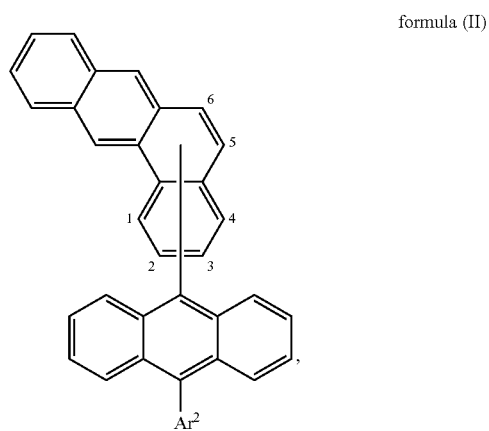

formula (II)

means that the anthracene group can be bonded in one of positions 1, 2, 3, 4, 5 or 6 of the benzanthracene group. In accordance with the invention, the bond is preferably at one of the two positions 4 and 5 of the benzanthracene group.

An aryl group in the sense of this invention contains 6 to 60 C atoms; a heteroaryl group in the sense of this invention contains 1 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed (fused) aryl or heteroaryl group, for example naphthalene, anthracene, phenanthrene, quinoline, isoquinoline, carbazole, etc.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole or combinations of these groups.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, N or O atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl group or by a silyl group.

An aromatic or heteroaromatic ring system having 5-60 aromatic ring atoms, which may also in each case be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals $R^1$ and $R^2$, is preferably taken to mean the radicals methyl, ethyl, n-propyl, i-propyl, n-butyl, i-butyl, s-butyl, t-butyl, 2-methylbutyl, n-pentyl, s-pentyl, cyclo-pentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

In a preferred embodiment of the invention, the compound of the formula (II) conforms to the formula (IIa)

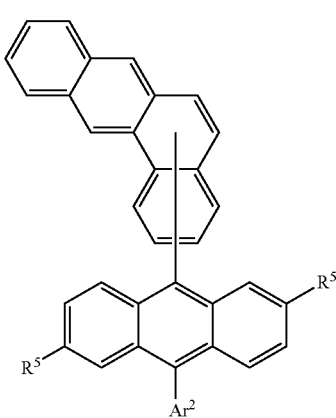

formula (IIa)

where the compound of the formula (IIa) may be substituted by a radical R³ at all free positions of the benzanthracene ring system and the free positions of the anthracene ring system are substituted by hydrogen and where furthermore the symbols occurring are as defined above, where the following applies to the radical R⁵:

R⁵ is on each occurrence, identically or differently, H, D, F, Cl, Br, I, CHO, N(R⁴)₂, C(=O)R⁴, P(=O)(R⁴)₂, S(=O) R⁴, S(=O)₂R⁴, CR⁴=C(R⁴)₂, CN, NO₂, Si(R⁴)₃, B(OR⁴)₂, OSO₂R⁴, OH, COOR⁴, CON(R⁴)₂, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals R⁴, where one or more CH₂ groups may be replaced by —R⁴C=CR⁴—, —C≡C—, Si(R⁴)₂, Ge(R⁴)₂, Sn(R⁴)₂, C=O, C=S, C=Se, C=NR⁴, P(=O)(R⁴), SO, SO₂, NR⁴, —O—, —S—, —COO— or —CONR⁴— and where one or more H atoms may be replaced by D, F, Cl, Br, I, CN or NO₂, or a combination of these systems.

It is preferred for R⁵ to be selected on each occurrence, identically or differently, from H, D, F, CN, NO₂, Si(R⁴)₃, OSO₂R⁴, OH, a straight-chain alkyl, alkoxy or thioalkyl group having 1 to 10 C atoms or a branched or cyclic alkyl, alkoxy or thioalkyl group having 3 to 10 C atoms or an alkenyl or alkynyl group having 2 to 10 C atoms, each of which may be substituted by one or more radicals R⁴, where one or more CH₂ groups may be replaced by —R⁴C=CR⁴—, —C≡C—, Si(R⁴)₂, C=O, C=NR⁴, P(=O)(R⁴), SO, SO₂, NR⁴, —O— or —S— and where one or more H atoms may be replaced by D, F, CN or NO₂, or a combination of these systems.

R⁵ is particularly preferably on each occurrence, identically or differently, H, D, a straight-chain alkyl group having 1 to 10 C atoms or a branched or cyclic alkyl group having 3 to 10 C atoms. R⁵ is very particularly preferably equal to H.

It is furthermore preferred in accordance with the invention for the bond between the benzanthracene group and the anthracene group in the compound of the formula (II) to be in the 4- or 5-position of the benzanthracene group.

This corresponds to compounds of the formulae (II-1) and (II-2), as explained for clarity formula (II-1)

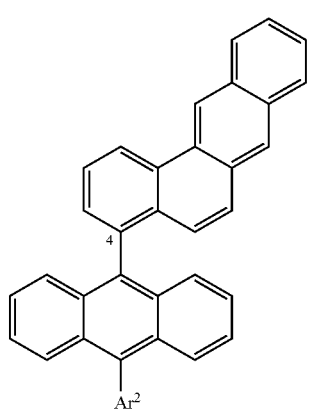

formula (II-2)

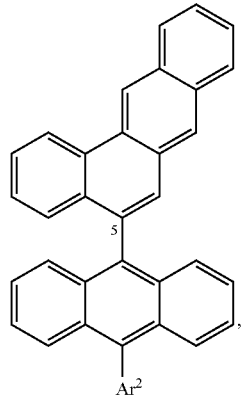

where Ar² has the above-mentioned meaning and the anthracene and benzanthracene ring system may be substituted by a radical R³ at all free positions.

It is equally preferred for compounds of the formula (IIa) for the benzanthracene group to be bonded to the anthracene group in the 4- or 5-position.

It is furthermore preferred for the compound of the formula (II) to be substituted by a radical R³ in positions 7 and 12 of the benzanthracene ring system and to be substituted by a hydrogen atom in all other free positions of the benzanthracene ring system.

It is preferred in accordance with the invention for A to be selected on each occurrence, identically or differently, from a straight-chain alkyl group having 1 to 10 C atoms or a branched or cyclic alkyl group having 3 to 10 C atoms, each of which may be substituted by one or more radicals R¹, where one or more CH₂ groups may be replaced by —R¹C=CR¹—, —C≡C—, Si(R¹)₂, C=O, C=NR¹, P(=O)(R¹), SO, SO₂, NR¹, —O—, —S—, —COO— or —CONR¹— and where one or more H atoms may be replaced by D, F, Cl, Br, I, CN or NO₂, or an aromatic or heteroaromatic ring system having 5 to 20 aromatic ring atoms, which may be substituted by one or more radicals R¹.

It is particularly preferred for A to be selected on each occurrence, identically or differently, from an aryl or heteroaryl group having 5 to 20 aromatic ring atoms, which may be substituted by one or more radicals R¹.

A is very particularly preferably on each occurrence, identically or differently, an aryl group having 5 to 20 aromatic ring atoms, which may be substituted by one or more radicals R¹.

In a preferred embodiment of the invention, A is selected on each occurrence, identically or differently, from the following groups

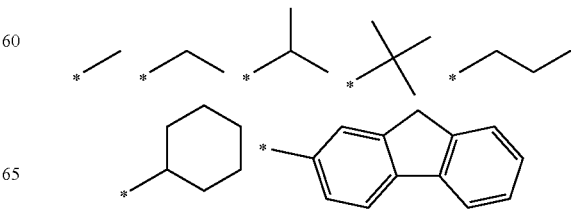

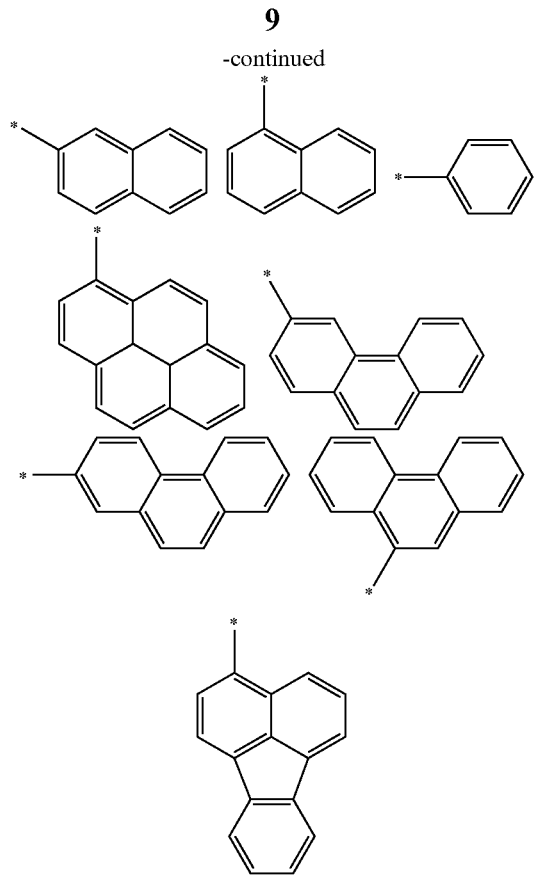

where the symbol * denotes the bond to the anthracene group, and the groups A may be substituted by a radical $R^1$ as defined above at all free positions.

It is preferred in accordance with the invention for $Ar^1$ to be selected on each occurrence, identically or differently, from an aromatic or heteroaromatic ring system having 5 to 20 aromatic ring atoms, which may be substituted by one or more radicals $R^1$, where two radicals $Ar^1$ which are bonded to the same nitrogen atom may be linked to one another by a single bond or a bridge selected from $C(R^1)_2$, C=O, C=NR$^1$, C=C(R$^1$)$_2$, —O—, —S—, S=O, $SO_2$ and $N(R^1)$.

$Ar^1$ is particularly preferably selected on each occurrence, identically or differently, from an aromatic ring system having 6 to 20 aromatic ring atoms, which may be substituted by one or more radicals $R^1$, where two radicals $Ar^1$ which are bonded to the same nitrogen atom may be linked to one another by a single bond or a bridge selected from $C(R^1)_2$, C=O, C=NR$^1$, C=C(R$^1$)$_2$, —O—, —S—, S=O, $SO_2$ and $N(R^1)$.

In a preferred embodiment of the invention, the groups $Ar^1$ bonded to the same nitrogen atom in compounds of the formula (I) are not identical.

In a further preferred embodiment of the invention, the two groups $Ar^1$ which are bonded to the same nitrogen atom in compounds of the formula (I) are not linked to one another by a single bond or a bridge selected from $C(R^1)_2$, C=O, C=NR$^1$, C=C(R$^1$)$_2$, —O—, —S—, S=O, $SO_2$ and $N(R^1)$.

In a preferred embodiment of the invention, $Ar^1$ is selected on each occurrence, identically or differently, from the following groups

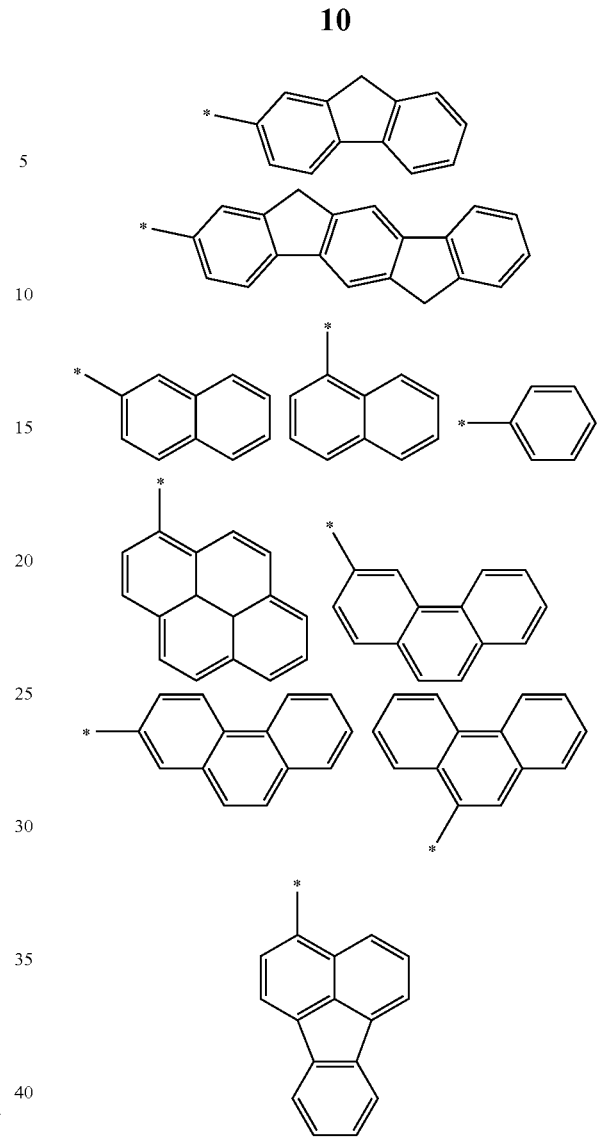

where the symbol * denotes the bond to the nitrogen atom, and the groups $Ar^1$ may be substituted by a radical $R^1$ as defined above at all free positions.

It is preferred in accordance with the invention for $Ar^2$ to be selected on each occurrence, identically or differently, from an aromatic or heteroaromatic ring system having 5 to 20 aromatic ring atoms, which may be substituted by one or more radicals $R^1$.

In a preferred embodiment of the invention, $Ar^2$ is selected on each occurrence, identically or differently, from the following groups

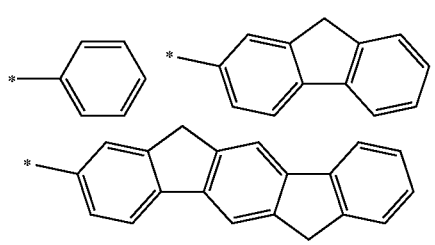

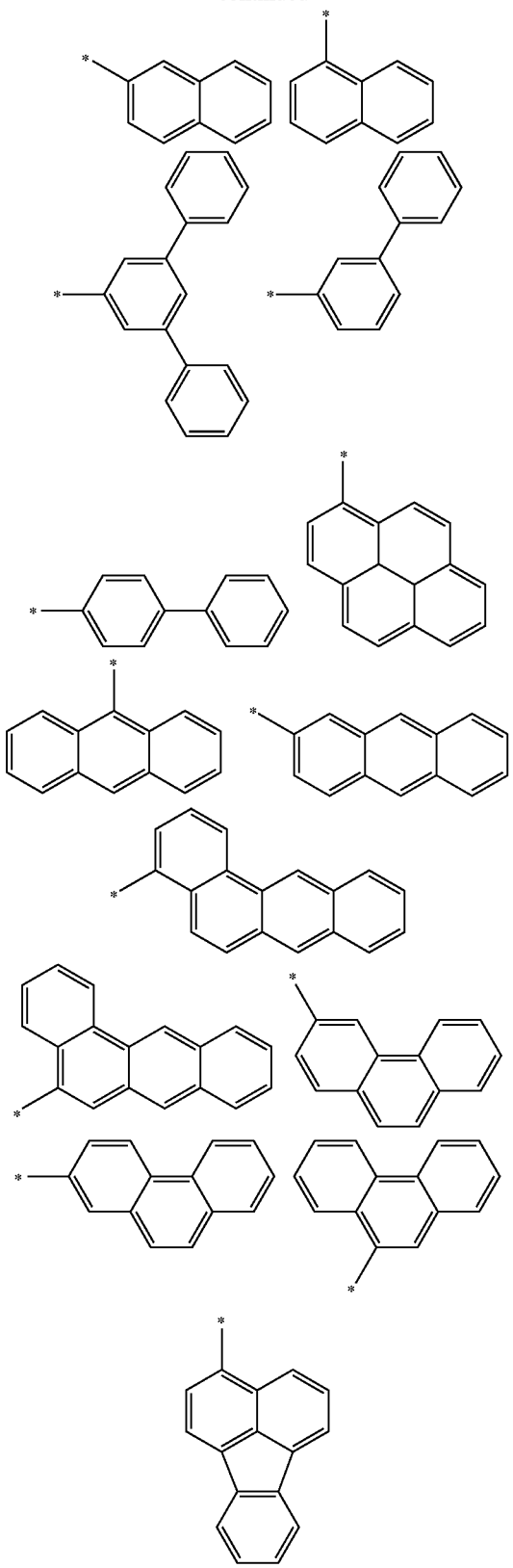

where the symbol * denotes the bond to the anthracene ring system, and the groups Ar² may be substituted by a radical R¹ as defined above at all free positions.

It is furthermore preferred for $R^1$ to be selected on each occurrence, identically or differently, from H, D, F, CN, $Si(R^4)_3$, $N(R^4)_2$ or a straight-chain alkyl or alkoxy group having 1 to 20 C atoms or a branched or cyclic alkyl or alkoxy group having 3 to 20 C atoms, each of which may be substituted by one or more radicals $R^4$, where one or more $CH_2$ groups may be replaced by —C≡C—, —$R^4$C=C$R^4$—, $Si(R^4)_2$, C=O, C=N$R^4$, N$R^4$, —O— or —S—, or an aryl or heteroaryl group having 5 to 30 aromatic ring atoms, which may in each case be substituted by one or more radicals $R^4$, where two or more radicals $R^1$ may be linked to one another and may form a ring or ring system.

It is furthermore preferred for $R^2$ to be selected on each occurrence, identically or differently, from H, D, F, CN, $Si(R^4)_3$, $N(R^4)_2$ or a straight-chain alkyl or alkoxy group having 1 to 20 C atoms or a branched or cyclic alkyl or alkoxy group having 3 to 20 C atoms, each of which may be substituted by one or more radicals $R^4$, where one or more $CH_2$ groups may be replaced by —C≡C—, —$R^4$C=C$R^4$—, $Si(R^4)_2$, C=O, C=N$R^4$, N$R^4$, —O— or —S—, or an aryl or heteroaryl group having 5 to 30 aromatic ring atoms, which may in each case be substituted by one or more radicals $R^4$, where two or more radicals $R^2$ may be linked to one another and may form a ring or ring system.

It is preferred in accordance with the invention for all radicals $R^2$ in the compound of the formula (I) to represent hydrogen atoms, i.e. for all free positions on the anthracene ring system to be substituted by hydrogen atoms.

It is furthermore preferred for $R^3$ to be selected on each occurrence, identically or differently, from H, D, F, CN, $Si(R^4)_3$, $N(R^4)_2$ or a straight-chain alkyl or alkoxy group having 1 to 20 C atoms or a branched or cyclic alkyl or alkoxy group having 3 to 20 C atoms, each of which may be substituted by one or more radicals $R^4$, where one or more $CH_2$ groups may be replaced by —C≡C—, —$R^4$C=C$R^4$—, $Si(R^4)_2$, C=O, C=N$R^4$, N$R^4$, —O— or —S—, or an aryl or heteroaryl group having 5 to 30 aromatic ring atoms, which may in each case be substituted by one or more radicals $R^4$, where two or more radicals $R^3$ may be linked to one another and may form a ring or ring system.

It is preferred in accordance with the invention for all radicals $R^3$ in the compound of the formula (II) to represent hydrogen atoms.

In general, the preferred embodiments mentioned in the present application can be combined with one another as desired.

It is particularly preferred for the said preferred embodiments of the groups A, Ar¹ and Ar² in formula (I) and (II) and the preferred linking pattern of the benzanthracene group and the anthracene group in formula (II) to occur in combination with one another.

Examples of compounds of the formula (I) according to the invention are shown below.

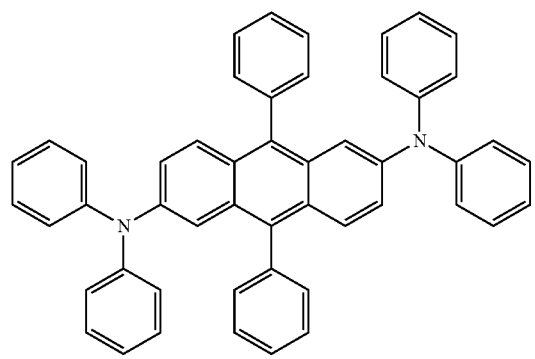
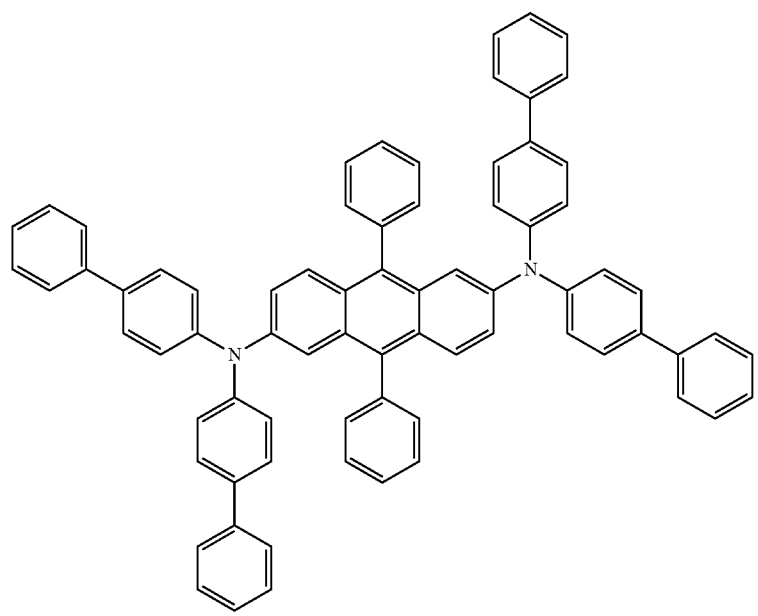
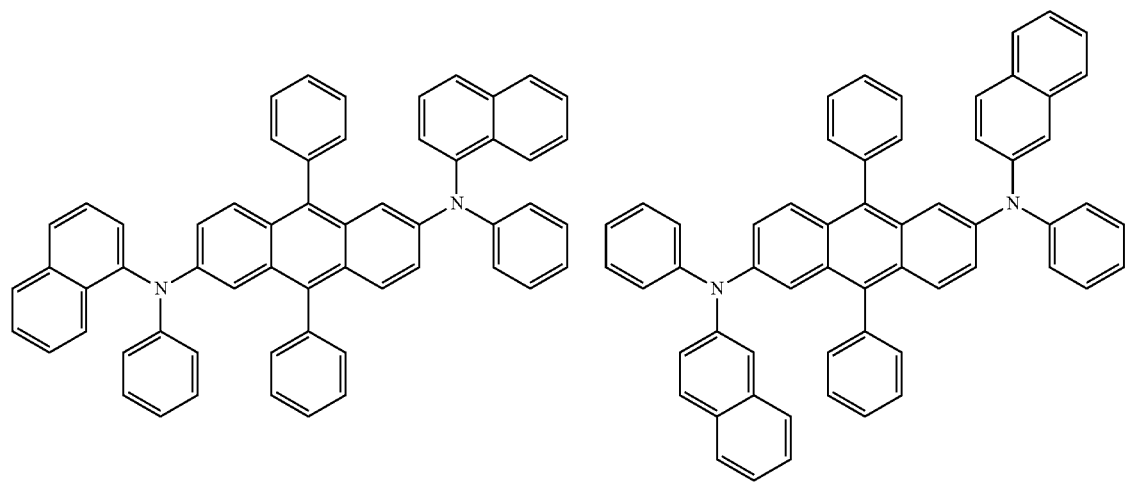

-continued
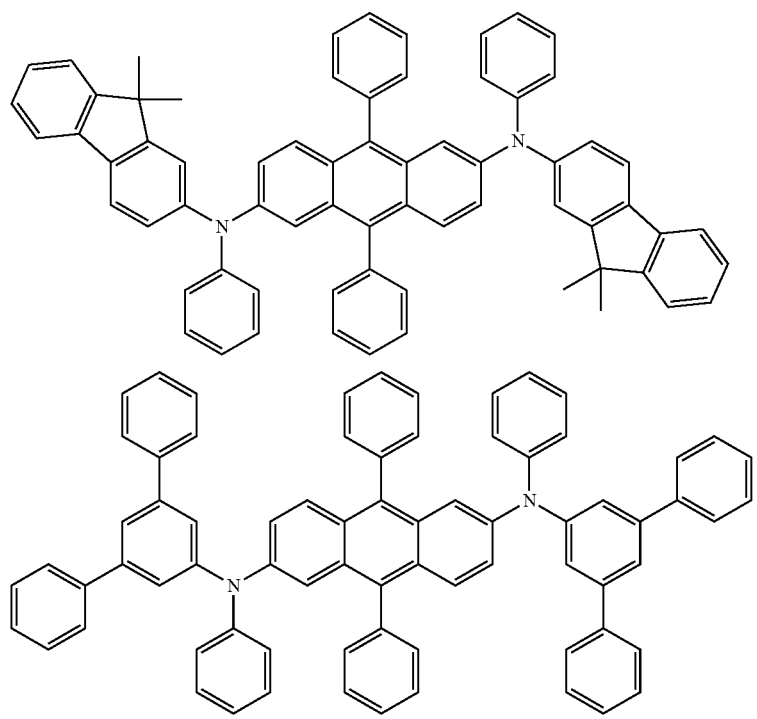
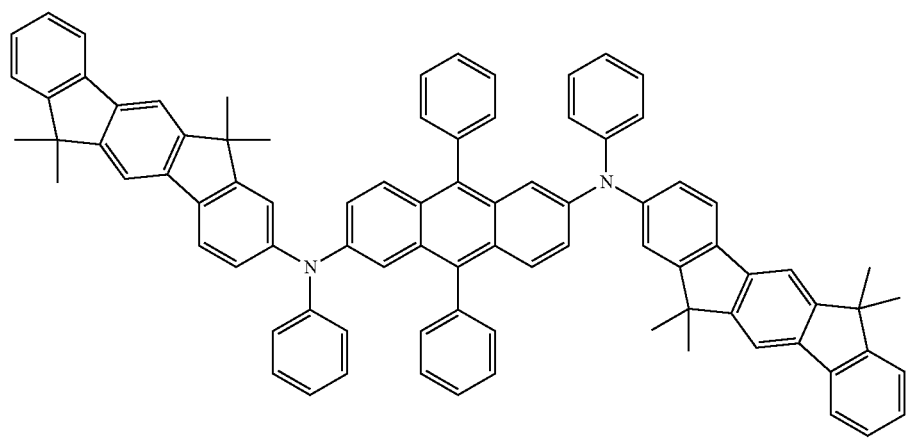
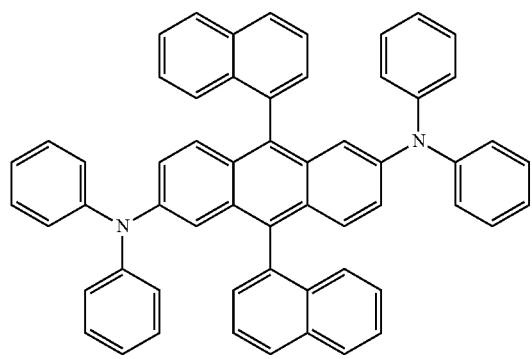

-continued
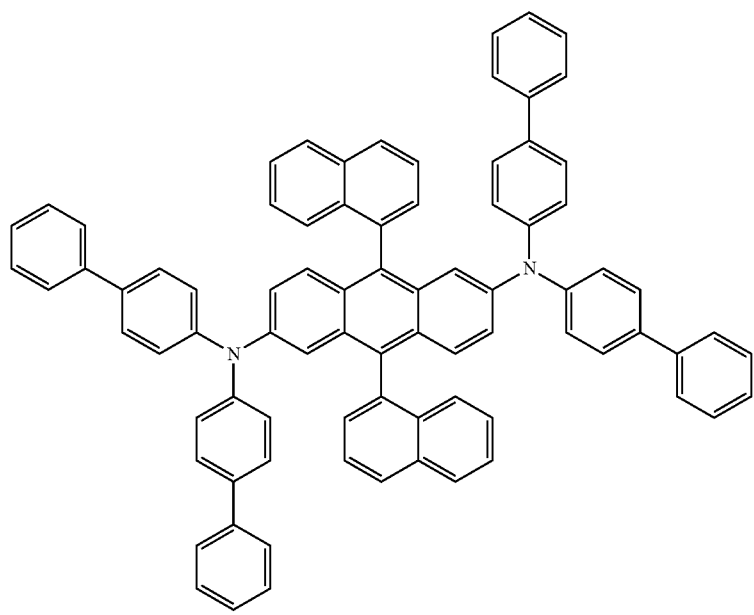
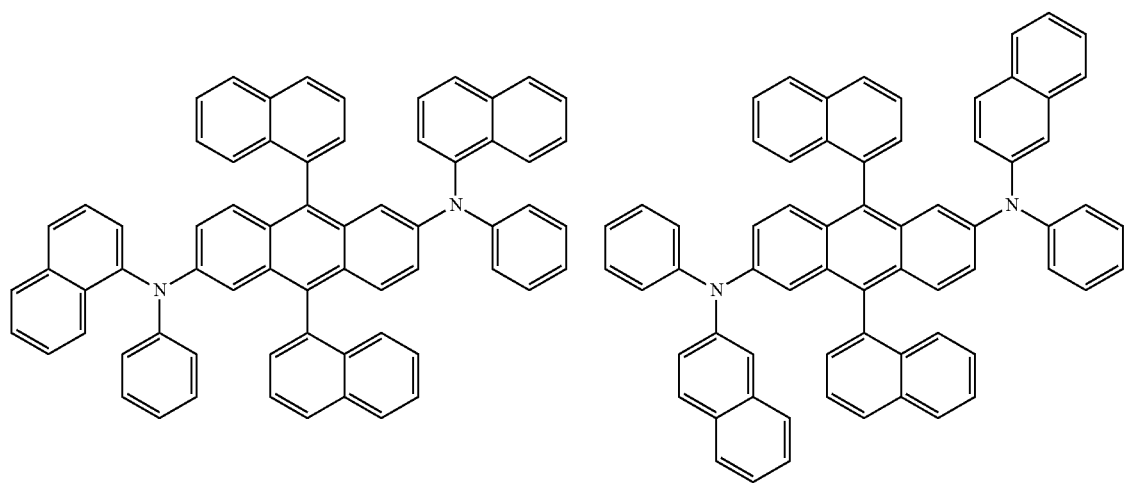
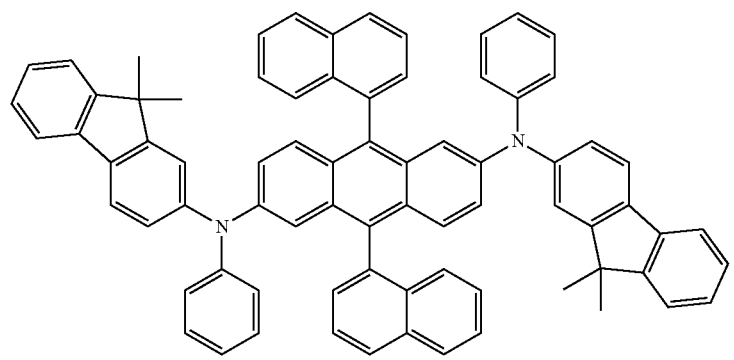

-continued
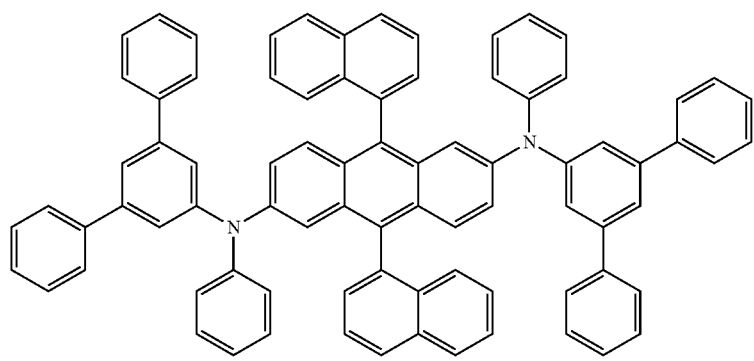
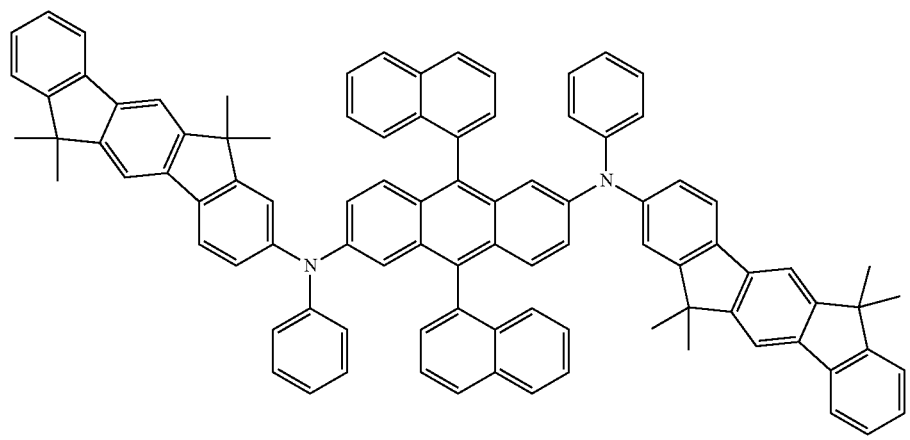
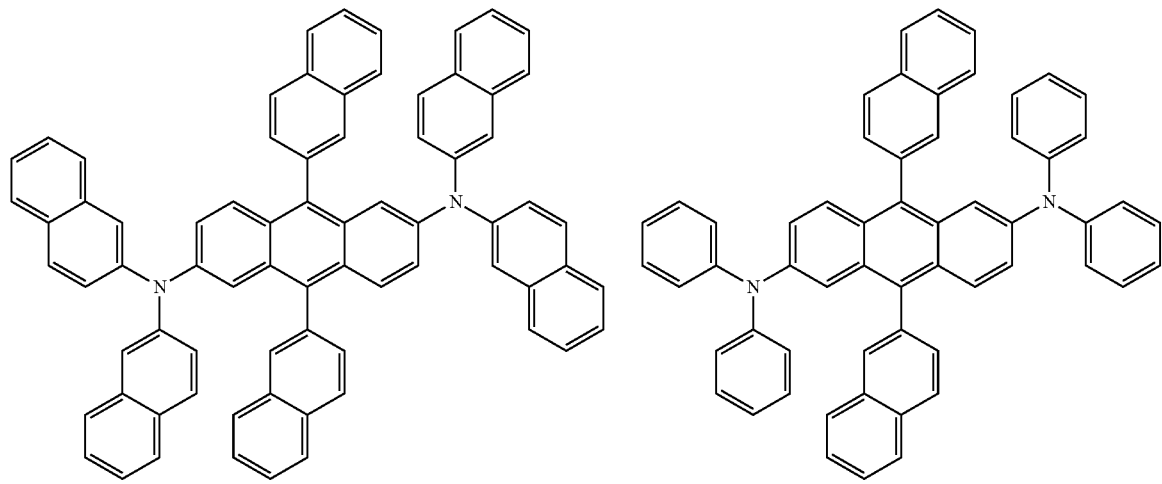

-continued
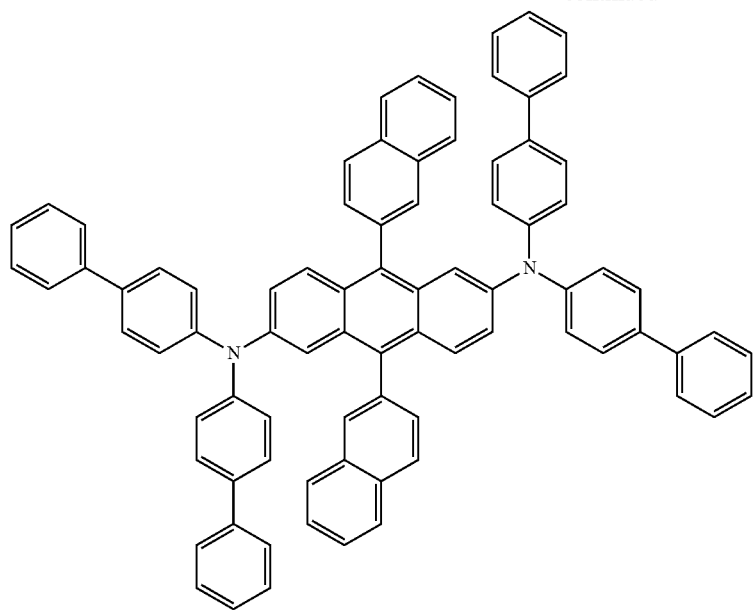
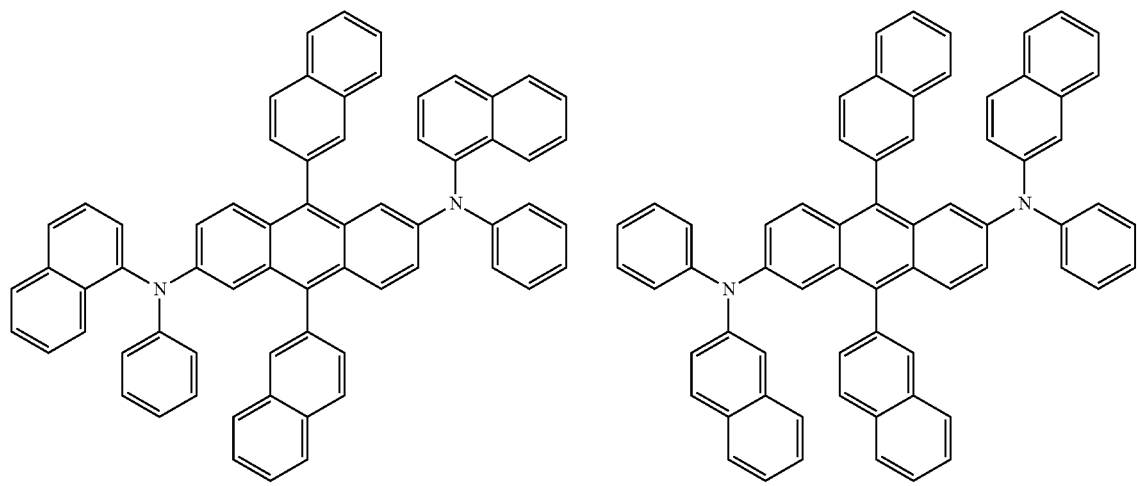
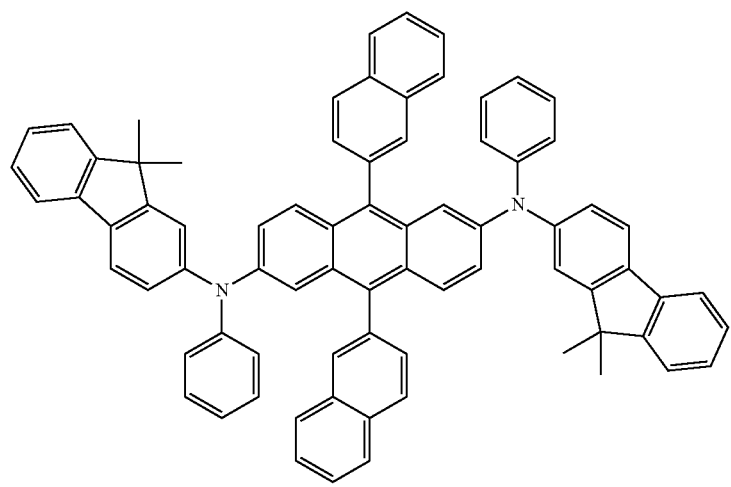

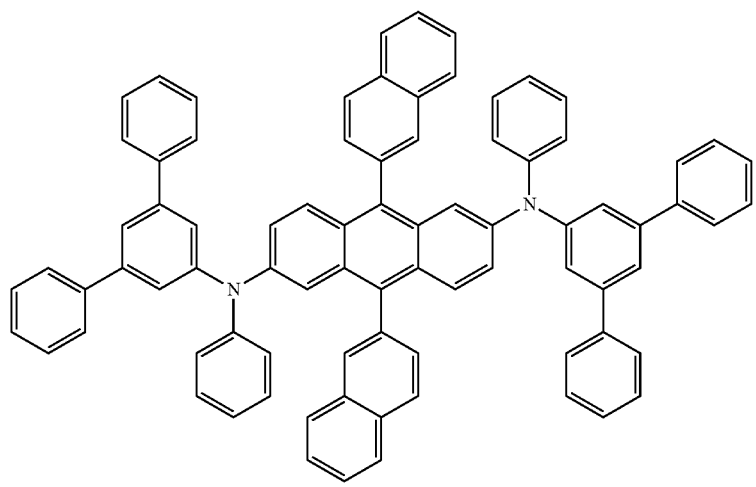 [SMILES: c1ccc(-c2cc(-c3ccccc3)cc(N(c3ccccc3)c3ccc4c(-c5ccc6ccccc6c5)c5cc(N(c6ccccc6)c6cc(-c7ccccc7)cc(-c7ccccc7)c6)ccc5c(-c5ccc6ccccc6c5)c4c3)c2)cc1]
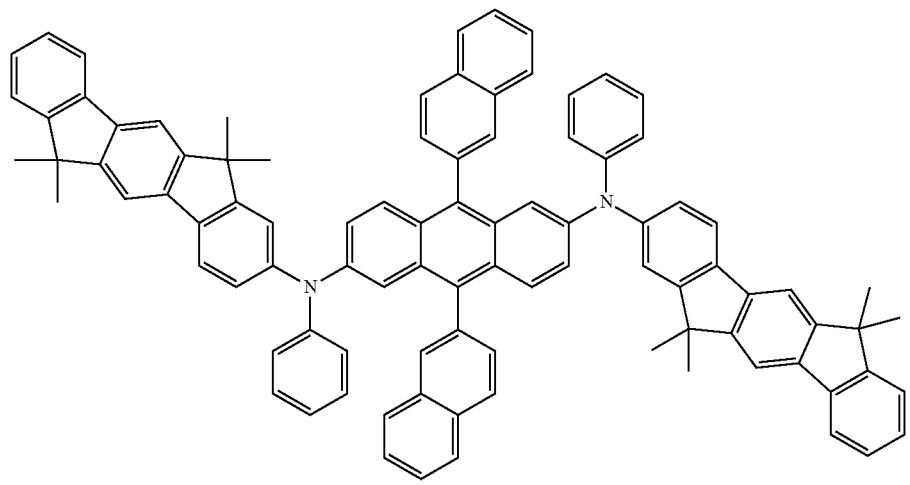
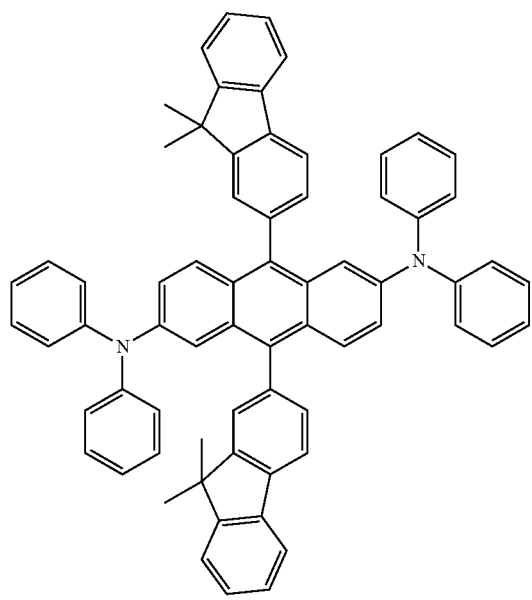

-continued
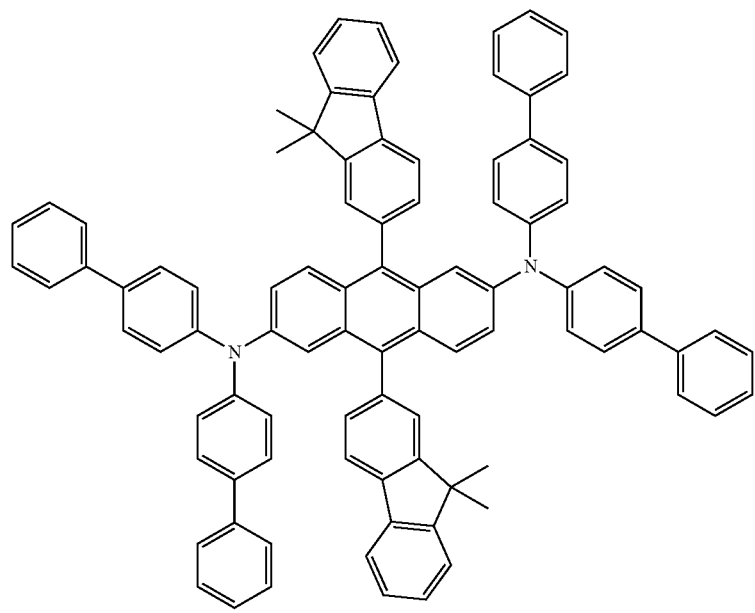
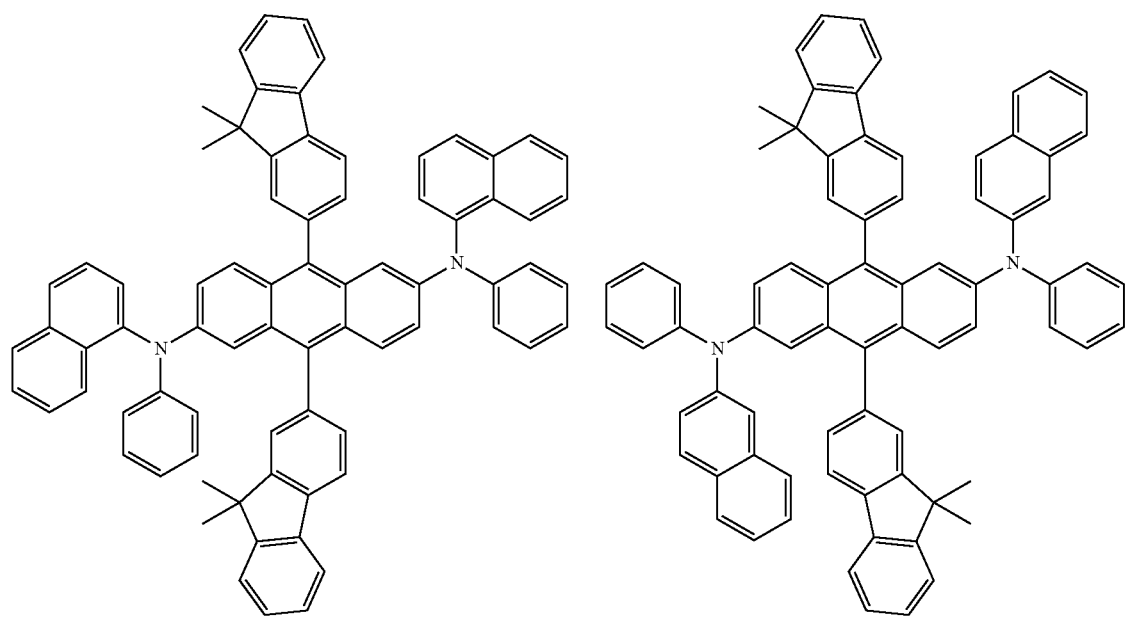

-continued
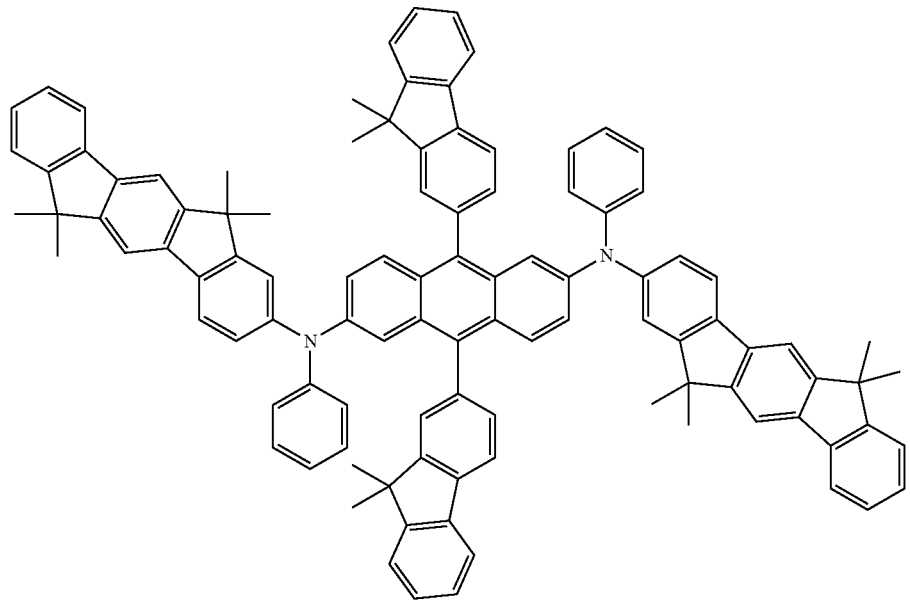
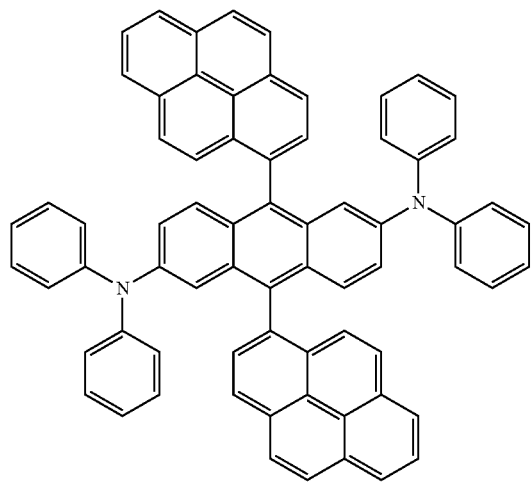
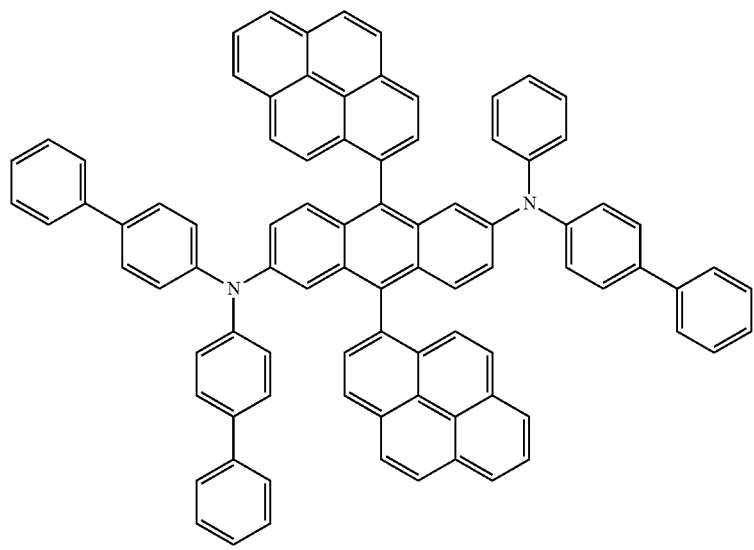

-continued
29 30
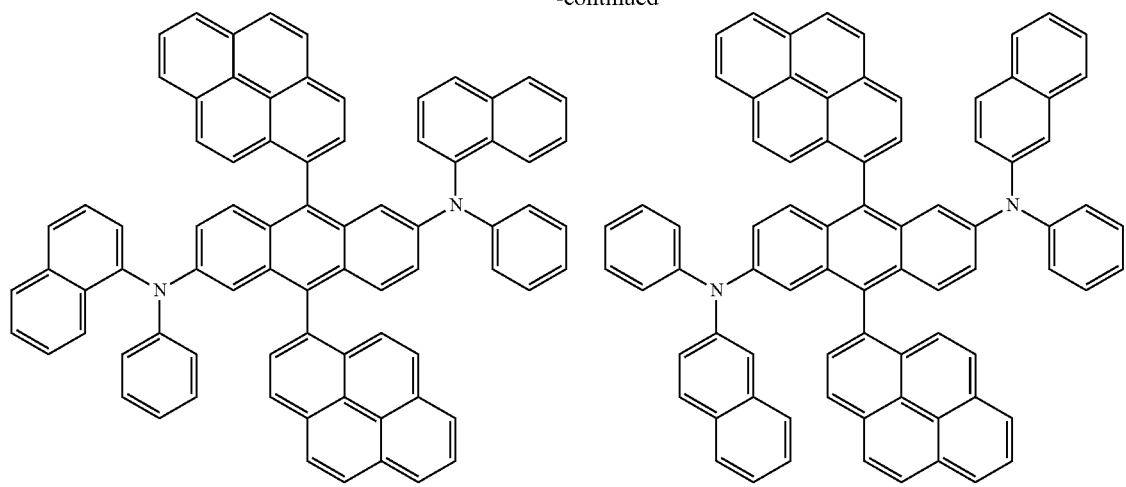
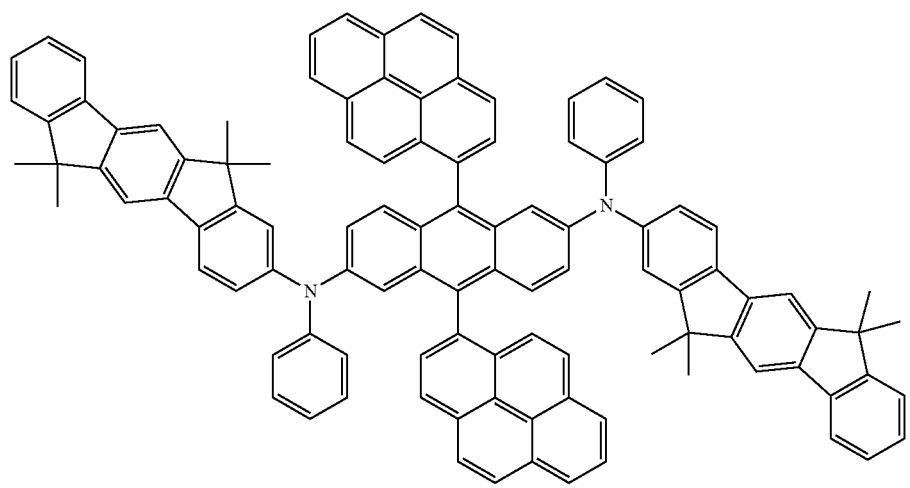
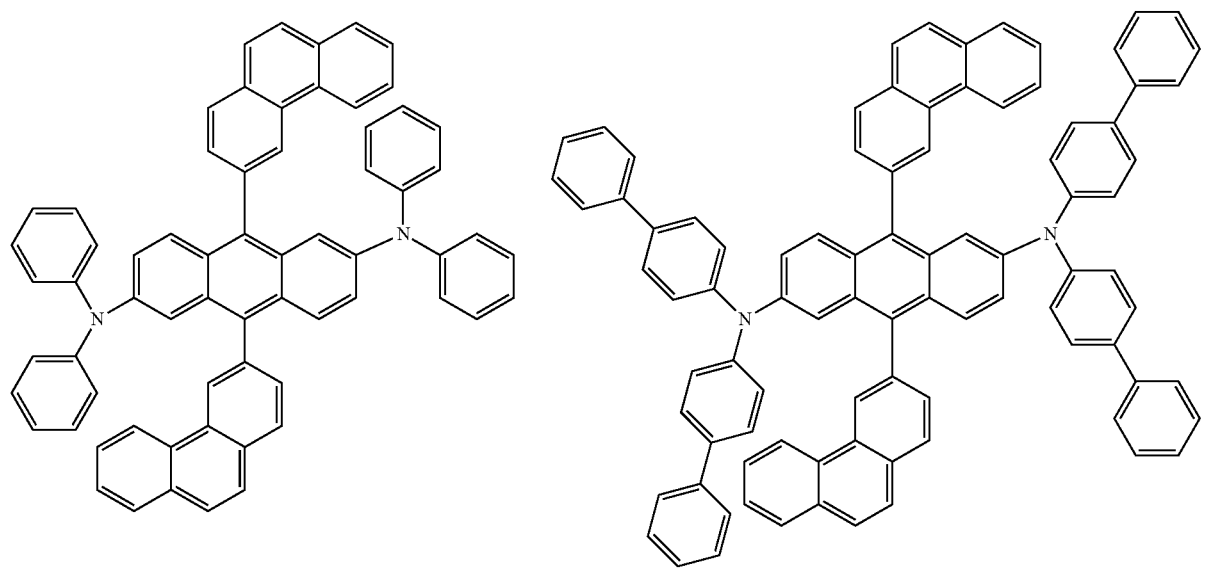

31 32
-continued
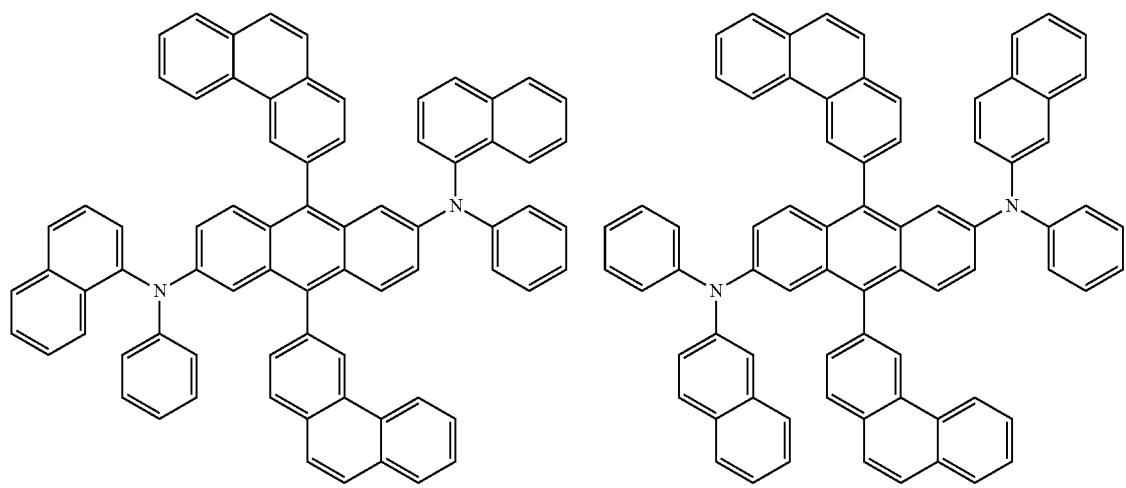
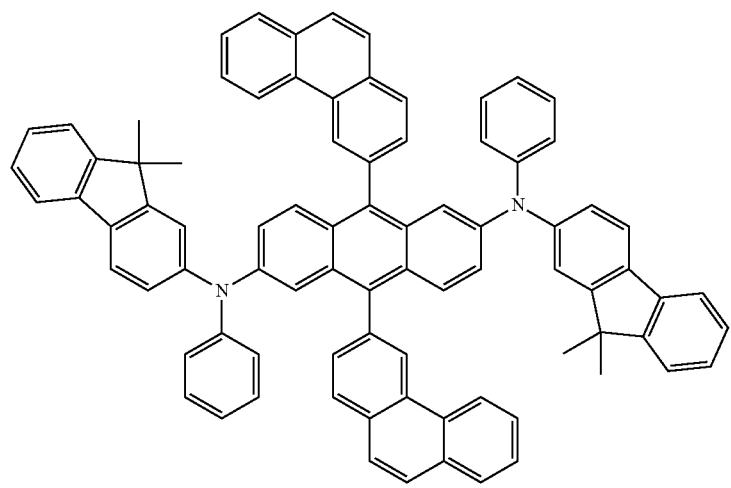
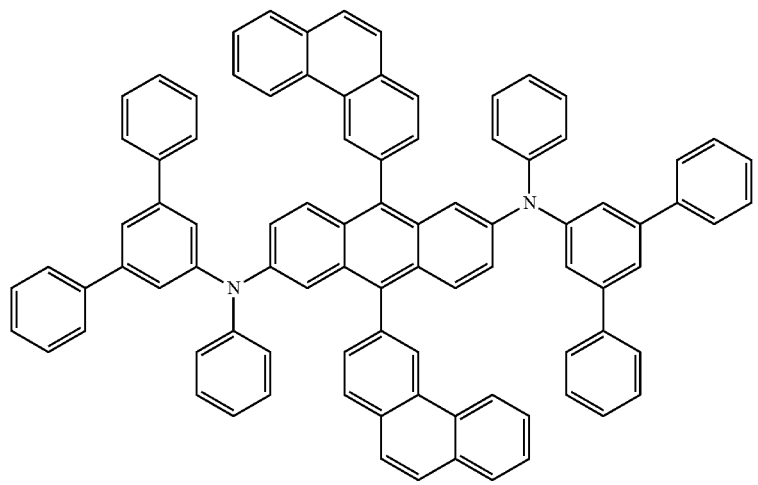

-continued
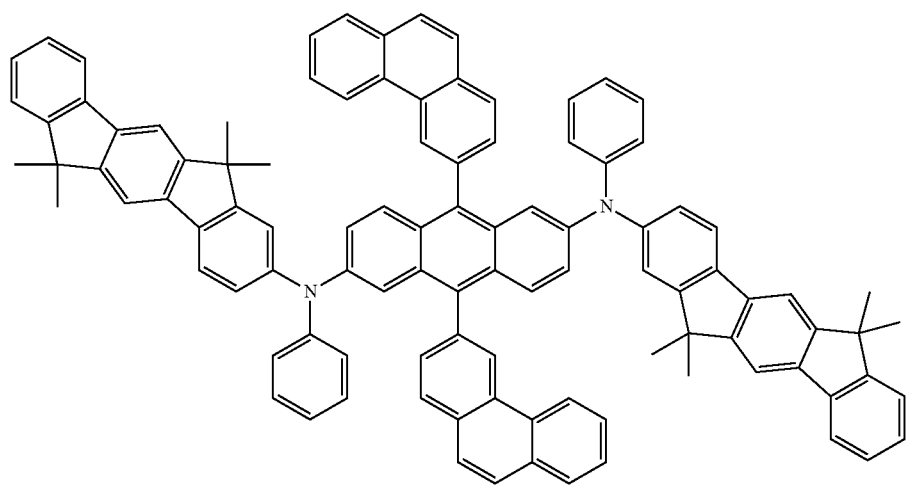
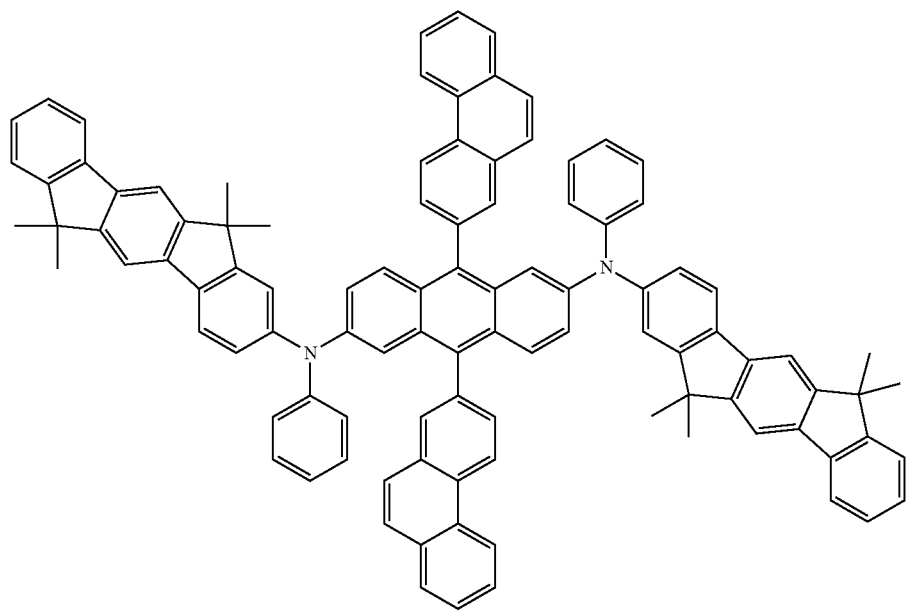
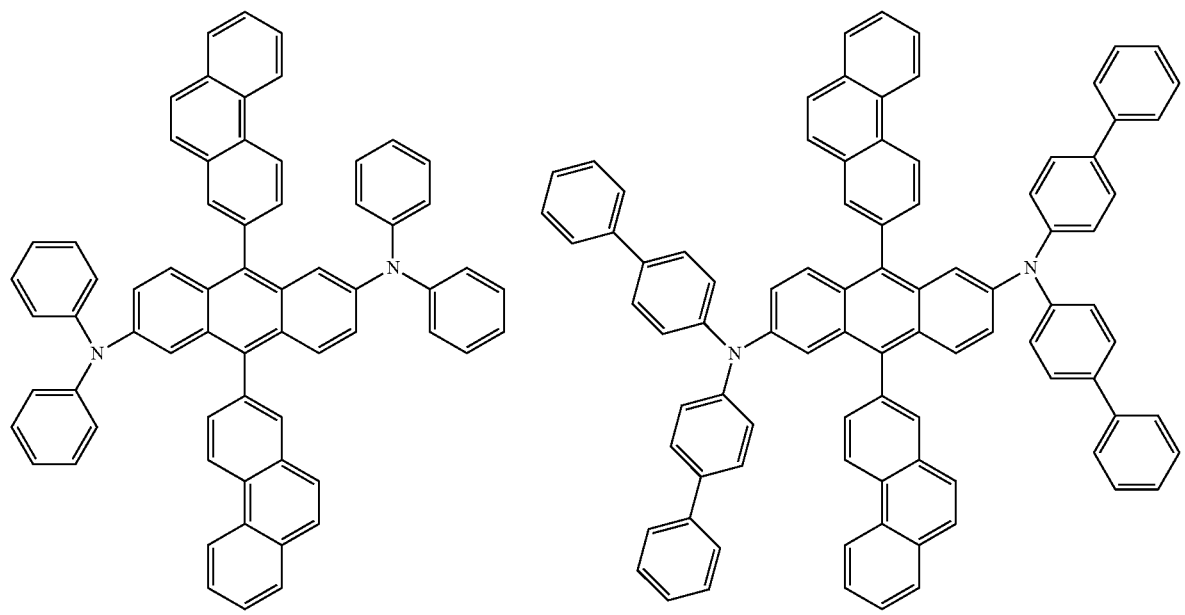

-continued
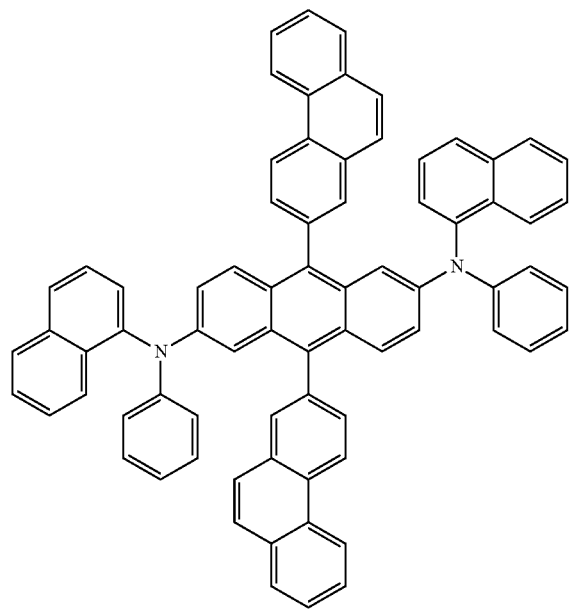
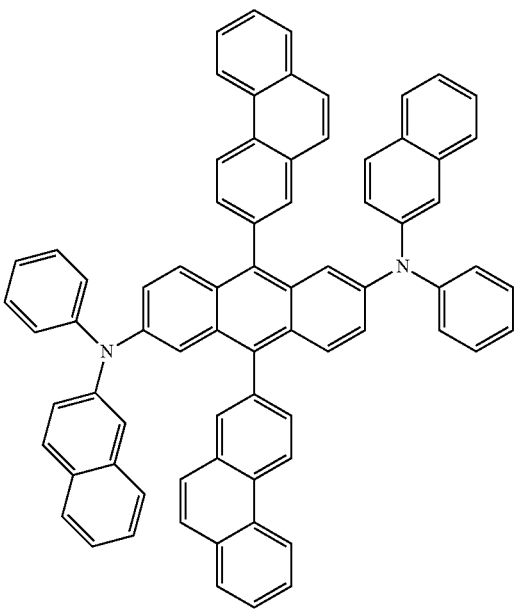
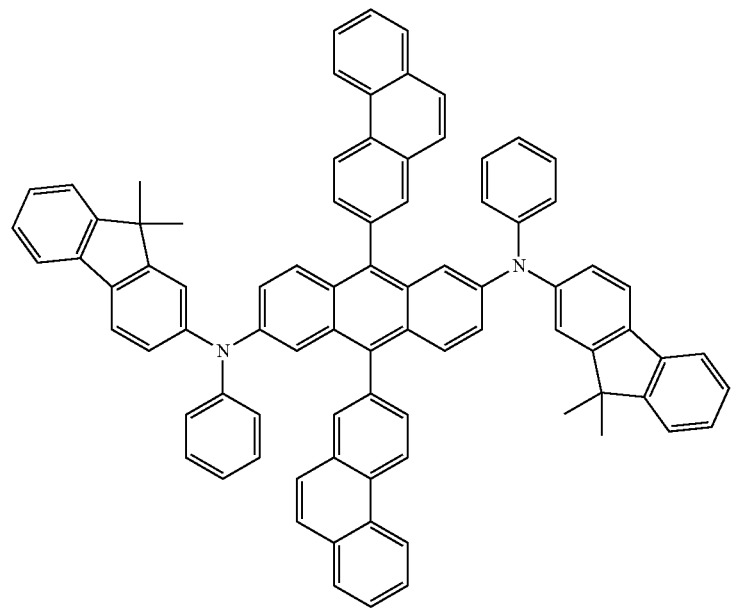

-continued
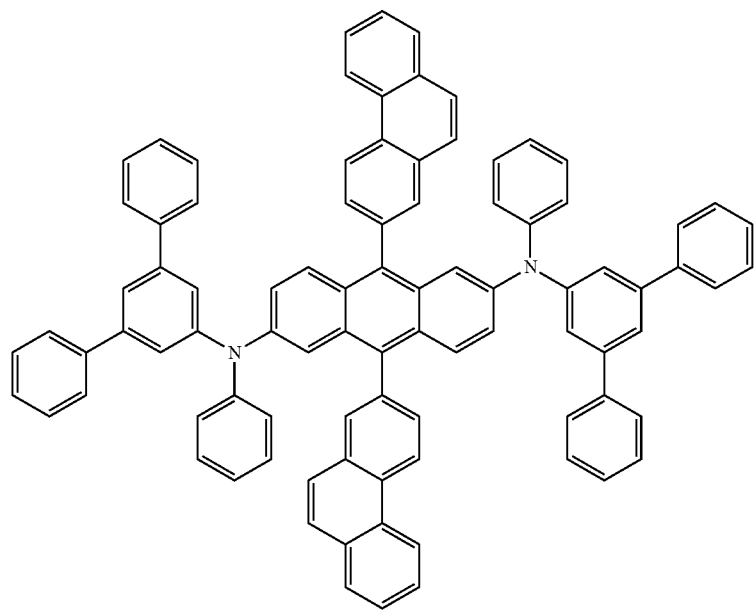
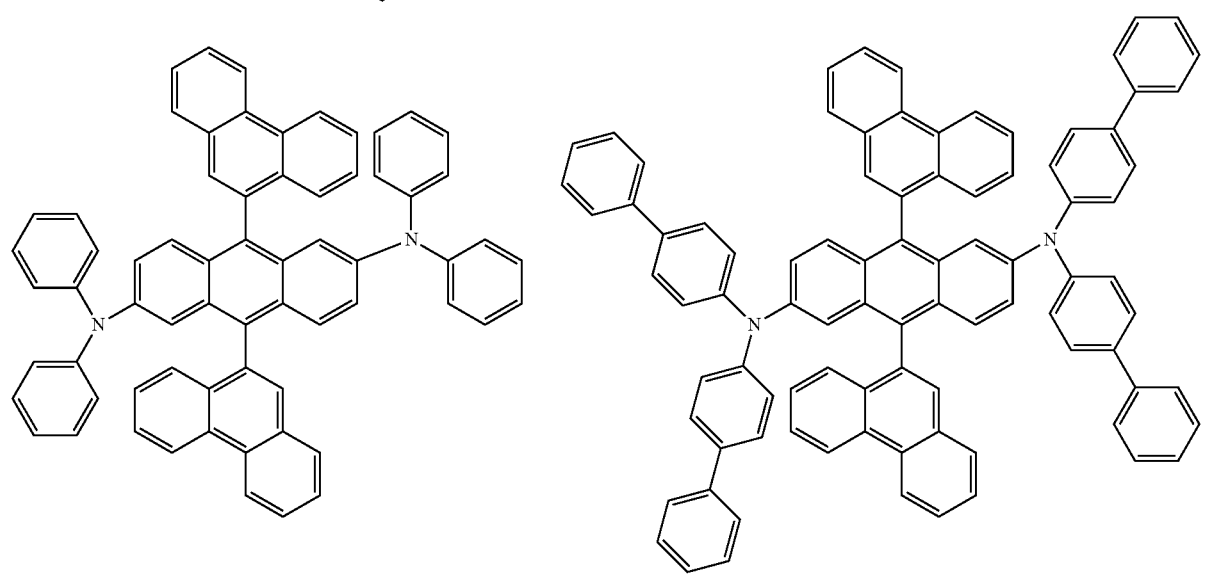
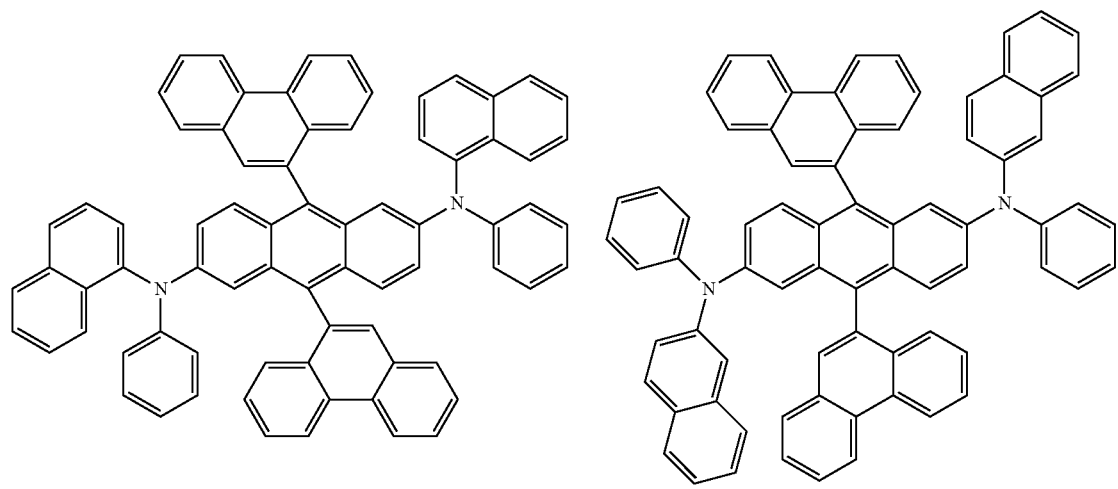

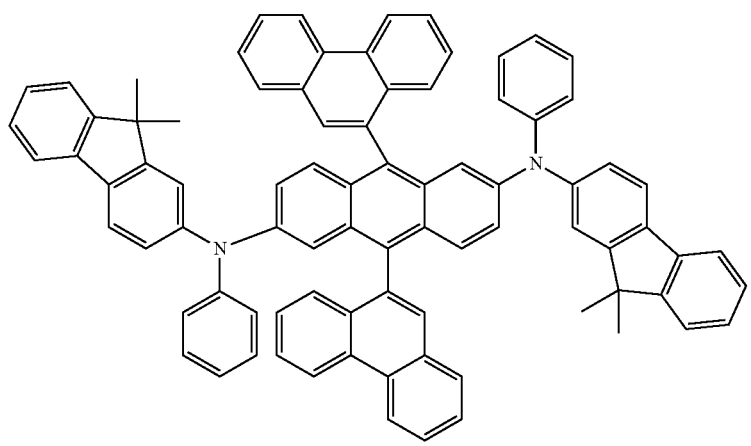
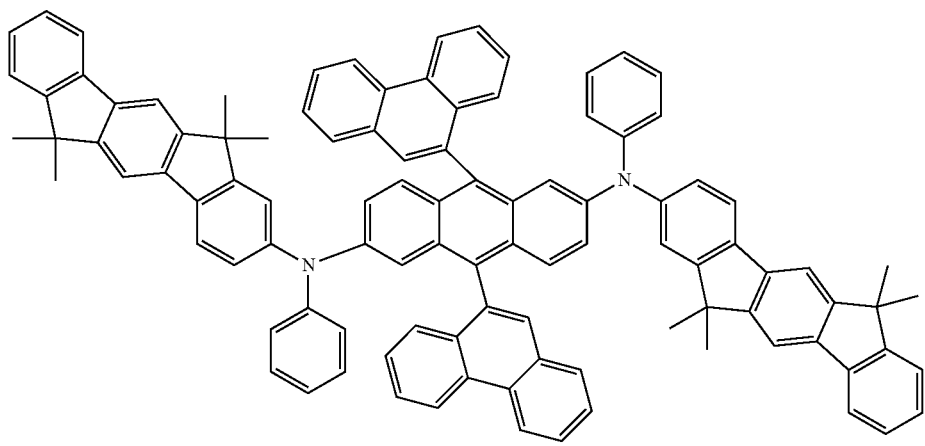
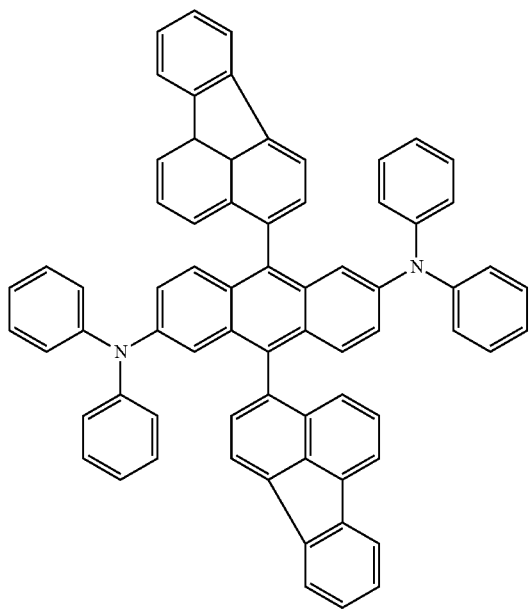

-continued
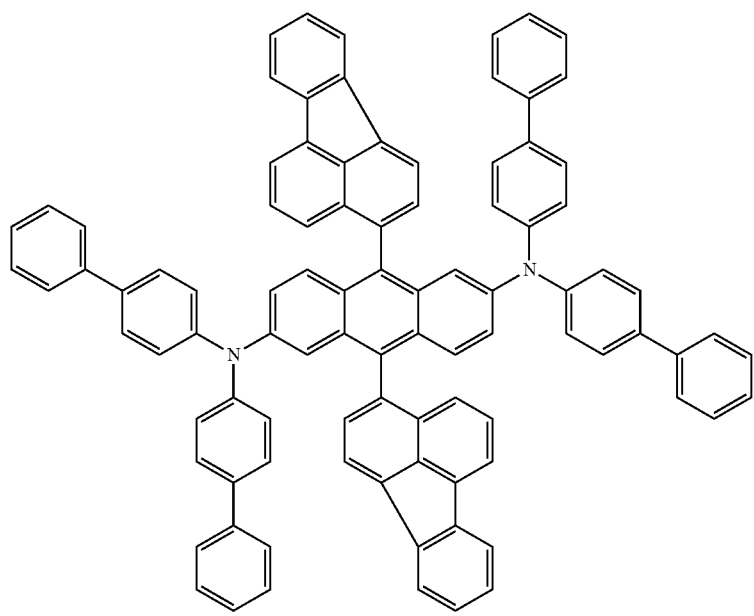
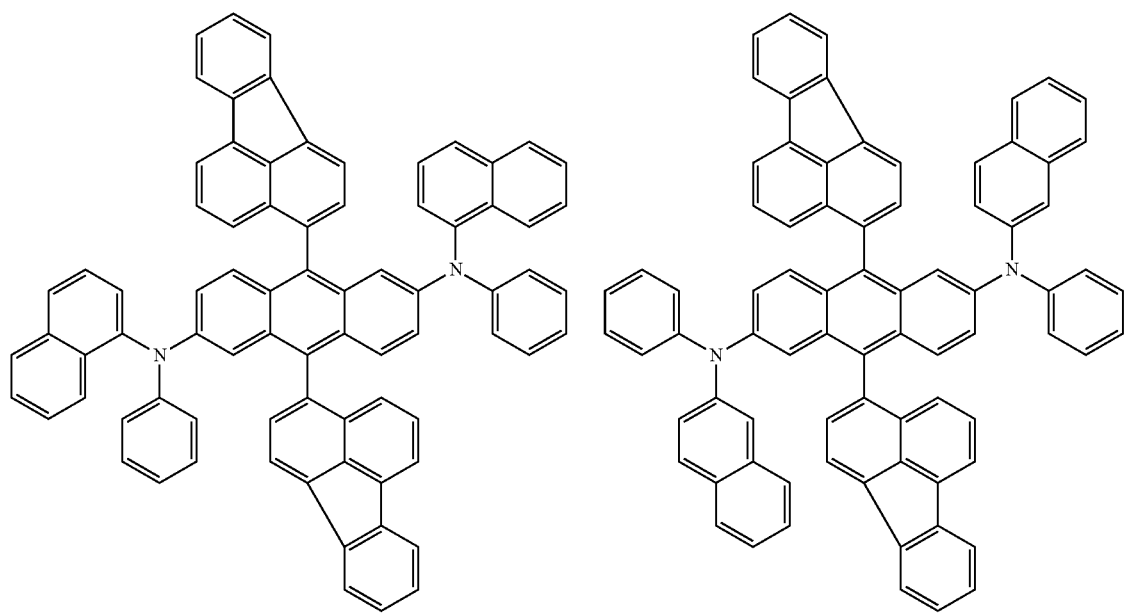

-continued
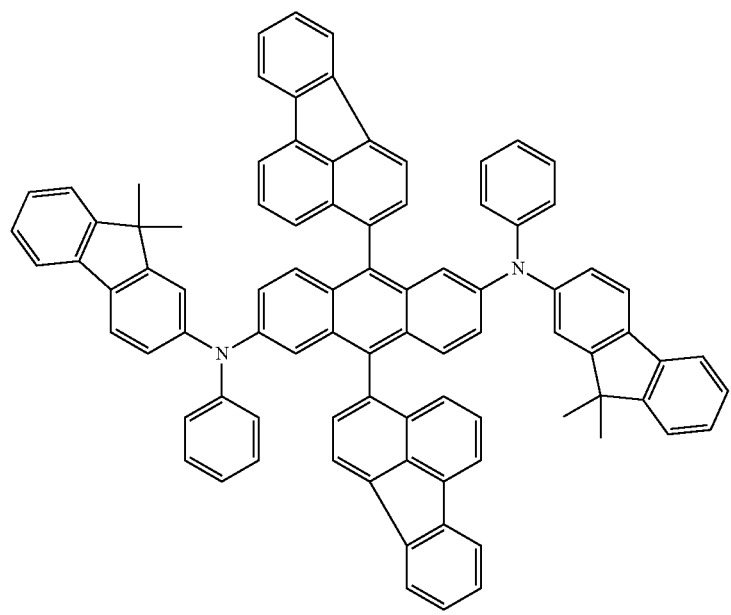
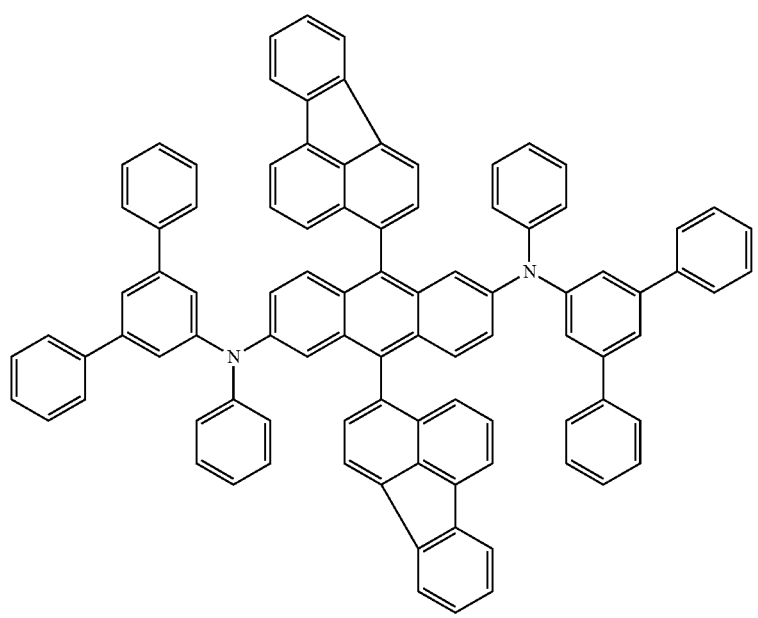

-continued
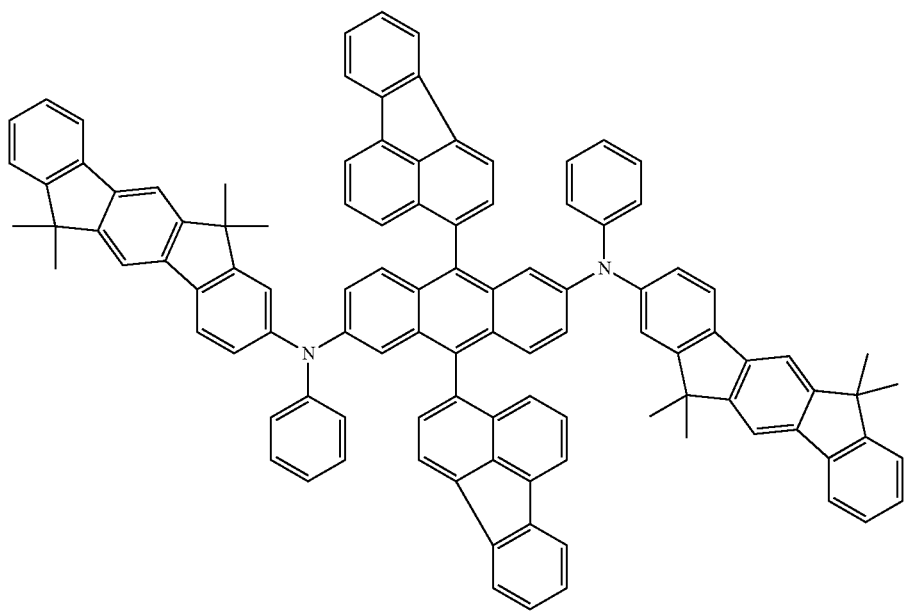
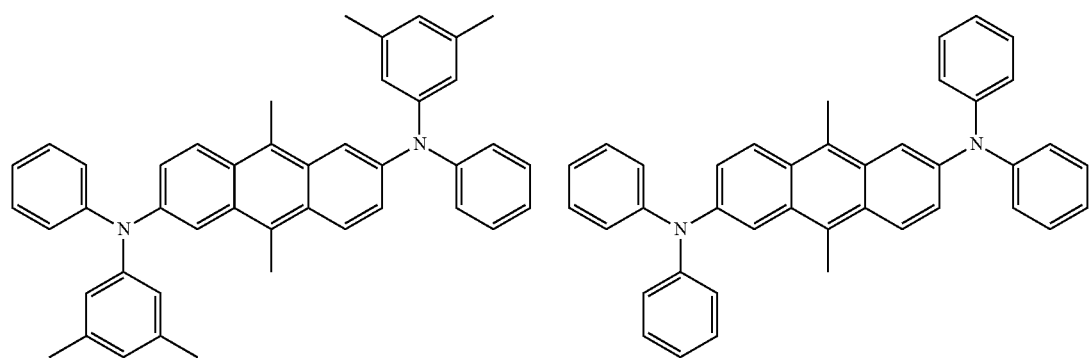
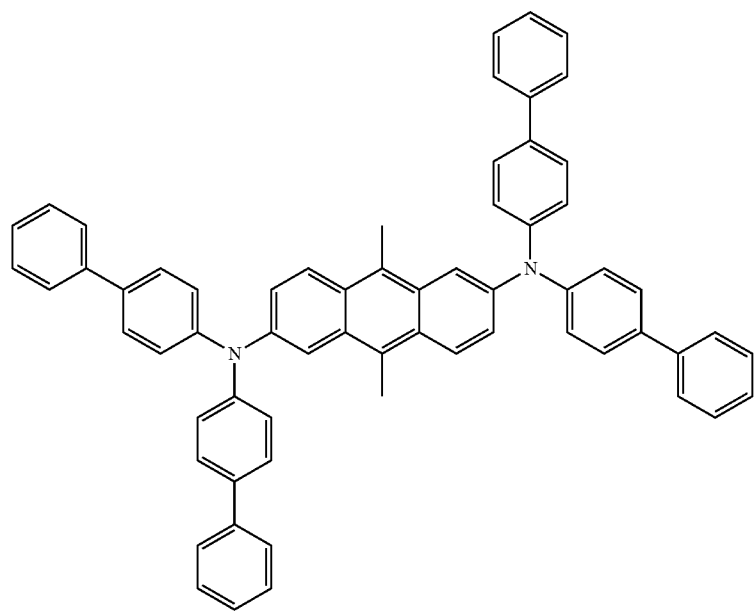

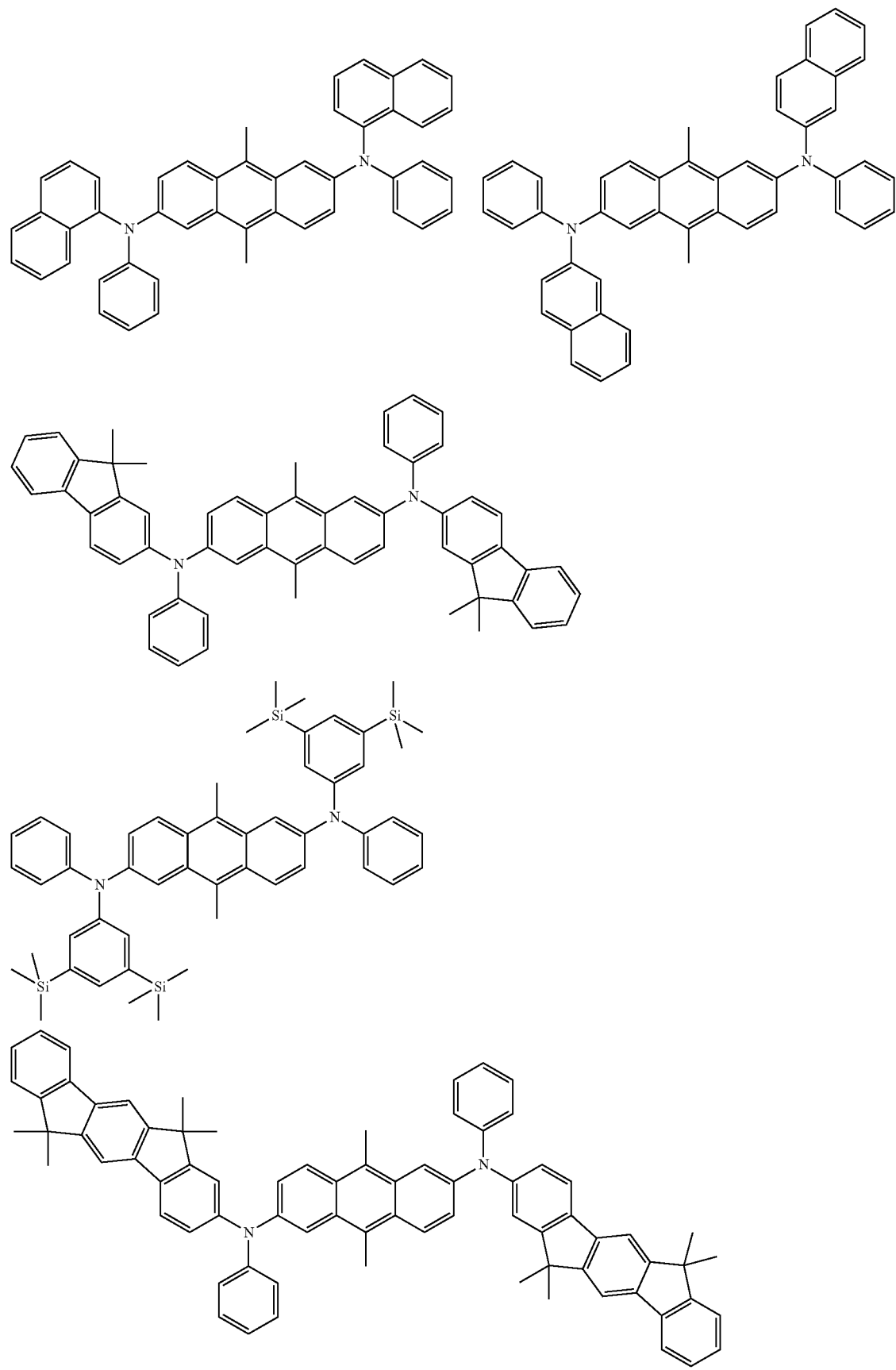

-continued
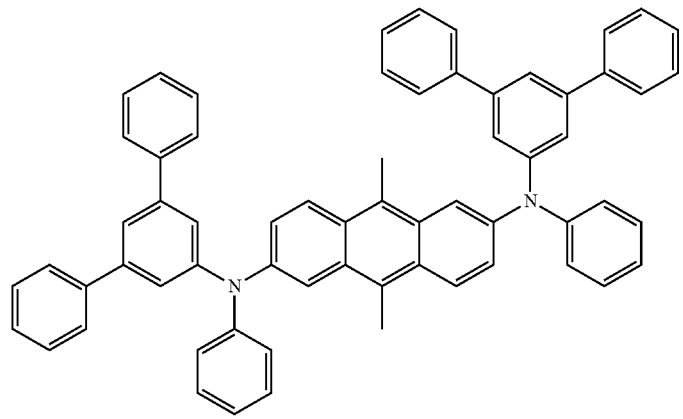
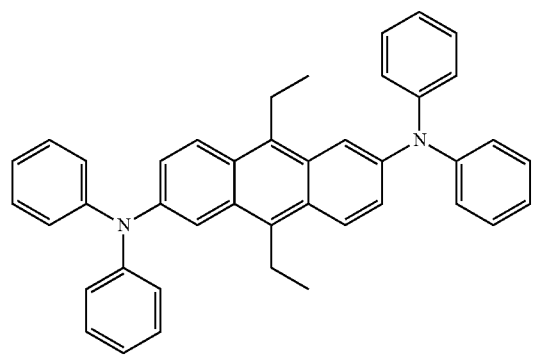
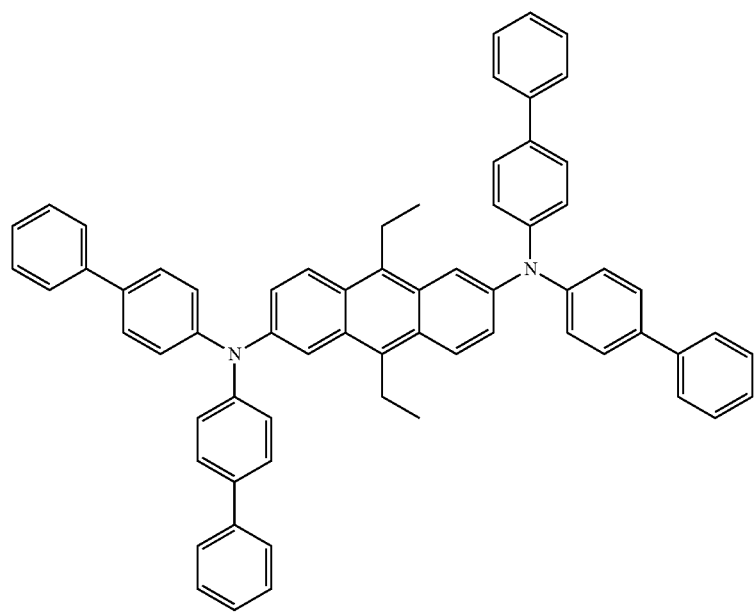

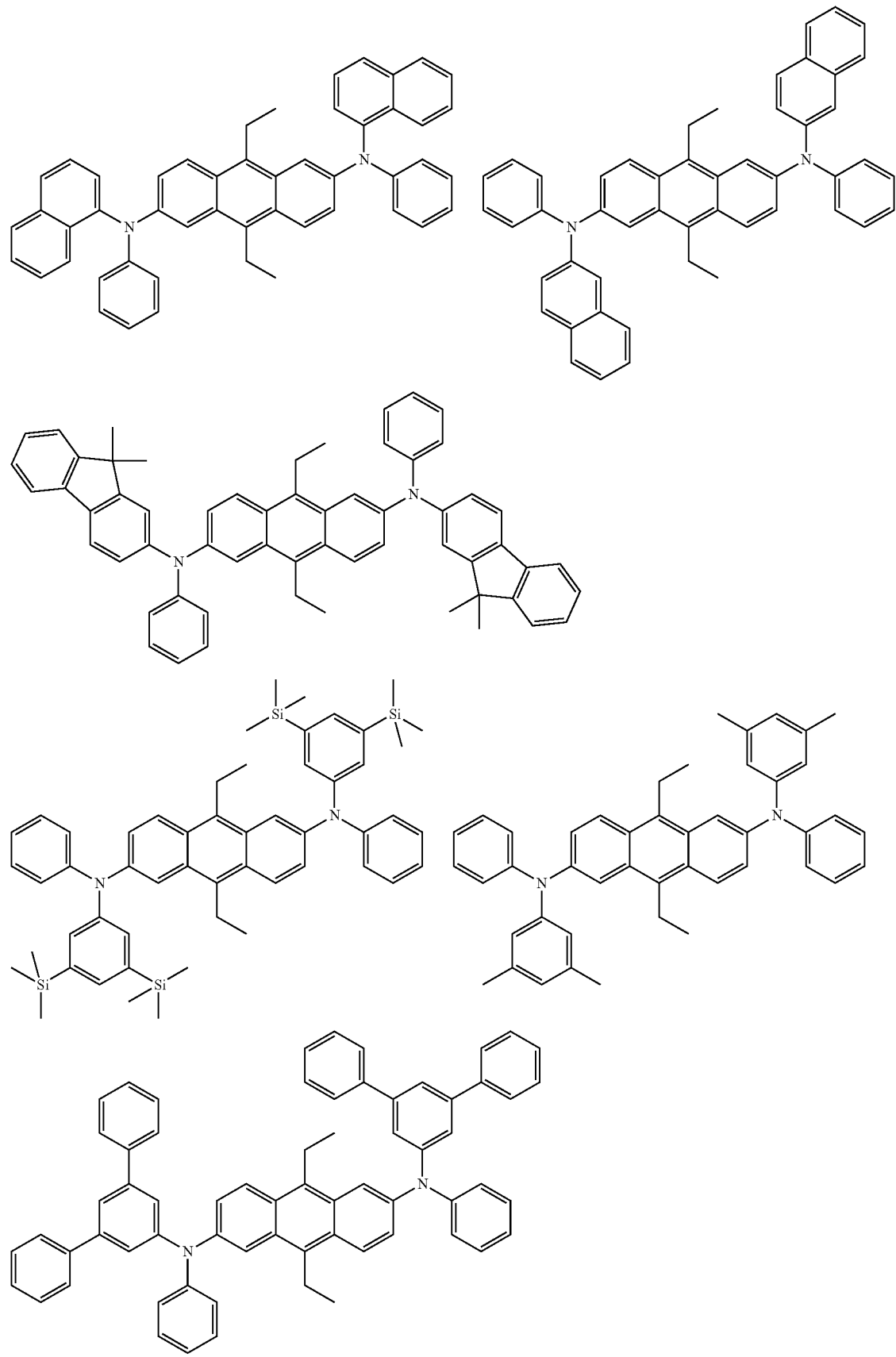

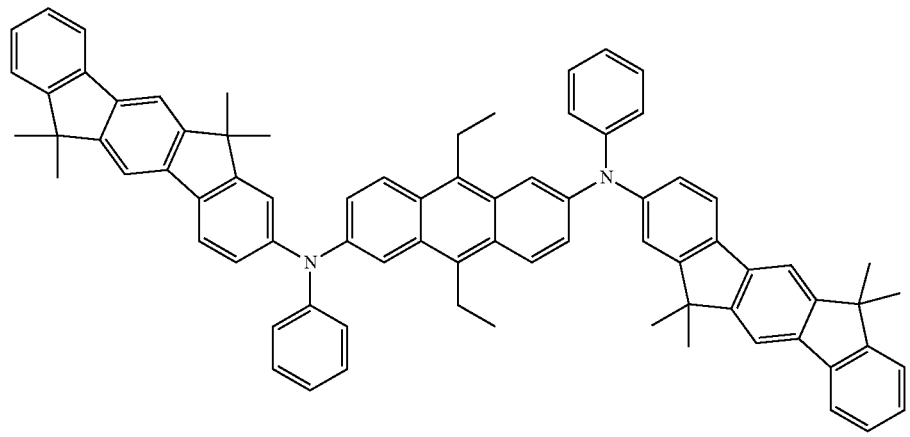
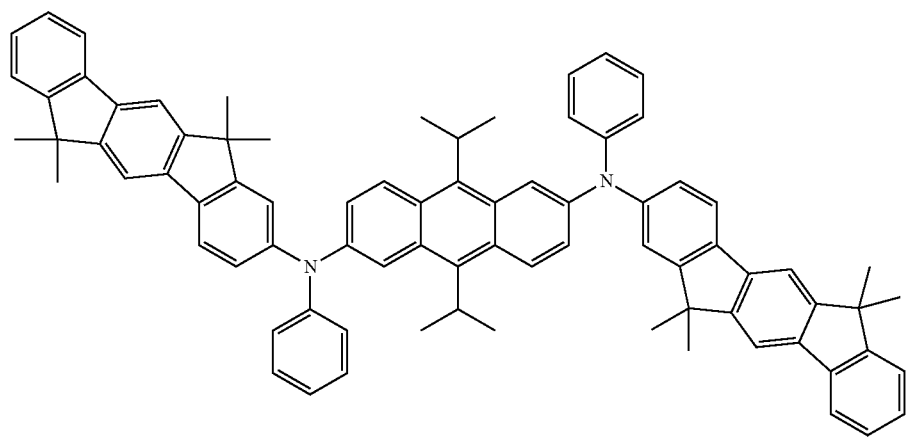
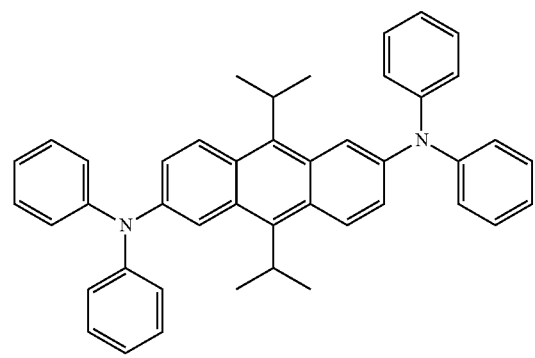

-continued
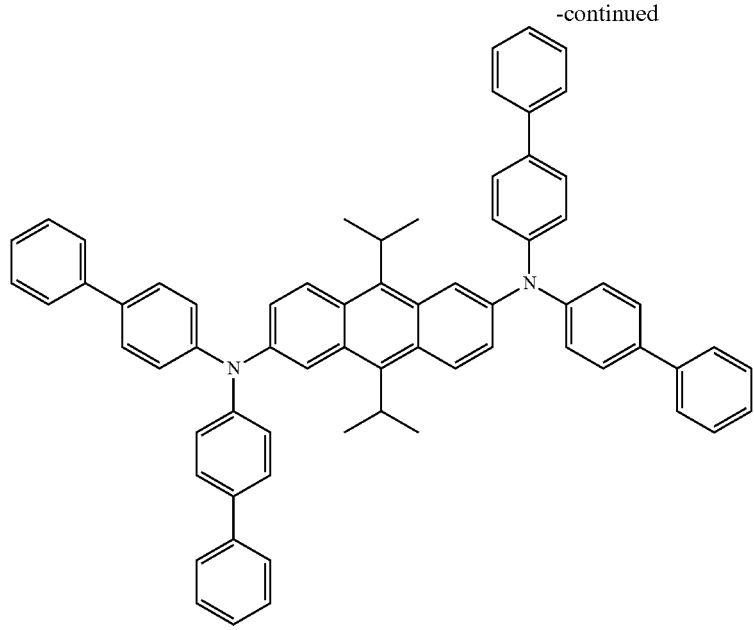
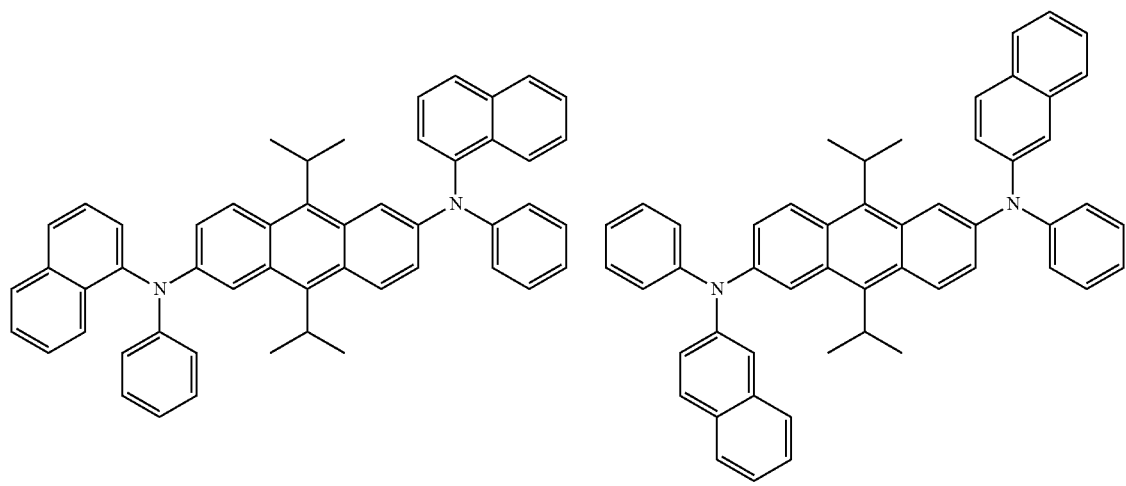
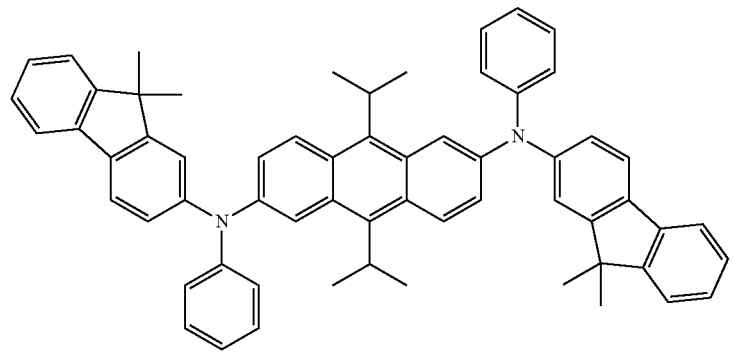

-continued
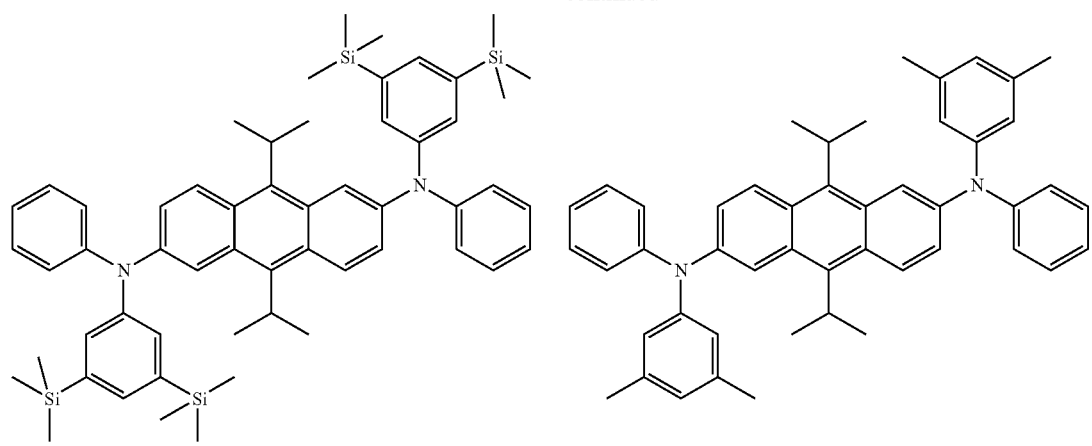
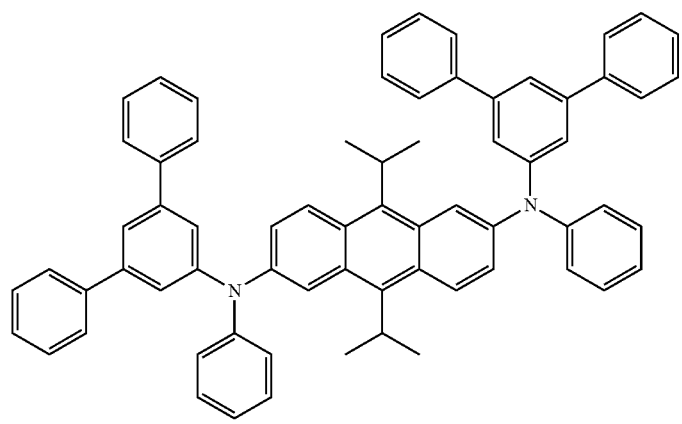
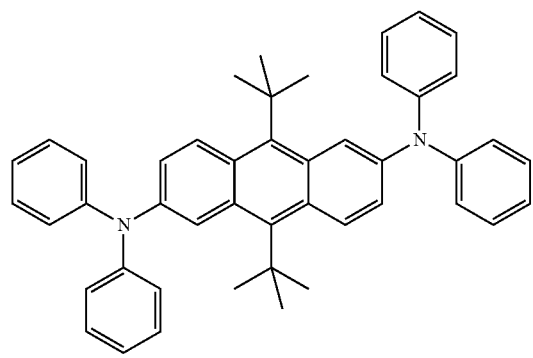

-continued
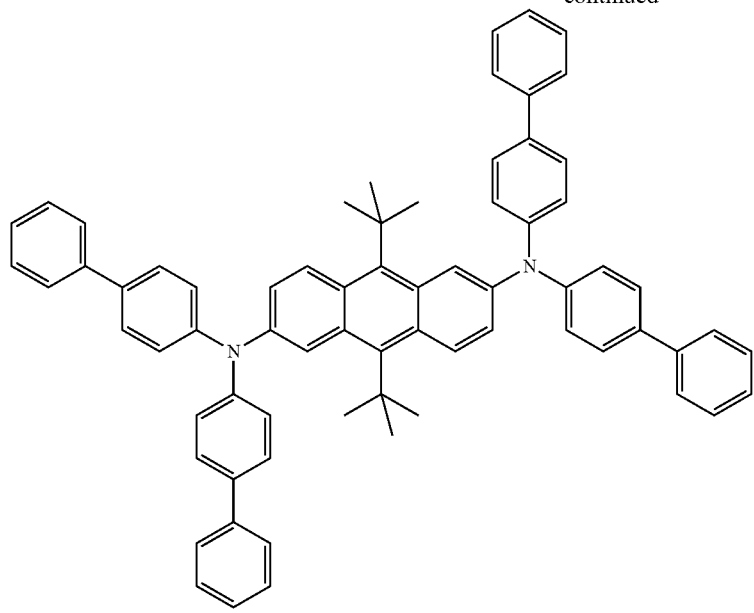
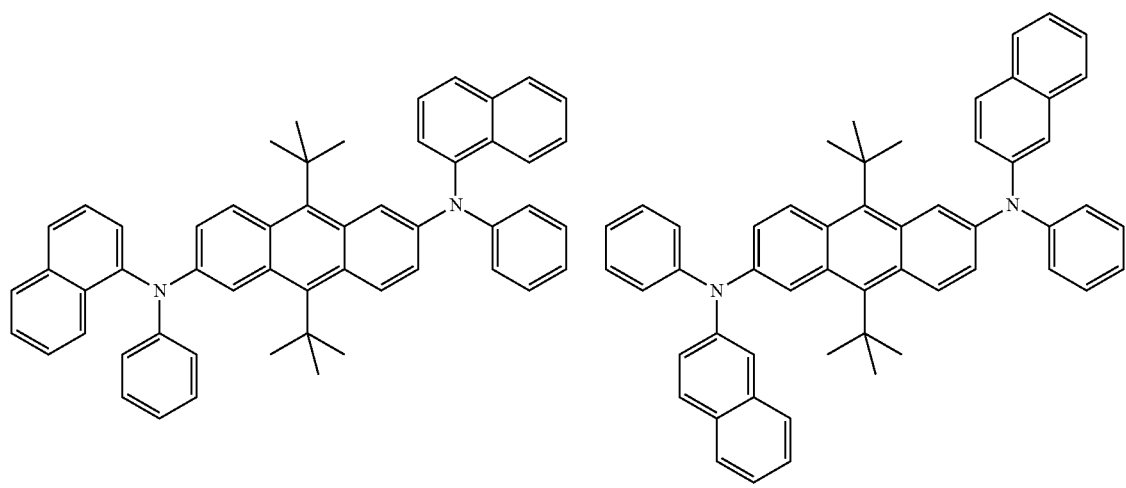
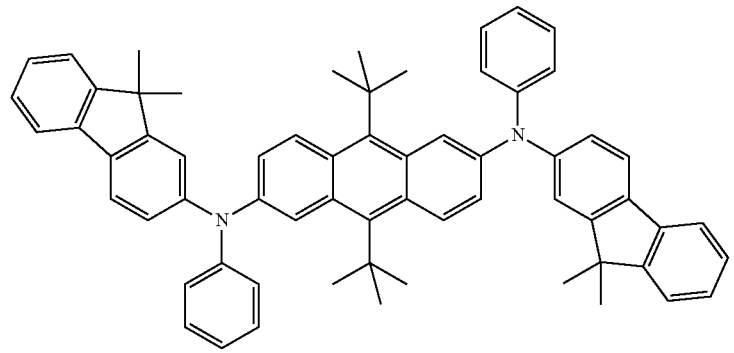

-continued
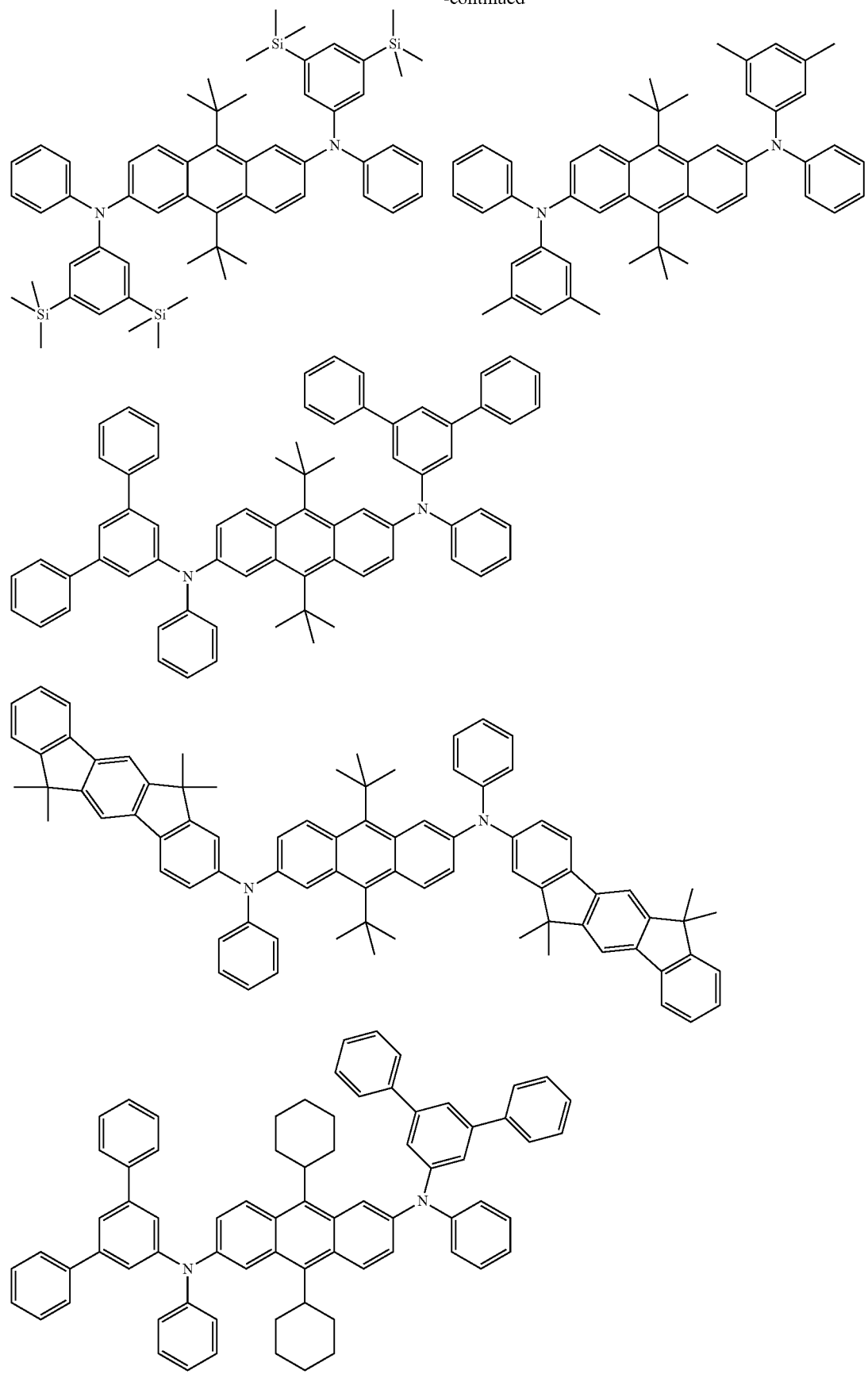

-continued
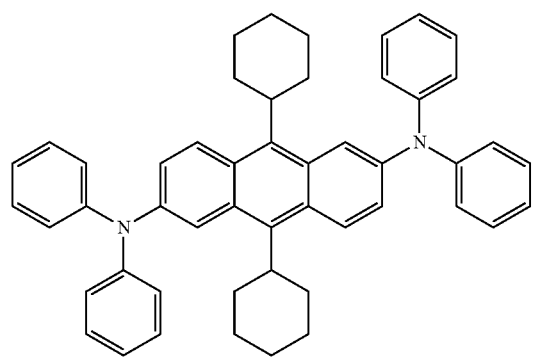
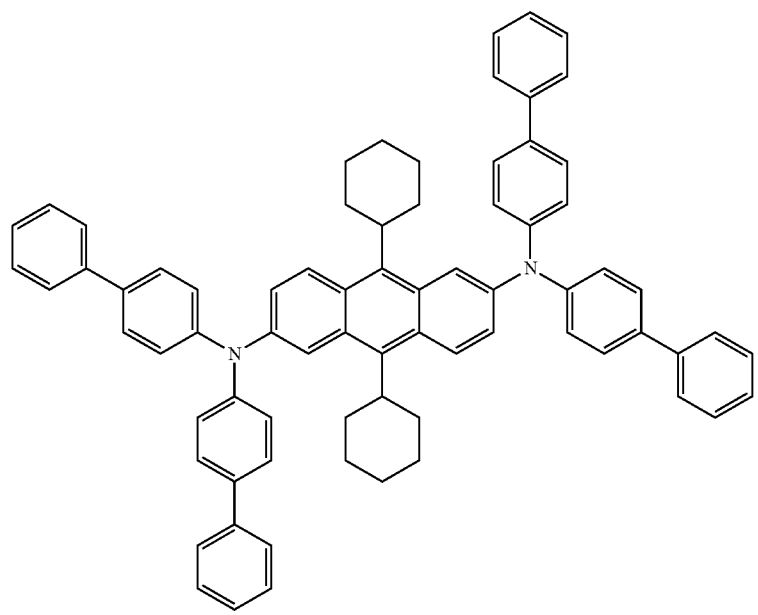
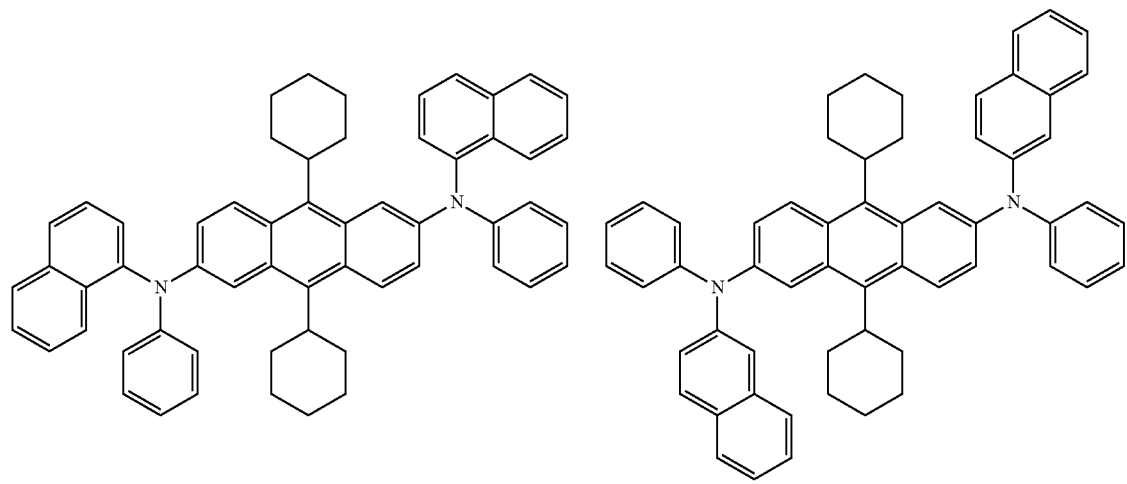

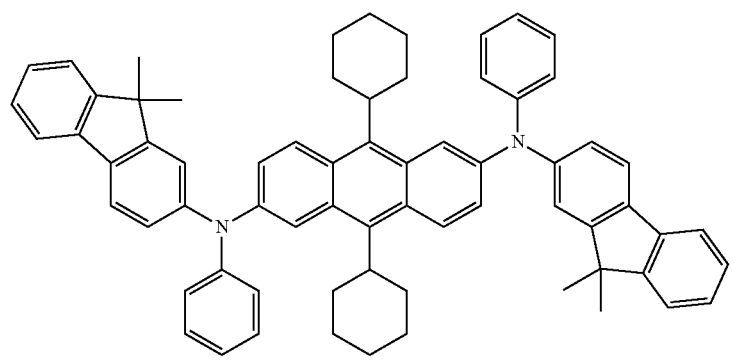
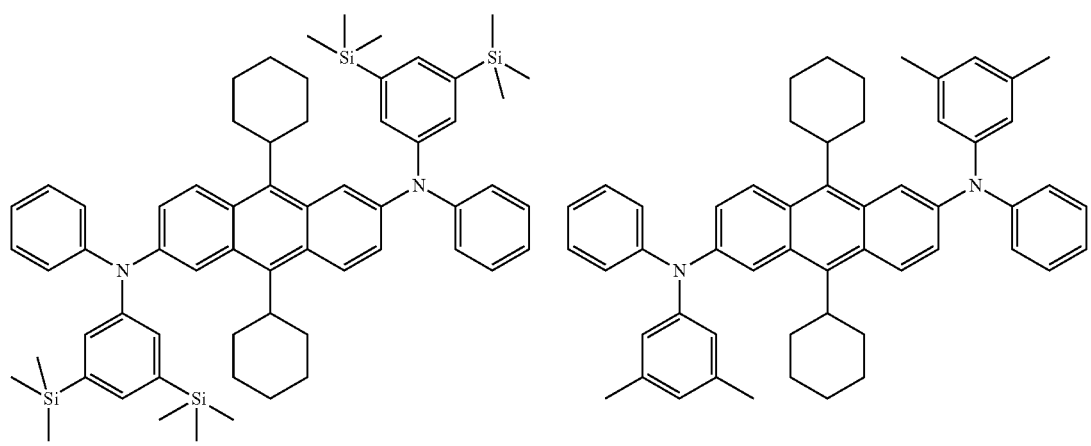
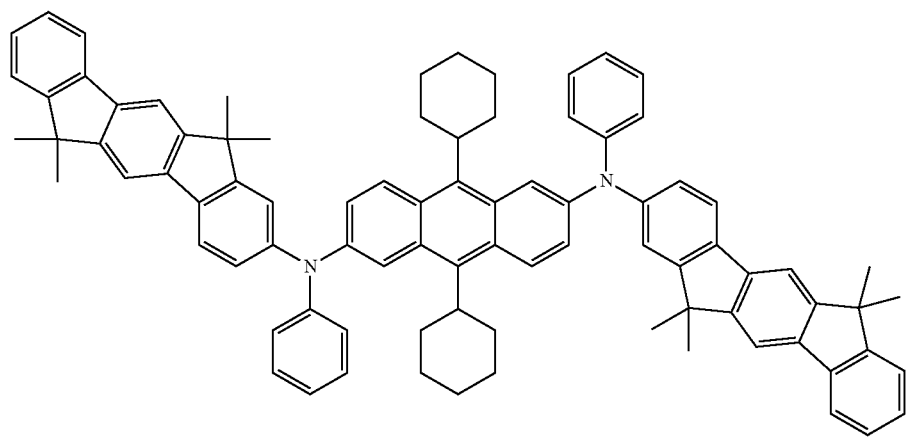

Examples of compounds of the formula (II) according to the invention are shown below.
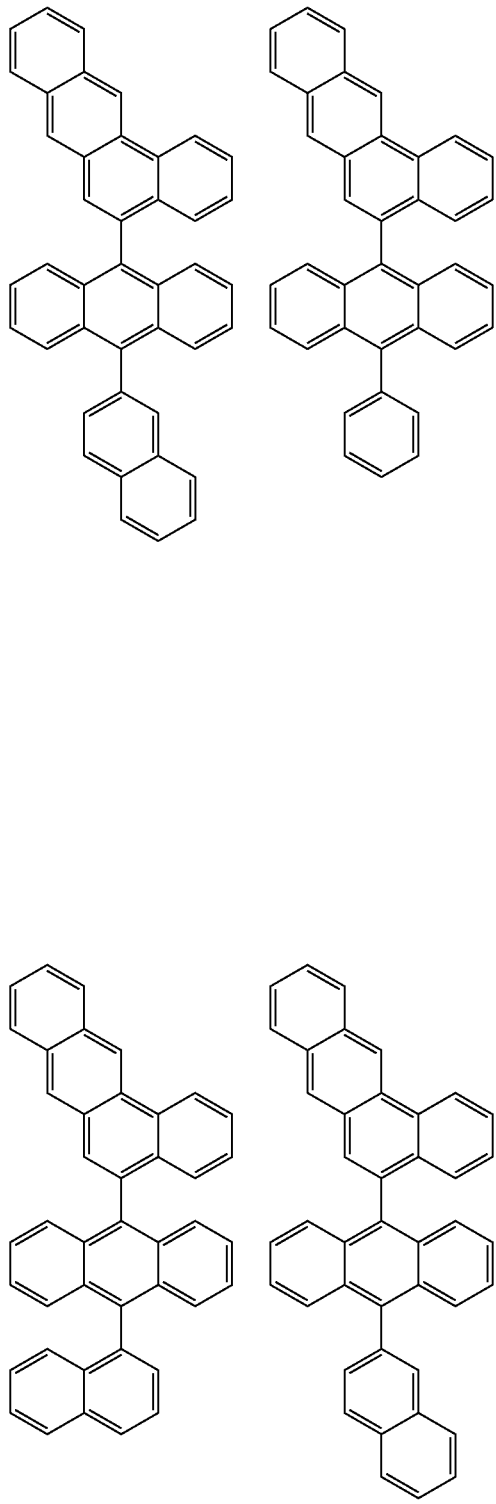
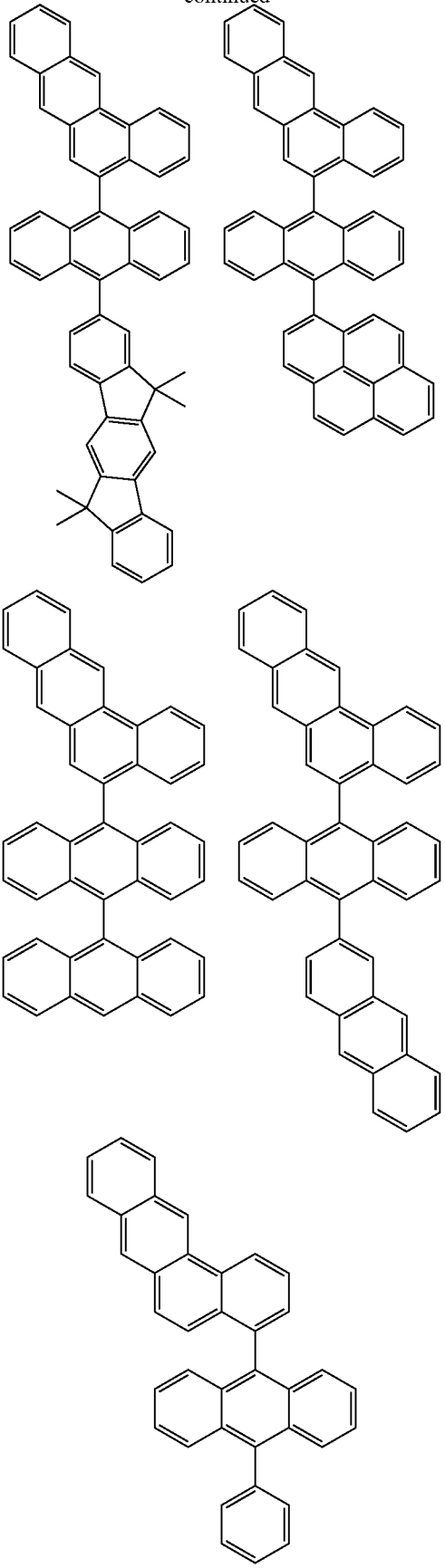

69
-continued
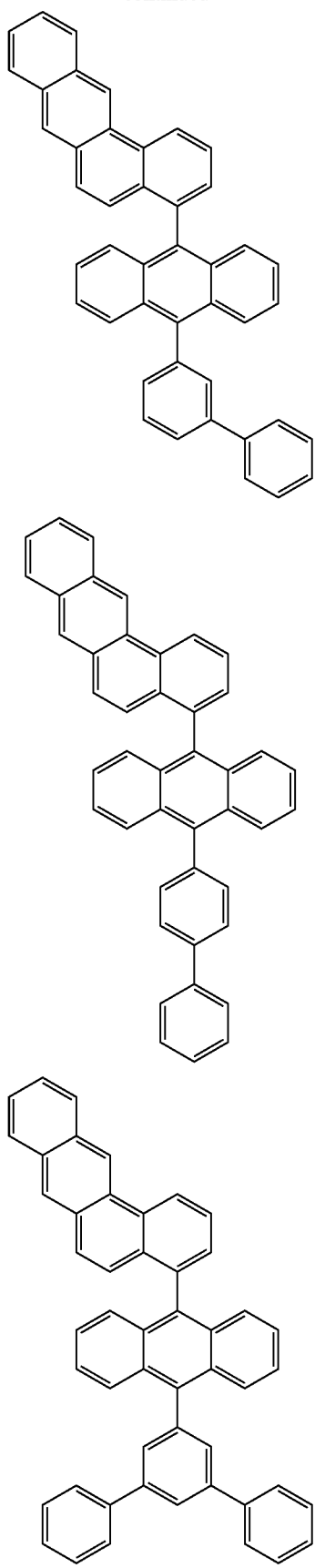
70
-continued
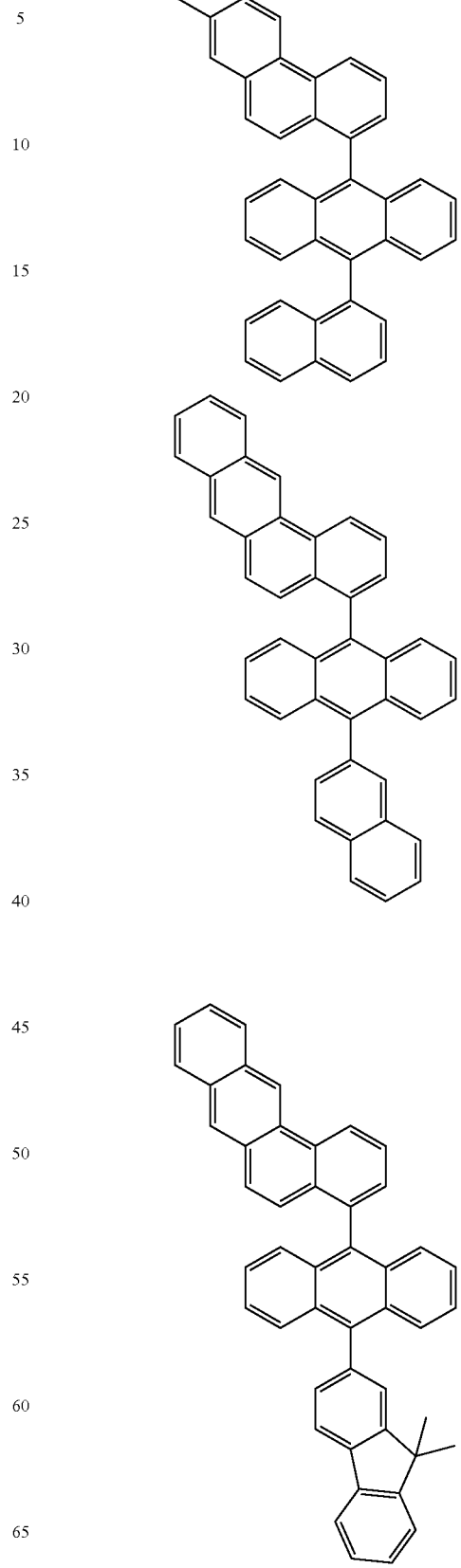

71
-continued
72
-continued
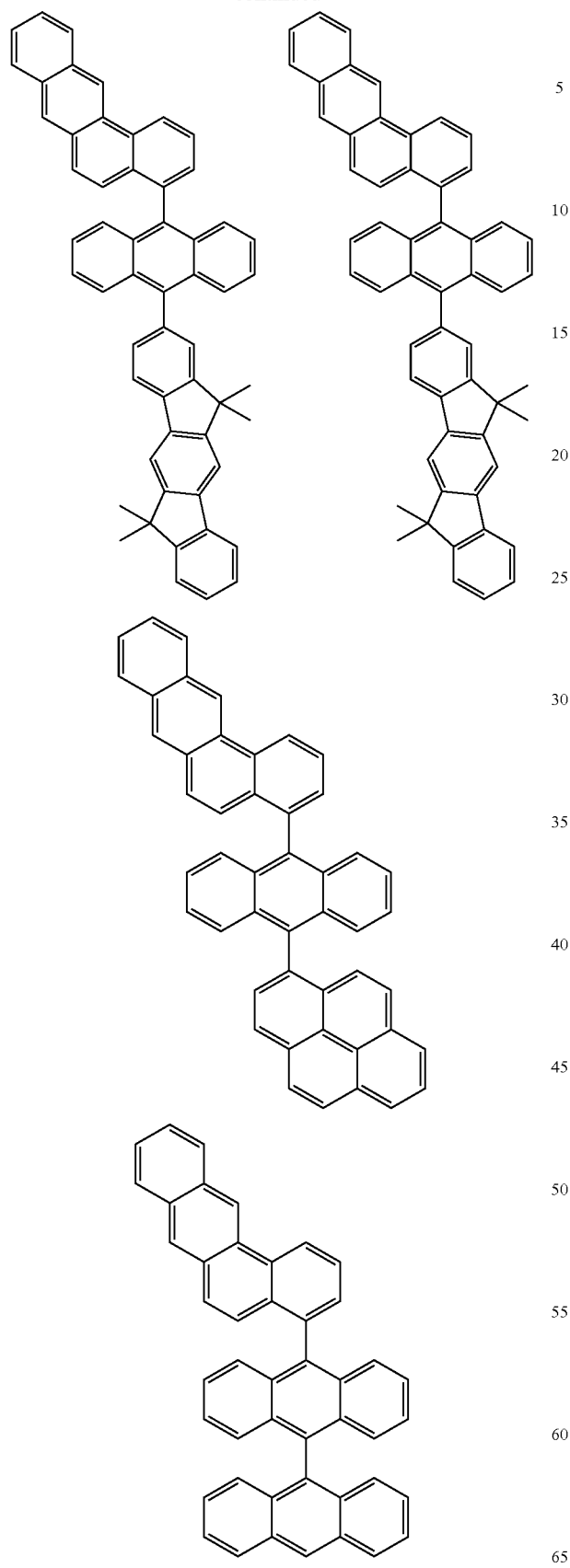

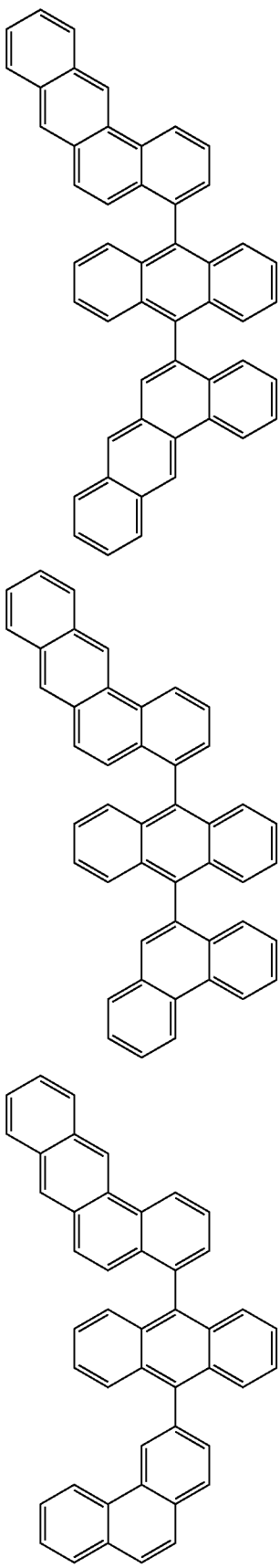

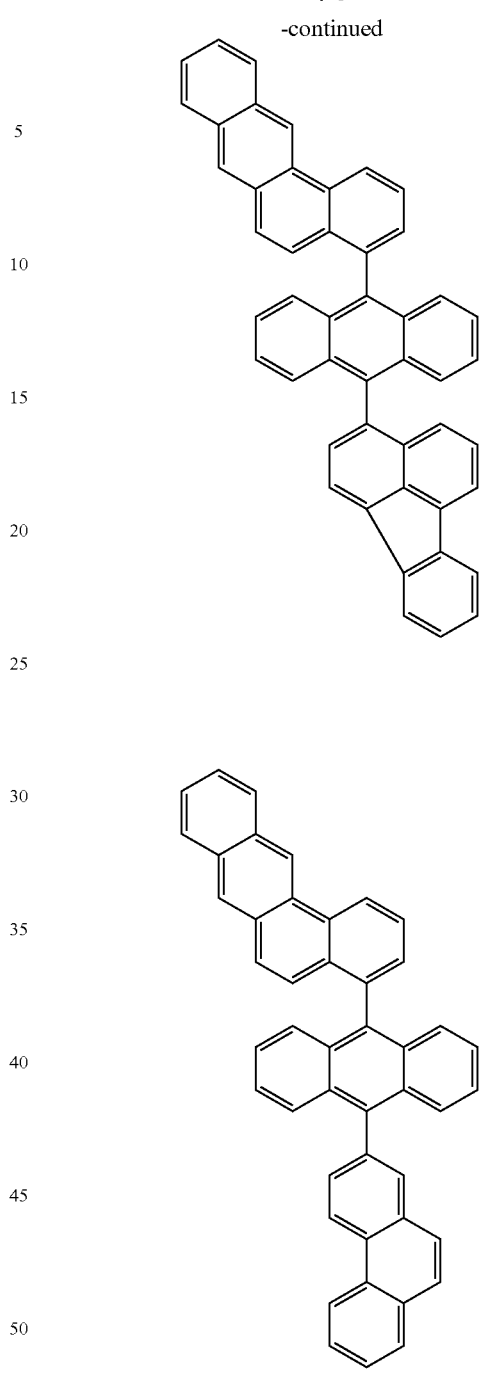

The compounds of the formula (I) used in the organic electroluminescent device according to the invention and the compounds of the formula (II) used can be prepared by processes known to the person skilled in the art.

For example, synthetic routes as described in the application WO 2008/145239 can be employed for the preparation of the compounds of the formula (II).

Schemes 1 and 2 below are intended to depict two illustrative syntheses which result in compounds of the formula (II). 4-Bromobenz[a]anthracene can be obtained in accordance with Badgar et al., *J. Chem. Soc.* 1949, 799, 5-bromobenz[a]anthracene can be obtained in accordance with Newman et al., *J. Org. Chem.* 1982, 47(15), 2837.

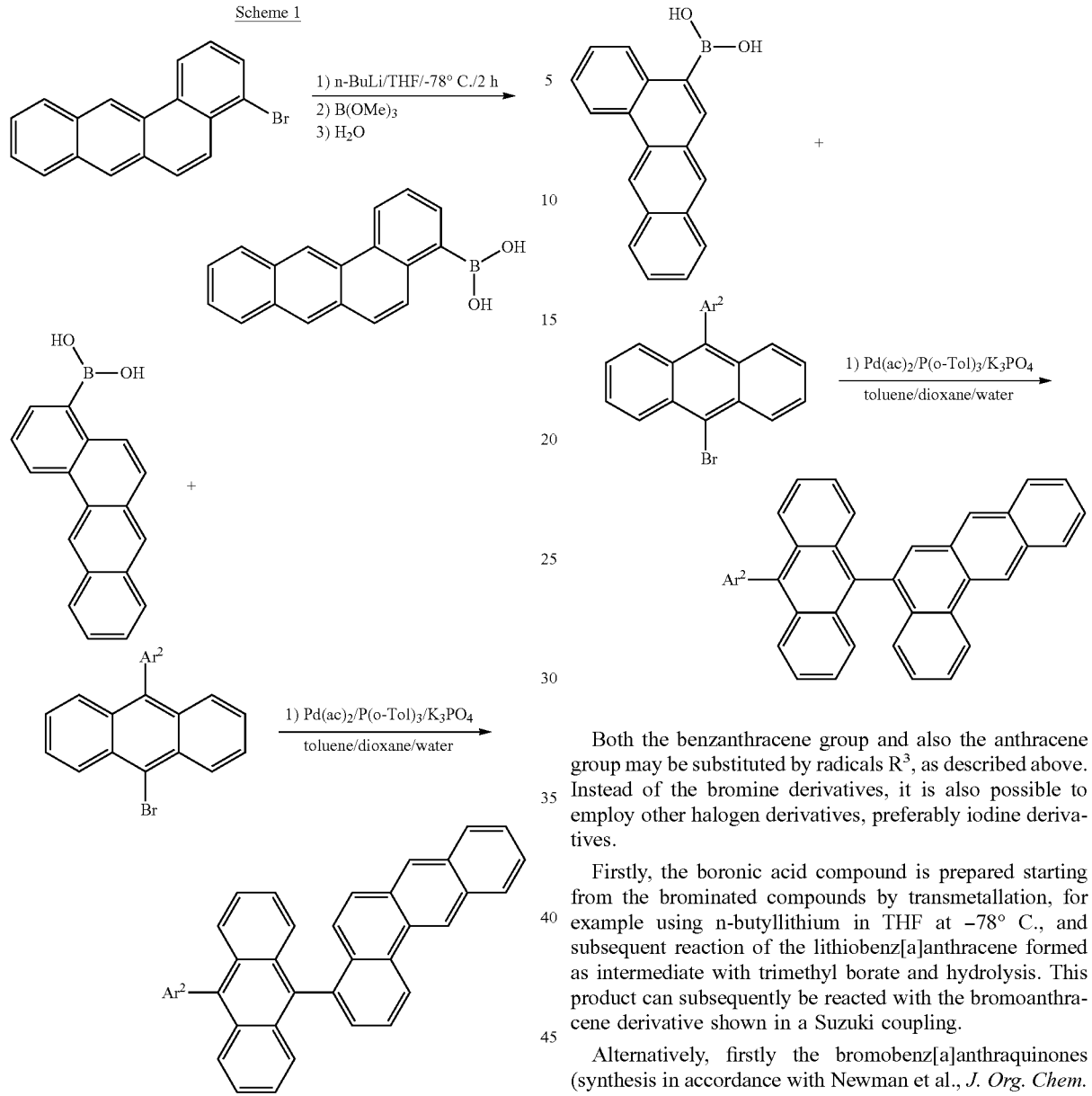

Both the benzanthracene group and also the anthracene group may be substituted by radicals $R^3$, as described above. Instead of the bromine derivatives, it is also possible to employ other halogen derivatives, preferably iodine derivatives.

Firstly, the boronic acid compound is prepared starting from the brominated compounds by transmetallation, for example using n-butyllithium in THF at −78° C., and subsequent reaction of the lithiobenz[a]anthracene formed as intermediate with trimethyl borate and hydrolysis. This product can subsequently be reacted with the bromoanthracene derivative shown in a Suzuki coupling.

Alternatively, firstly the bromobenz[a]anthraquinones (synthesis in accordance with Newman et al., *J. Org. Chem.* 1983, 48, 2926-8; Cho et al., *J. Org. Chem.* 1987, 52, 2668-78; Becker et al. *J. Phys. Chem.* 1993, 97, 344-9) can be coupled and then reduced to the corresponding hydrocarbons, as shown by way of example for 5-bromobenz[a]anthraquinone in Scheme 3.

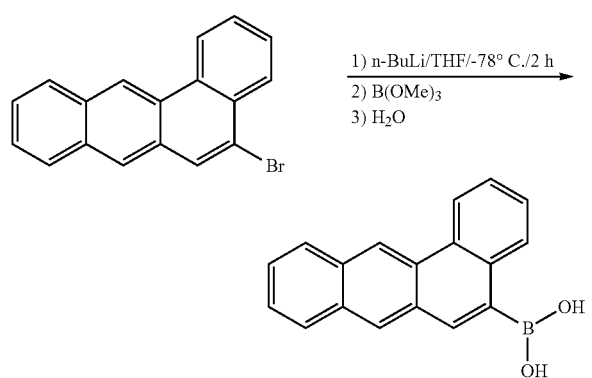

Scheme 3

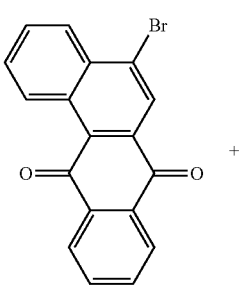

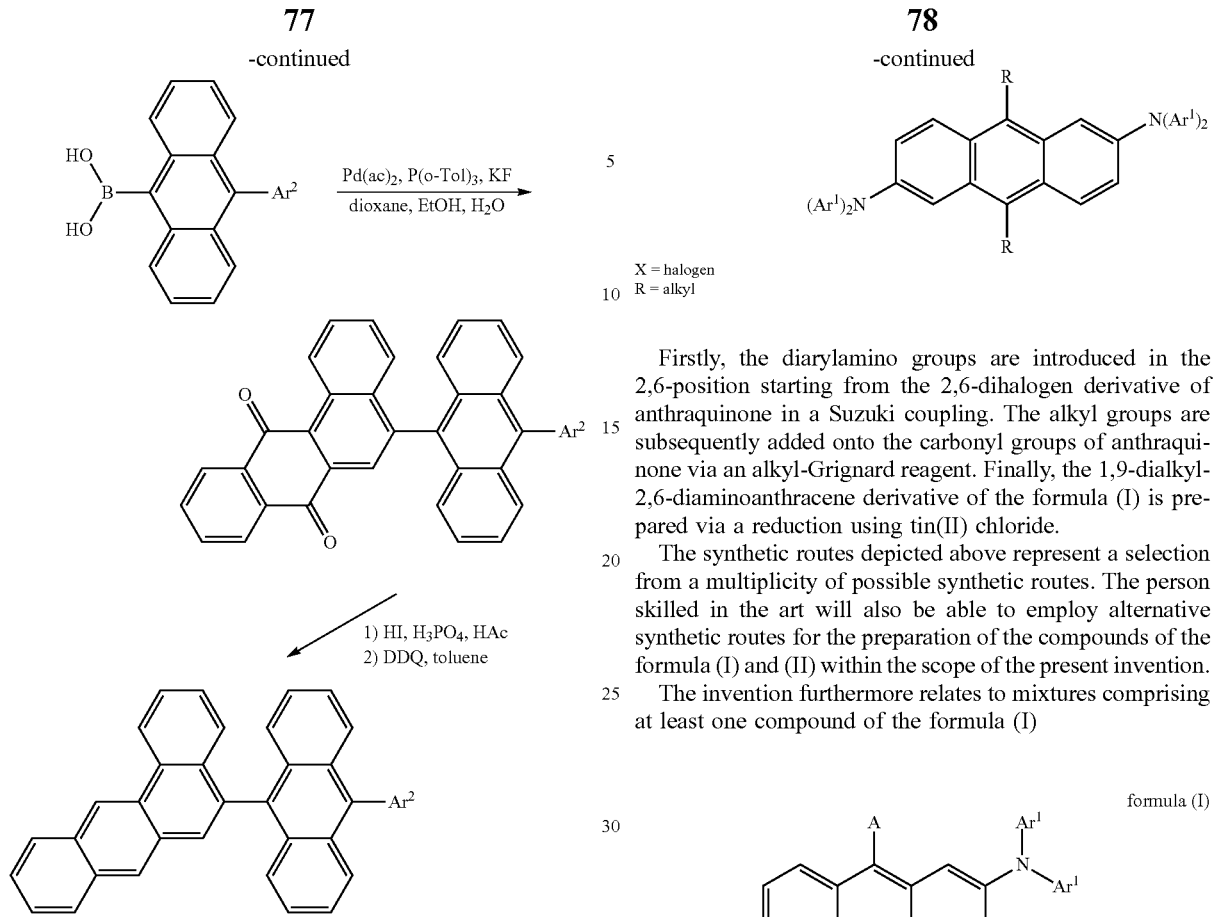

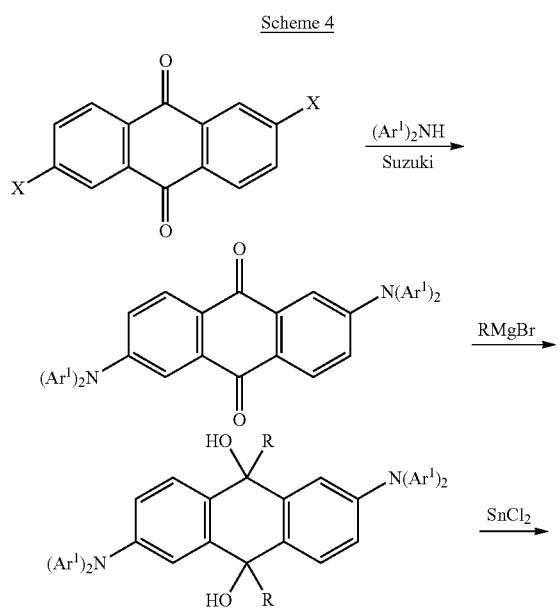

The 2,6-aminoanthracenes used as dopant can be prepared, for example, as described in WO 2007/021117.

A possible synthesis sequence for 1,9-dialkyl-2,6-diaminoanthracenes will additionally be presented at this point (Scheme 4). A multiplicity of different alkyl derivatives of 2,6-diaminoanthracenes can be prepared by this route.

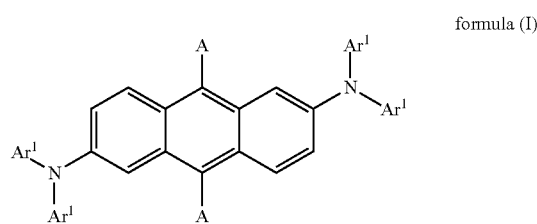

X = halogen
R = alkyl

Firstly, the diarylamino groups are introduced in the 2,6-position starting from the 2,6-dihalogen derivative of anthraquinone in a Suzuki coupling. The alkyl groups are subsequently added onto the carbonyl groups of anthraquinone via an alkyl-Grignard reagent. Finally, the 1,9-dialkyl-2,6-diaminoanthracene derivative of the formula (I) is prepared via a reduction using tin(II) chloride.

The synthetic routes depicted above represent a selection from a multiplicity of possible synthetic routes. The person skilled in the art will also be able to employ alternative synthetic routes for the preparation of the compounds of the formula (I) and (II) within the scope of the present invention.

The invention furthermore relates to mixtures comprising at least one compound of the formula (I)

formula (I)

and at least one compound of the formula (II)

formula (II)

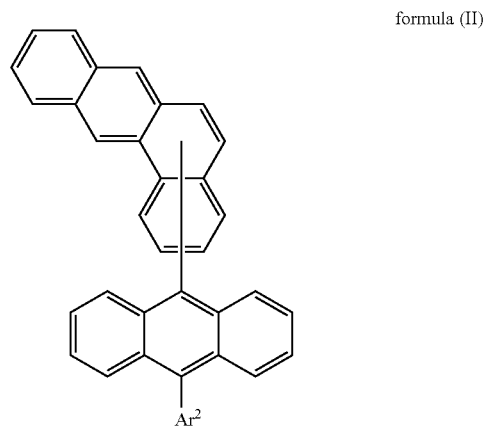

where the compound of the formula (I) may be substituted by a radical $R^2$ at all free positions of the anthracene ring system and where the compound of the formula (II) may be substituted by a radical $R^3$ at all free positions of the anthracene and benzanthracene ring system and where the following furthermore applies to the symbols occurring:

A is on each occurrence, identically or differently, a straight-chain alkyl group having 1 to 40 C atoms or a branched or cyclic alkyl group having 3 to 40 C atoms, each of which may be substituted by one or more radicals R¹, where one or more CH₂ groups may be replaced by —R¹C═CR¹—, —C≡C—, Si(R¹)₂, Ge(R¹)₂, Sn(R¹)₂, C═O, C═S, C═Se, C═NR¹, P(═O)(R¹), SO, SO₂, NR¹, —O—, —S—, —COO— or —CONR¹— and where one or more H atoms may be replaced by D, F, Cl, Br, I, CN or NO₂, or an aromatic or heteroaromatic ring system having 5 to 60 aromatic ring atoms, which may be substituted by one or more radicals R¹;

Ar¹, Ar² is on each occurrence, identically or differently, an aromatic or heteroaromatic ring system having 5 to 60 aromatic ring atoms, which may be substituted by one or more radicals R¹, where two radicals Ar¹ which are bonded to the same nitrogen atom may be linked to one another by a single bond or a bridge selected from B(R¹), C(R¹)₂, Si(R¹)₂, C═O, C═NR¹, C═C(R¹)₂, O, S, S═O, SO₂, N(R¹), P(R¹) and P(═O)R¹;

R¹, R², R³ are, identically or differently on each occurrence, H, D, F, Cl, Br, I, CHO, N(R⁴)₂, C(═O)R⁴, P(═O)(R⁴)₂, S(═O)R⁴, S(═O)₂R⁴, CR⁴═C(R⁴)₂, CN, NO₂, Si(R⁴)₃, B(OR⁴)₂, OSO₂R⁴, OH, COOR⁴ or CON(R⁴)₂, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals R⁴, where one or more CH₂ groups may be replaced by —R⁴C═CR⁴—, —C≡C—, Si(R⁴)₂, Ge(R⁴)₂, Sn(R⁴)₂, C═O, C═S, C═Se, C═NR⁴, P(═O)(R⁴), SO, SO₂, NR⁴, —O—, —S—, —COO— or —CONR⁴— and where one or more H atoms may be replaced by D, F, Cl, Br, I, CN or NO₂, or an aromatic or heteroaromatic ring system having 5 to 60 aromatic ring atoms, which may in each case be substituted by one or more non-aromatic radicals R⁴, or an aryloxy or heteroaryloxy group having 5 to 60 aromatic ring atoms, which may be substituted by one or more non-aromatic radicals R⁴, or a combination of these systems, where two or more radicals R¹, R² or R³ may be linked to one another and may form a ring or ring system;

R⁴ is, identically or differently on each occurrence, H, D, F or an aliphatic, aromatic and/or heteroaromatic organic radical having 1 to 20 C atoms, in which, in addition, one or more H atoms may be replaced by D or F; two or more identical or different substituents R⁴ here may also be linked to one another and form a ring or ring system.

The same preferred embodiments as indicated above for organic electroluminescent devices comprising compounds of the formula (I) and (II) apply to the compounds of the formula (I) and (II) in mixtures.

It is particularly preferred for A to be selected on each occurrence, identically or differently, from the following groups

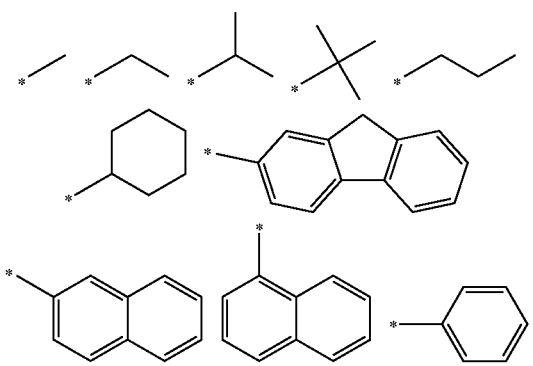

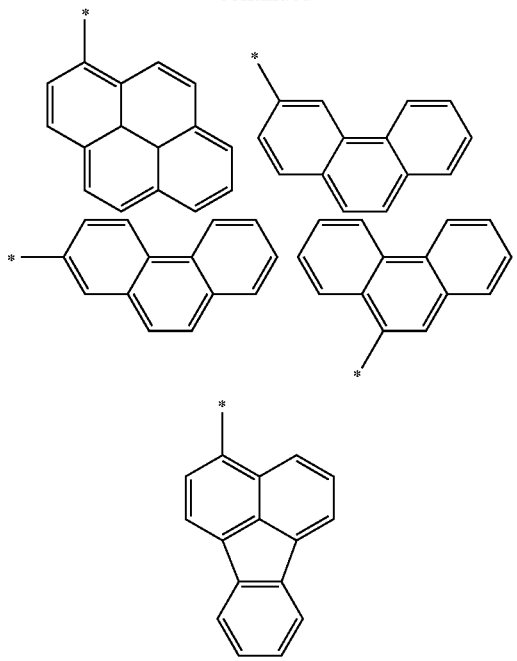

where the symbol * denotes the bond to the anthracene group, and the groups A may be substituted by a radical R¹ as defined above at all free positions.

It is furthermore preferred for the bond between the benzanthracene group and the anthracene group in the compound of the formula (II) in the mixtures according to the invention to be in the 4- or 5-position of the benzanthracene group.

For the mixtures according to the invention, the proportion of the compound of the formula (II) is preferably between 50.0 and 99.9% by weight, particularly preferably between 80.0 and 99.5% by weight and very particularly preferably between 90.0 and 99.0% by weight. Correspondingly, the proportion of the compound of the formula (I) is preferably between 0.1 and 50.0% by weight, particularly preferably between 0.5 and 20.0% by weight and very particularly preferably between 1.0 and 10.0% by weight.

The mixtures indicated above are used in accordance with the invention in organic electroluminescent devices, preferably in the electroluminescent layer of organic electroluminescent devices.

The compound of the formula (I) here is preferably employed as dopant and the compound of the formula (II) is preferably employed as matrix material in the electroluminescent layer of an organic electroluminescent device.

A matrix material in a system comprising matrix and dopant is taken to mean the component which is present in the higher proportion in the system. In the case of a system comprising one matrix material and a plurality of dopants, the matrix material is taken to mean the component whose proportion in the mixture is the highest.

However, the mixtures according to the invention may additionally also be present in further layers of the organic electroluminescent device, for example in a hole-transport layer, electron-transport layer or interlayer.

The invention furthermore relates to formulations comprising a mixture as defined above and at least one solvent, preferably an organic solvent. The formulations can be used in the production of the organic electroluminescent devices according to the invention.

Apart from cathode, anode and the emitting layer, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, inter-layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. However, it should be pointed out that each of these layers does not necessarily have to be present.

The organic electroluminescent devices according to the invention are preferably fluorescent organic electroluminescent devices. However, they can also be phosphorescent organic electroluminescent devices. In particular, the devices according to the invention can comprise both fluorescent electroluminescent layers and also phosphorescent electroluminescent layers.

In a further preferred embodiment of the invention, the organic electroluminescent device comprises a plurality of electroluminescent layers, where at least one electroluminescent layer comprises at least one compound of the formula (I) and at least one compound of the formula (II). These emission layers particularly preferably have in total a plurality of emission maxima between 380 nm and 750 nm, resulting overall in white emission, i.e. various emitting compounds which are able to fluoresce or phosphoresce and emit blue or yellow or orange or red light are used in the emitting layers. Particular preference is given to three-layer systems, i.e. systems having three emitting layers, where one of these layers is formed by the electroluminescent layer arranged in the organic electroluminescent device according to the invention, where this layer preferably emits green light. A layer which exhibits blue or orange or red emission can then also be arranged besides this layer. The basic structure of an electroluminescent device of this type is described, for example, in WO 05/011013.

The person skilled in the art in the area of organic electroluminescence knows which materials he can employ in the above-mentioned functional layers. In general, all materials as are used in accordance with the prior art are suitable for the further layers. The person skilled in the art will be able to combine these materials with the electroluminescent layer of the organic electroluminescent device according to the invention without exercising an inventive activity.

Suitable charge-transport materials, as can be used in the hole-injection or hole-transport layer or in the electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer in the electroluminescent device according to the invention are indenofluorenamines and derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic rings (for example in accordance with U.S. Pat. No. 5,061,569), the amine derivatives disclosed in WO 95/09147, monobenzoindeno-fluorenamines (for example in accordance with WO 08/006449) or dibenzoindenofluorenamines (for example in accordance with WO 07/140847). Hole-transport and hole-injection materials which are furthermore suitable are derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials shown in the following table.

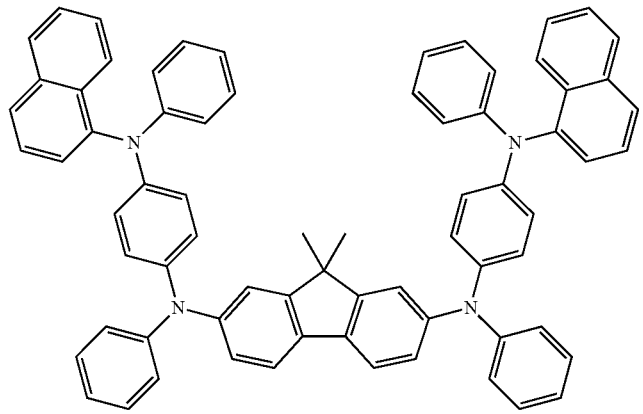

-continued
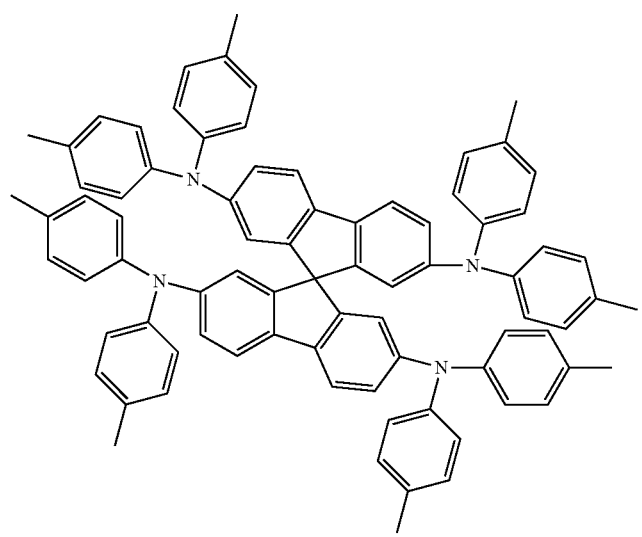
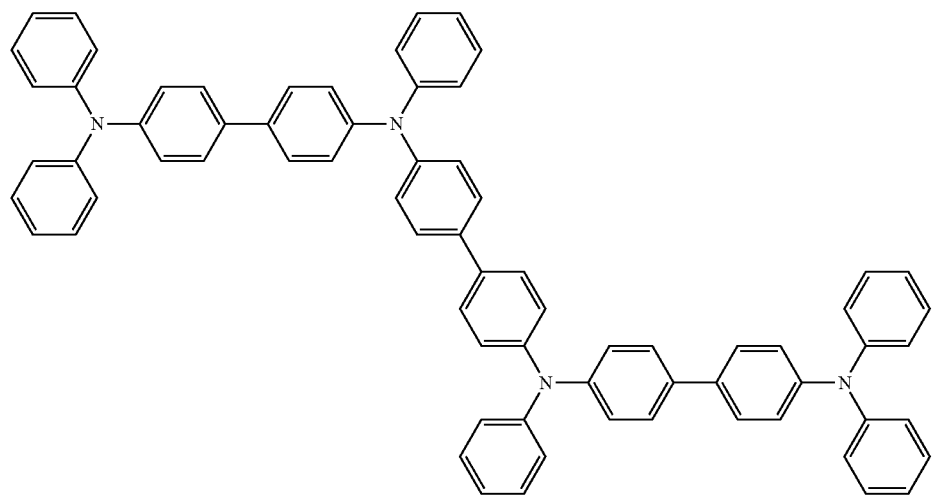
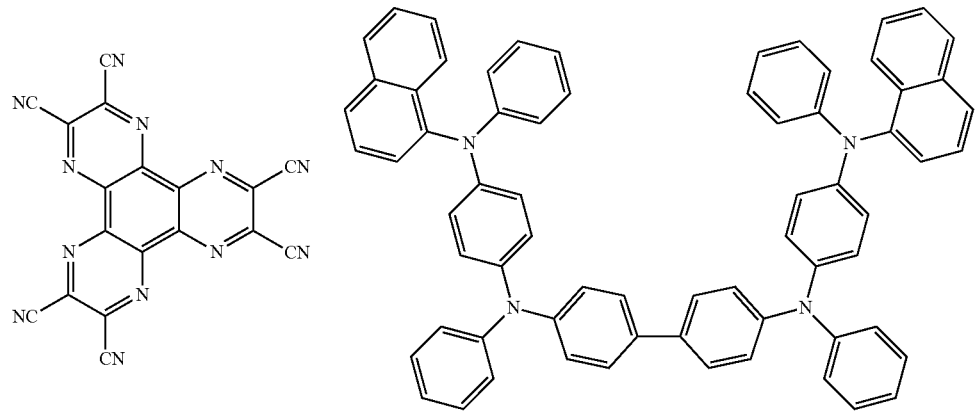

-continued
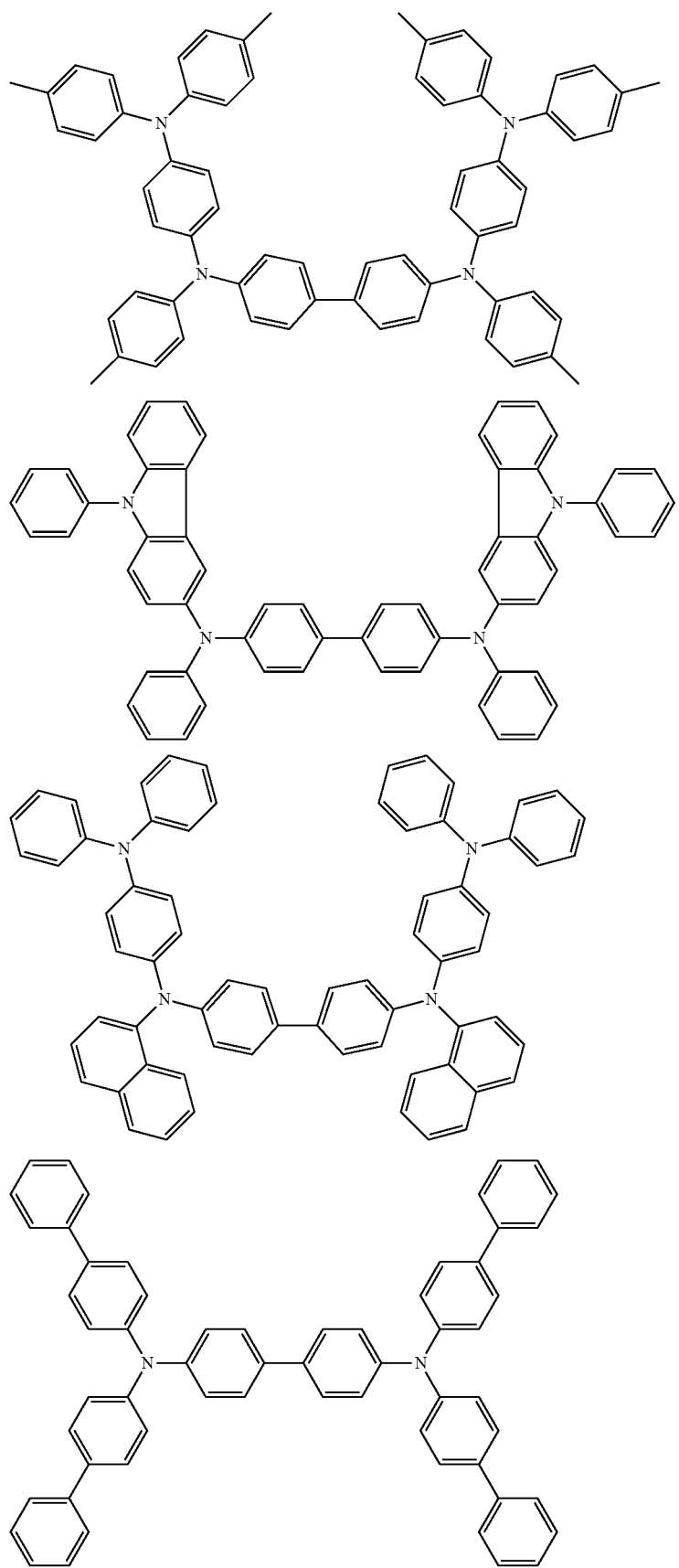

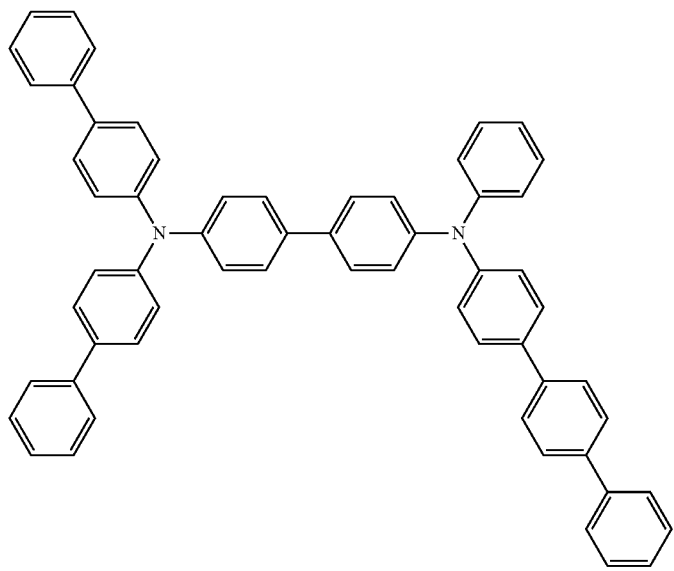
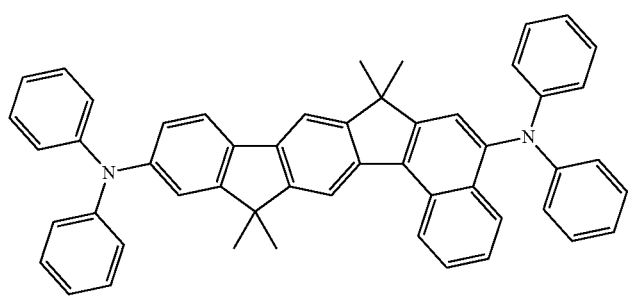
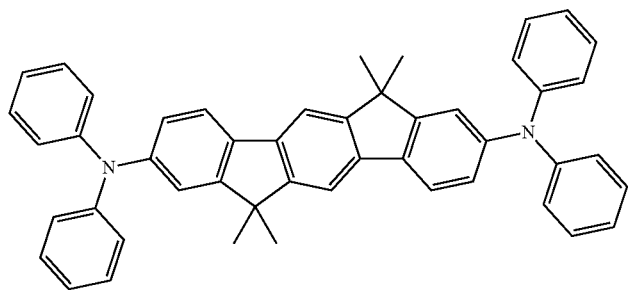
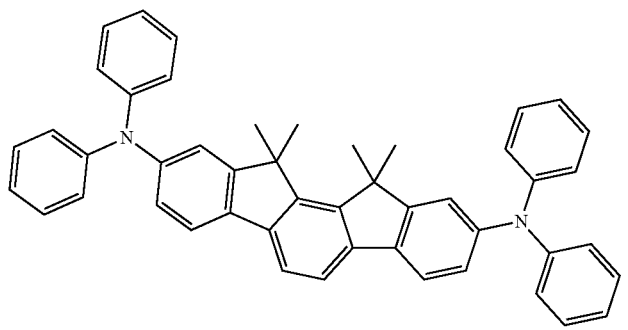

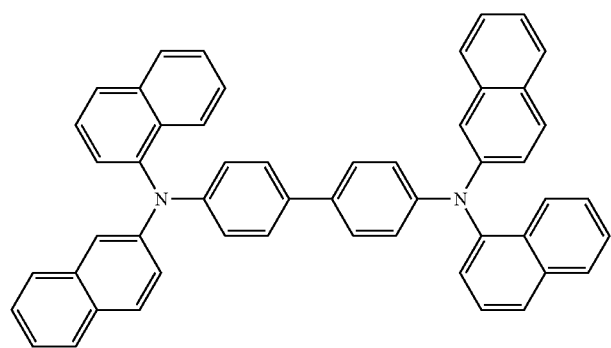
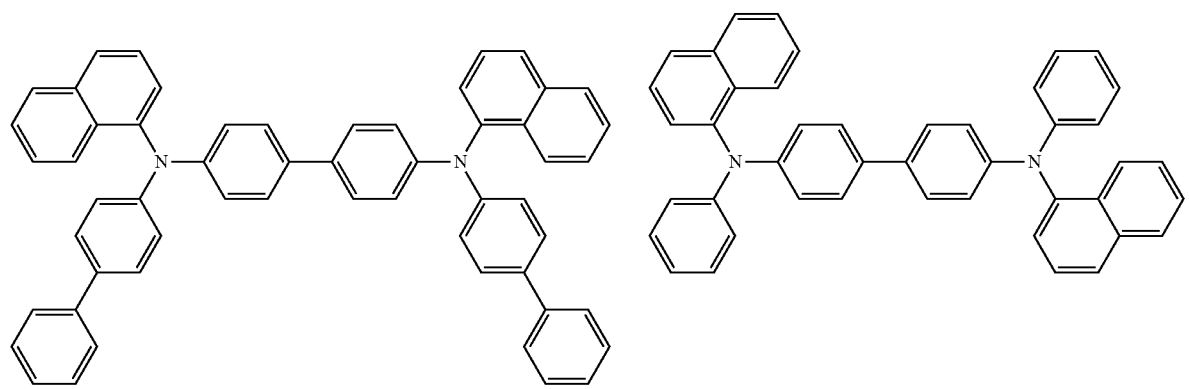
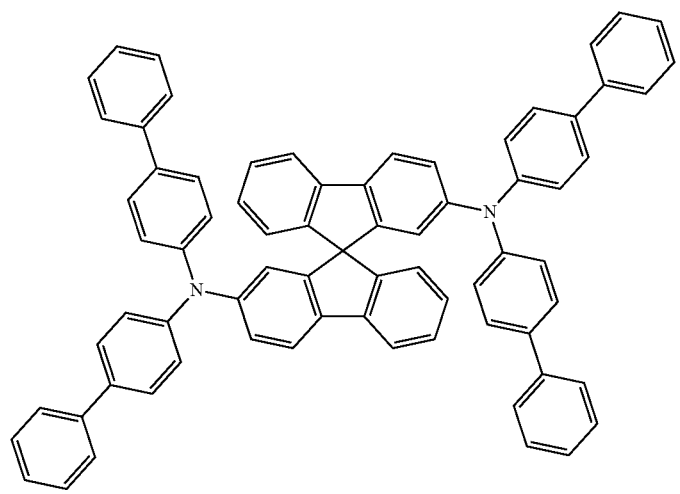

-continued

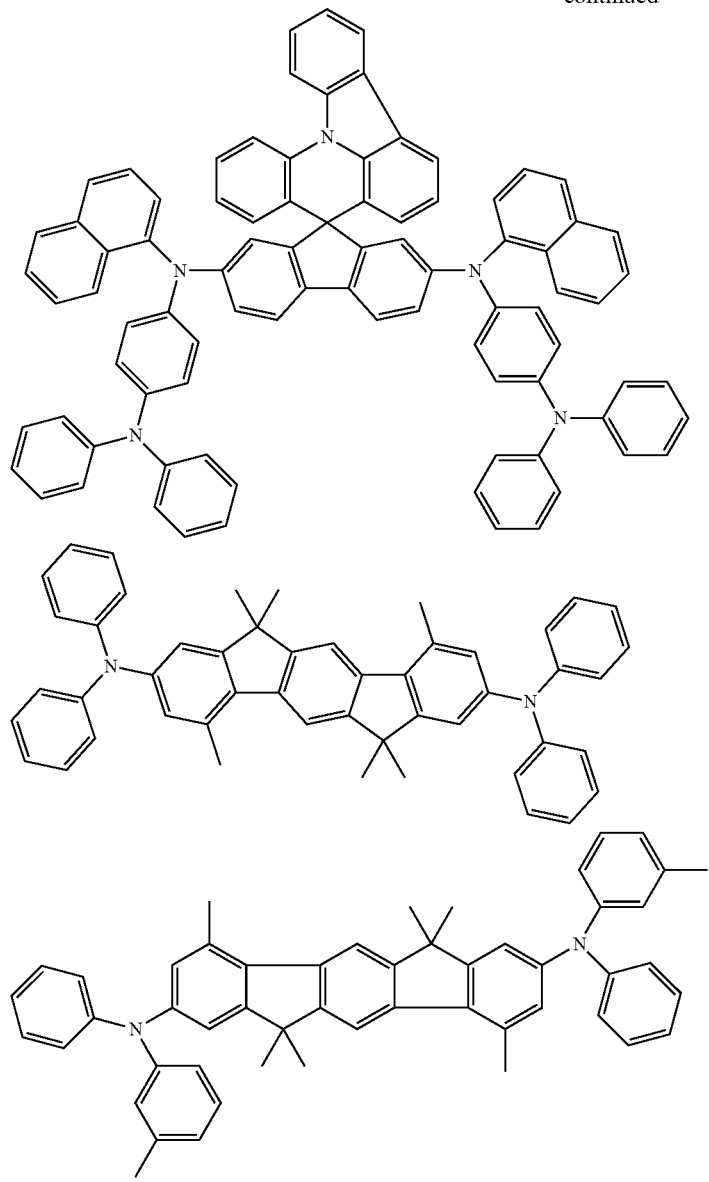

As already indicated above, the compound of the formula (I) is preferably used as dopant and the compound of the formula (II) is preferably used as matrix in the organic electroluminescent devices according to the invention.

The organic electroluminescent devices according to the invention may comprise further dopants in addition to the compounds of the formula (I).

Preferred dopants are selected from the class of the monostyrylamines, the distyrylamines, the tristyrylamines, the tetrastyrylamines, the styrylphosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or an aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group. An aromatic anthracenediamine is taken to mean a compound in which two diarylamino groups are bonded directly to an anthracene group. Aromatic pyrenamines, pyrenediamines, chrysenamines and chrysenediamines are defined analogously thereto, where the diarylamino groups on the pyrene are preferably bonded in the 1-position or in the 1,6-position.

Further preferred dopants are selected from indenofluorenamines or indenofluorenediamines, for example in accordance with WO 06/122630, benzoindenofluorenamines or benzoindenofluorenediamines, for example in accordance with WO 08/006449, and dibenzoindenofluorenamines or dibenzoindenofluorenediamines, for example in accordance with WO 07/140847. Examples of dopants from the class of the styrylamines are substituted or unsubstituted tristilbenamines or the dopants described in WO 06/000388, WO 06/058737, WO 06/000389, WO 07/065549 and WO 07/115610. Preference is furthermore given to the condensed hydrocarbons disclosed in WO 10/012328.

The organic electroluminescent devices according to the invention may comprise further matrix materials in addition to the compounds of the formula (II).

Suitable matrix materials are materials from various classes of substance. Preferred matrix materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with WO 08/145239).

Preferred matrix materials are furthermore selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the compounds according to the invention, preferred matrix materials are furthermore selected from the classes of the oligoarylenes containing anthracene, benzanthracene, benzophenanthrene and/or pyrene or atropisomers of these compounds. An oligoarylene in the sense of this invention is intended to be taken to mean a compound in which at least three aryl or arylene groups are bonded to one another.

Suitable electron-transport or electron-injection materials which can be used in the electroluminescent device according to the invention are, for example, the materials shown in the following table. Electron-transport and electron-injection materials which are furthermore suitable are, for example, AlQ$_3$, BAlQ, LiQ and LiF.

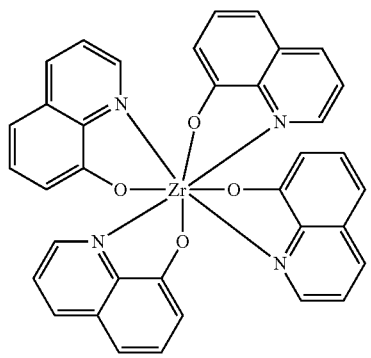

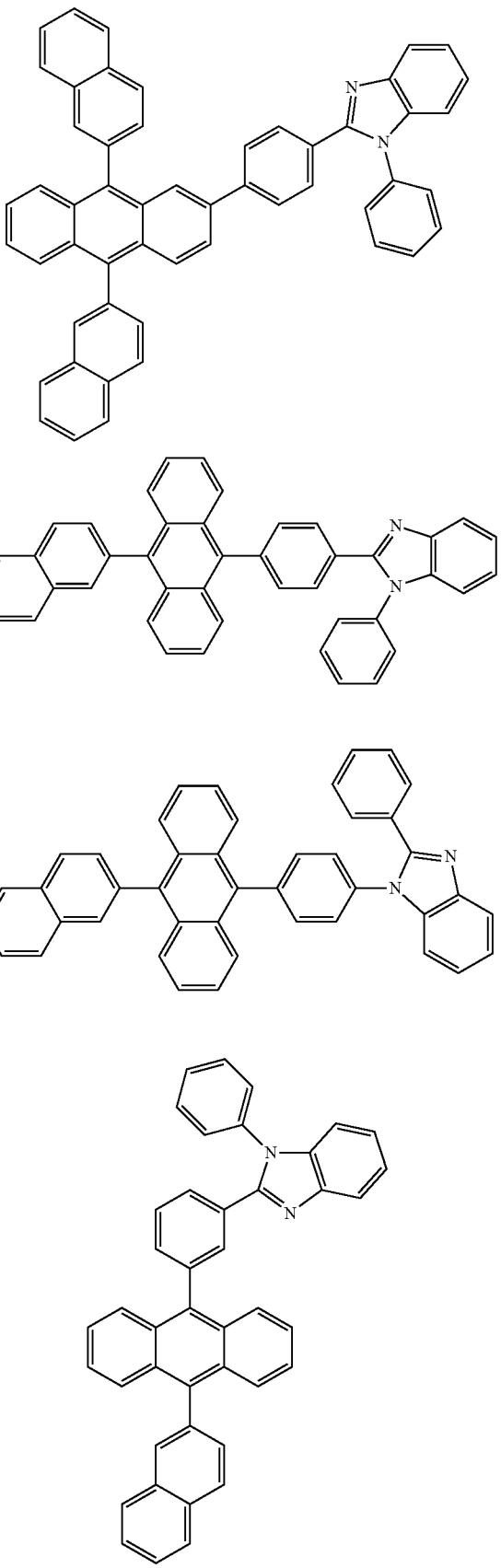

95
-continued
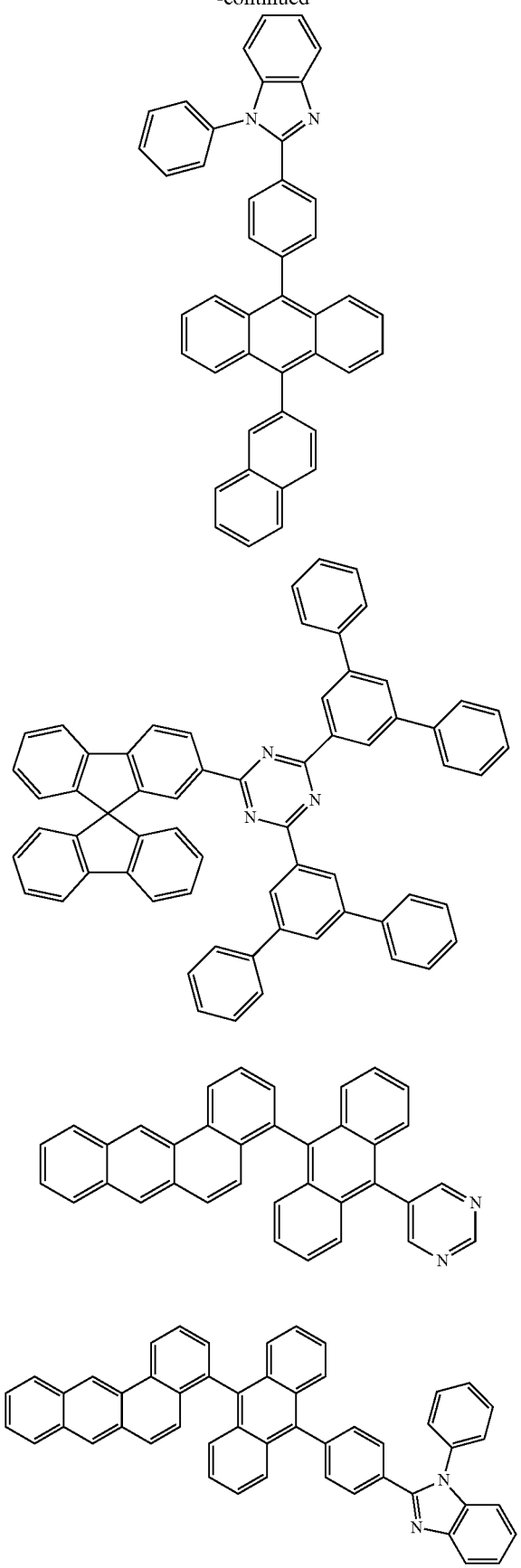
96
-continued
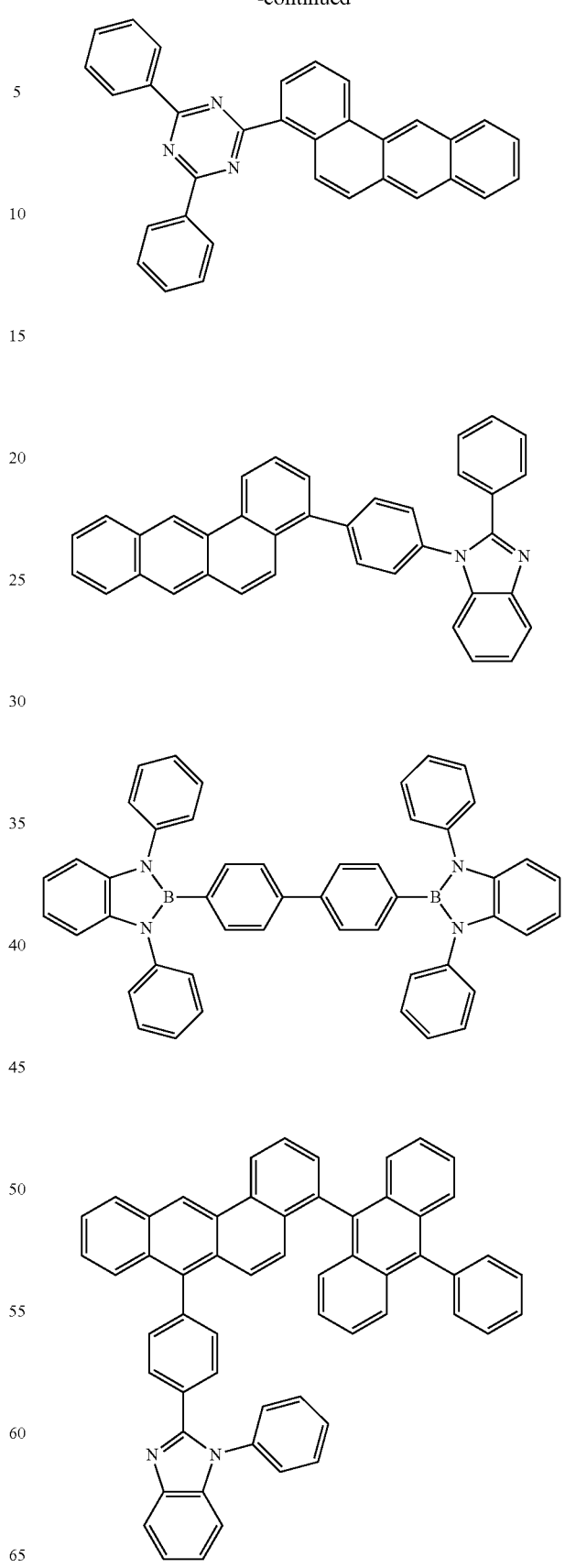

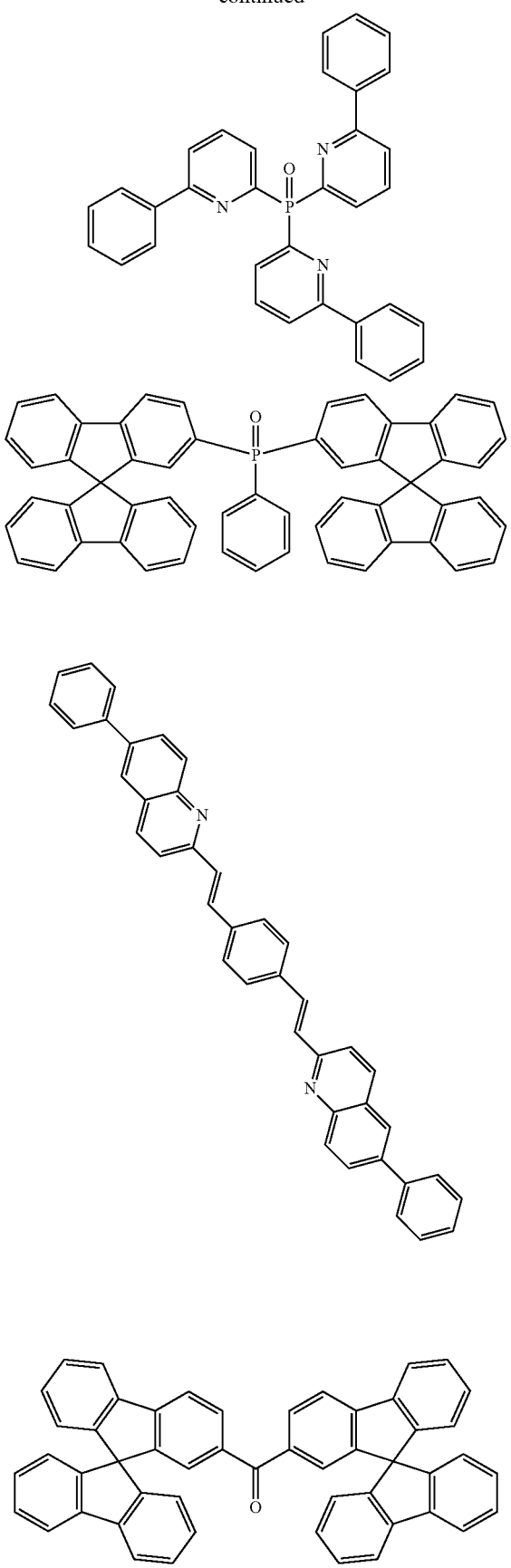
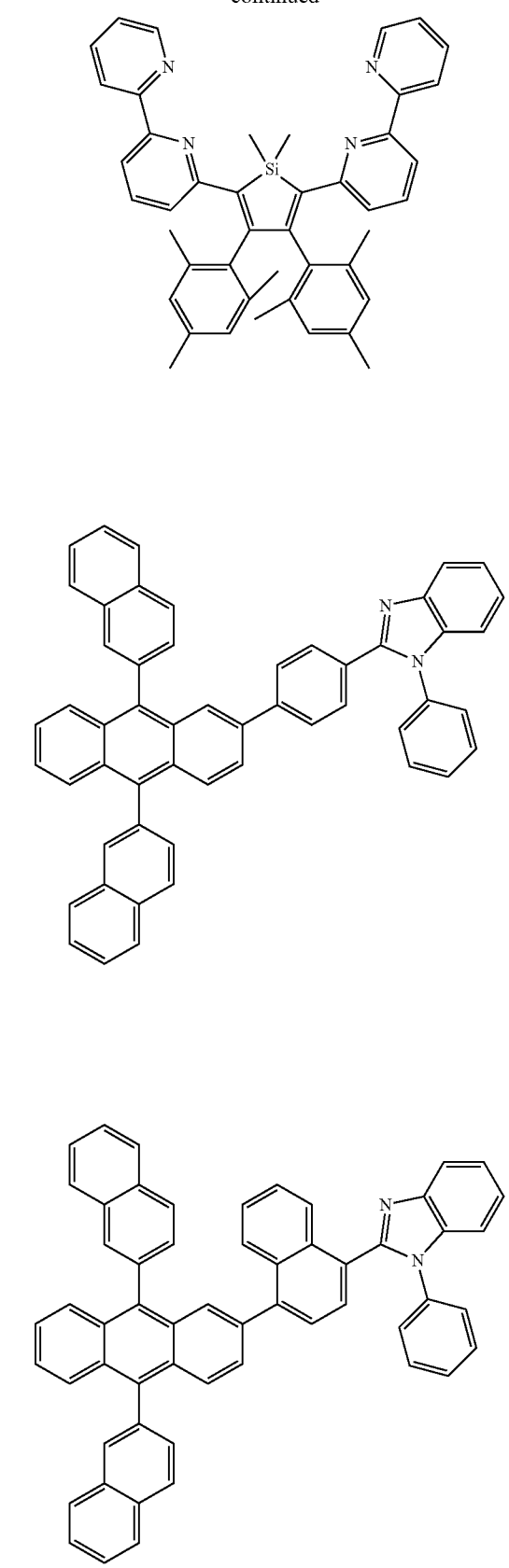

The cathode of the organic electroluminescent device preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). Furthermore, lithium quinolinate (LiQ) can be used for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to facilitate either irradiation of the organic material (organic solar cell) or the coupling-out of light (OLEDs, O-LASERS). A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is structured correspondingly (depending on the application), provided with contacts and finally sealed, since the lifetime of the devices according to the invention is shortened in the presence of water and/or air.

In a preferred embodiment, the organic electroluminescent device according to the invention is characterised in that one or more layers are applied by means of a sublimation process, in which the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing. Soluble compounds of the formula (I) and formula (II) are necessary for this purpose. High solubility can be achieved through suitable substitution of the compounds.

It is furthermore preferred to produce an organic electroluminescent device according to the invention by applying one or more layers from solution and one or more layers by a sublimation process.

The electronic devices according to the invention can be employed in displays, as light sources in lighting applications and as light sources in medical and/or cosmetic applications (for example light therapy).

The compounds of the formula (I) used as dopant compounds have only a low Stokes shift and thus narrow emission bands due to minimal degrees of rotational freedom.

The use of compounds of the formula (I) together with compounds of the formula (II) in an electroluminescent layer of an organic electroluminescent device effects improved properties of the device, preferably an increase in the efficiency and lifetime. A possible reason for this is an improved charge carrier balance.

Furthermore, the compounds of the formula (II) have good film-formation properties and a low tendency towards crystallisation, which is advantageous, in particular, for mass production, as is necessary, for example, on use of such devices in automobile construction.

It has furthermore been found in accordance with the invention that the combination of compounds of the formula (I) with compounds of the formula (II) in the electroluminescent layer of organic electroluminescent devices enables high colour purity and high power efficiency of the devices to be achieved.

The following examples are intended to explain the invention in greater detail.

The examples do not have a restrictive character, i.e. the invention is not restricted to the said examples.

The person skilled in the art will be able, without being inventive, to prepare further compounds according to the invention and to employ these in electronic devices.

WORKING EXAMPLES

A) Synthesis Examples 1) 9,10-Di-tert-butyl-N,N'-dinaphthyl-2-yl-N,N'-diphenylanthracene-2,6-diamine 1a) 2,6-Bis(naphthyl-2-ylphenylamino)-4a,9a-dihydroanthraquinone 5.3 g (18.8 mmol) of 2,6-dichloro-4a,9a-dihydroanthraquinone, 9.1 g (41.4 mmol) of naphth-2-ylphenylamine and 4.9 g (50.7 mmol) of sodium tert-butoxide are suspended in 200 ml of p-xylene. 0.76 g (3.4 mmol) of Pd(OAc)$_2$ and 7 ml of a 1M solution of tri-tert-butylphosphine (7 mmol) are added to this suspension. The reaction mixture is heated under reflux for 48 h. After cooling, the organic phase is separated off, washed three times with 200 ml of water and subsequently evaporated to dryness. The residue is extracted with hot toluene and recrystallised from toluene. Yield: 6.2 g (9.6 mmol); 51% of theory.

1b) 9,10-Di-tert-butyl-2,6-bis(naphthyl-2-ylphenylamino)-9,10-dihydroanthracene-9,10-diol

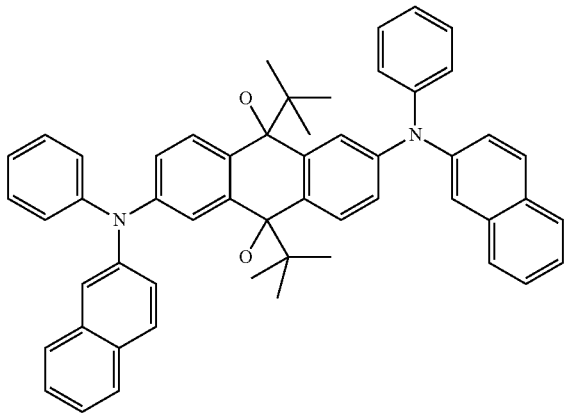 [SMILES: CC(C)(C)C1(O)c2ccc(N(c3ccccc3)c3ccc4ccccc4c3)cc2C(O)(C(C)(C)C)c2ccc(N(c3ccccc3)c3ccc4ccccc4c3)cc21]

2,6-Bis(naphthyl-2-ylphenylamino)-4a,9a-dihydroanthraquinone (5 g, 7.7 mmol) is initially introduced in 120 ml of THF (yellow suspension), and tert-butylmagnesium bromide (2.6 g, 16 mmol) in THF (100 ml) is slowly added dropwise at 10° C. The mixture is subsequently stirred at 75° C. for 8 h. After this time, 150 ml of 10% HCl are added to the reaction mixture, and the aqueous phase is extracted three times with dichloromethane. The combined organic phases are washed with water and dried over Na$_2$SO$_4$ and evaporated. The residue is recrystallised from heptane. The yield is 5.3 g (6.7 mmol, 90%).

1c) 9,10-Di-tert-butyl-N,N'-dinaphthyl-2-yl-N,N'-diphenylanthracene-2,6-diamine

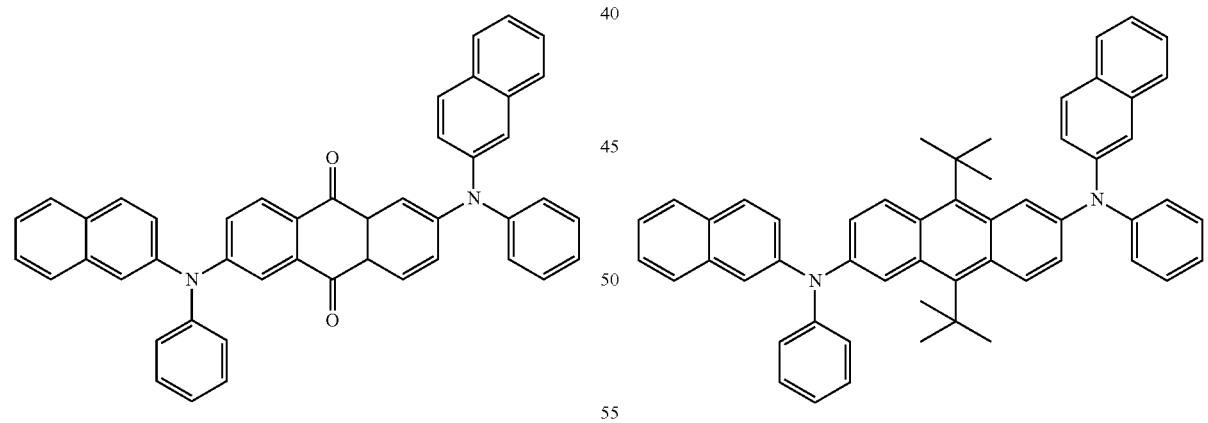

9,10-Di-tert-butyl-2,6-bis(naphthyl-2-ylphenylamino)-9,10-dihydroanthracene-9,10-diol (5.3 g, 6.7 mmol) is suspended in DMF (200 ml), and tin chloride (4.3 g, 22.8 mmol) is added, and the mixture is stirred at 140° C. for 18 h. After this time, 150 ml of 2 M HCl are added to the reaction mixture, and the aqueous phase is extracted three times with dichloromethane. The combined organic phases are washed with water and dried over Na$_2$SO$_4$ and evaporated. The residue is recrystallised from toluene. The yield is 2.3 g (2.8 mmol, 42%). Finally, the compound is sublimed in a high vacuum, the purity is 99.9%.

2) 9,10-Di-tert-butyl-N,N'-bis(9,9-dimethyl-9H-fluoren-2-yl)-N,N'-diphenylanthracene-2,6-diamine 2a) (9,9-Dimethyl-9H-fluoren-2-yl)phenylamine

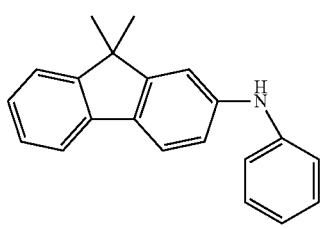 [SMILES: CC1(C)c2ccccc2-c2ccc(Nc3ccccc3)cc21]

62.5 g of 2-bromo-9,9-dimethyl-9H-fluorene (230 mmol), 21.4 g of aniline (230 mmol), 1.9 g (3.5 mmol) of 1,1-bis(diphenylphosphino)ferrocene, 0.6 g of palladium(II) acetate (2.8 mmol) and 57.2 g of sodium tert-butoxide (598 mmol) are heated at the boil for 18 h in 1.5 l of toluene under a protective-gas atmosphere. The mixture is subsequently partitioned between toluene and water, the organic phase is washed three times with water and dried over $Na_2SO_4$ and evaporated. The residue of 9,9-dimethyl-9H-fluoren-2-yl)-phenylamine remaining is recrystallised from toluene/ethyl acetate. The yield is 58.7 g (206 mmol, 90%).

2b) 2,6-Bis[(9,9-dimethyl-9H-fluoren-2-yl)phenylamino]-4a,9a-dihydroanthraquinone

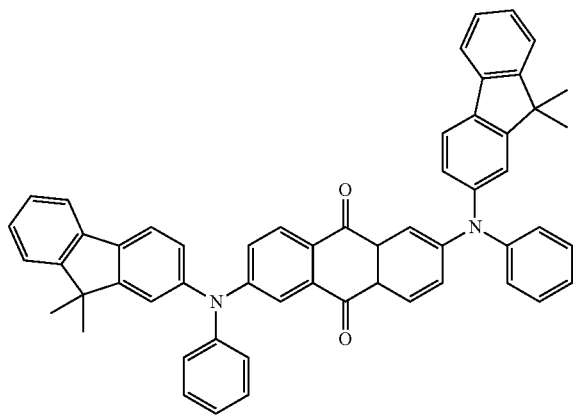 [SMILES: CC1(C)c2ccccc2-c2ccc(N(C3=CC4C(=O)c5ccc(N(c6ccccc6)c6ccc7c(c6)C(C)(C)c6ccccc6-7)cc5C(=O)C4C=C3)c3ccccc3)cc21]

10.6 g (37.6 mmol) of 2,6-dichloro-4a,9a-dihydroanthraquinone, 23.6 g (82.7 mmol) of (9,9-dimethyl-9H-fluoren-2-yl)phenylamine and 9.8 g (101.4 mmol) of sodium tert-butoxide are suspended in 600 ml of p-xylene. 1.52 g (6.8 mmol) of $Pd(OAc)_2$ and 15 ml of a 1 M solution of tri-tert-butylphosphine (14.9 mmol) are added to this suspension. The reaction mixture is heated under reflux for 48 h. After cooling, the organic phase is separated off, washed three times with 500 ml of water and subsequently evaporated to dryness. The residue is extracted with hot toluene and recrystallised from toluene. Yield: 16.3 g (21.1 mmol, 56% of theory).

2c) 9,10-Di-tert-butyl-2,6-bis[(9,9-dimethyl-9H-fluoren-2-yl)phenylamino]-9,10-dihydroanthracene-9,10-diol

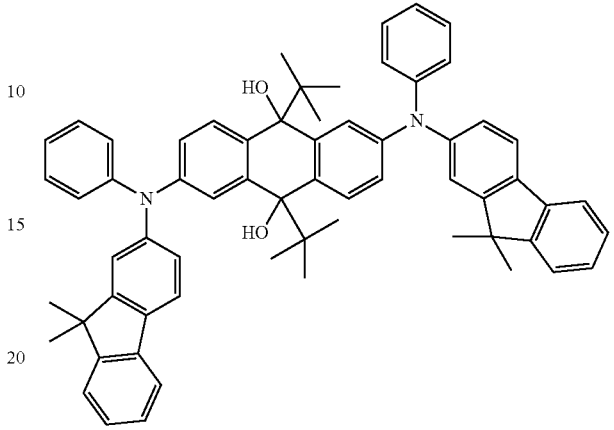

2,6-Bis[(9,9-dimethyl-9H-fluoren-2-yl)phenylamino]-4a,9a-dihydroanthraquinone (12.0 g, 15.5 mmol) is initially introduced in 250 ml of THF in a flask, and tert-butylmagnesium bromide (6.3 g, 38.7 mmol) in THF (200 ml) is slowly added dropwise over 6 h at 10° C. The mixture is subsequently stirred at 75° C. for 6 h. After this time, 250 ml of 10% HCl are added to the reaction mixture, and the aqueous phase is extracted with dichloromethane. The combined organic phases are washed with water and dried over $Na_2SO_4$ and evaporated. The residue is recrystallised from heptane. The yield is 12.3 g (13.8 mmol, 89%).

2d) 9,10-Di-tert-butyl-N,N'-dinaphthalen-2-yl-N,N'-diphenyl-anthracene-2,6-diamine

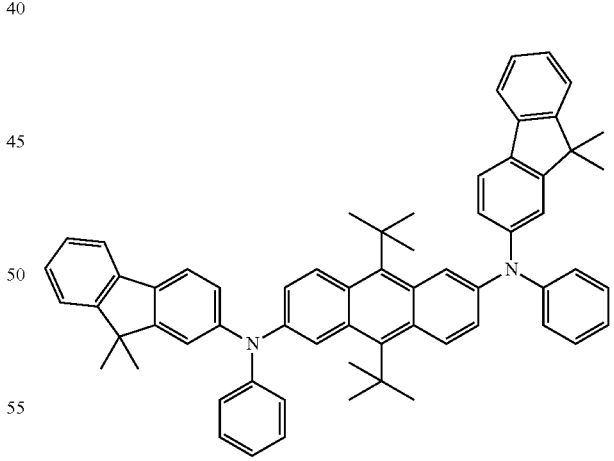

9,10-Di-tert-butyl-2,6-bis[(9,9-dimethyl-9H-fluoren-2-yl)phenylamino]-9,10-dihydroanthracene-9,10-diol (8.5 g, 10.0 mmol) is suspended in DMF (150 ml), tin chloride (5.7 g, 30 mmol) is added, and the mixture is stirred at 140° C. for 18 h. After this time, 250 ml of 2 M HCl are added to the reaction mixture, and the aqueous phase is extracted three times with dichloromethane. The combined organic phases are washed with water and dried over $Na_2SO_4$ and evaporated. The residue is recrystallised from toluene. The yield is 4.1 g (4.7 mmol, 47%). Finally, the product is sublimed in a high vacuum, the purity is 99.9%.

The synthesis of further compounds of the formula (I) is disclosed, for example, in the application US 2008/0182129.

The synthesis of the matrix compounds 9-(naphth-2-yl)-10-(benz[a]anthracen-4-yl)anthracene and 9-(phenyl)-10-(benz[a]anthracen-4-yl)anthracene employed in the following device examples is disclosed in the application WO 2008/145239.

B) Device Examples

The OLEDs are produced by a general process in accordance with WO 04/058911. In this process, glass plates coated with structured indium tin oxide (ITO) in a thickness of 150 nm are used as substrates. For better processing, firstly a layer of poly(3,4-ethylenedioxy-2,5-thiophene) (PEDOT; H. C. Starck, Goslar, Germany) as aqueous solution is applied to the substrate. The OLEDs have the following layer sequence: substrate/PEDOT, 20 nm/hole-injection layer (HIL1), 5 nm/hole-transport layer (HTM1), 130 nm/NPB, 20 nm/emission layer (EML), 30 nm/Alq$_3$, 20 nm/LiF, 1 nm/aluminium, 100 nm. The compounds employed for the production of the OLEDs are summarised in Table 1.

TABLE 1

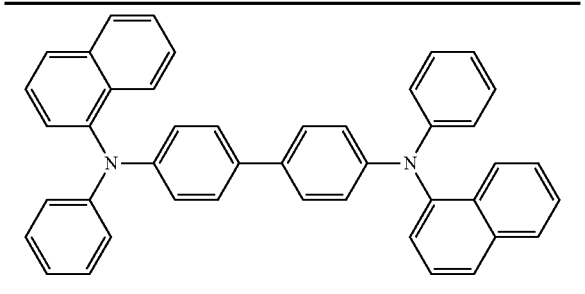

NPB

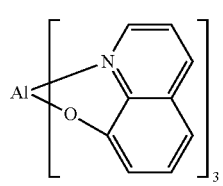

AlQ$_3$

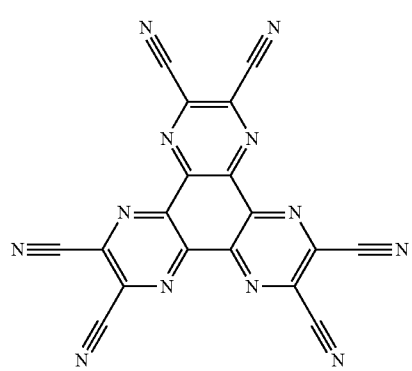

HIL1

TABLE 1-continued

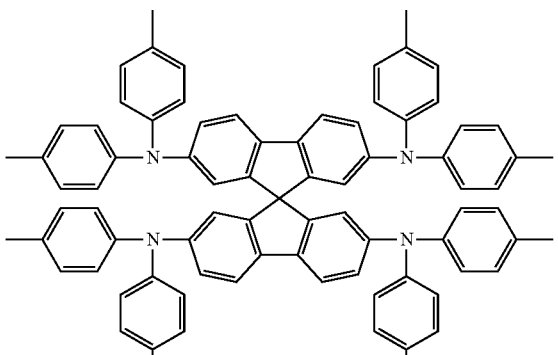

HTM1

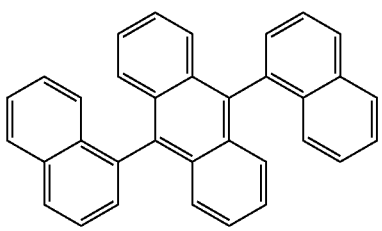

H1 (prior art)

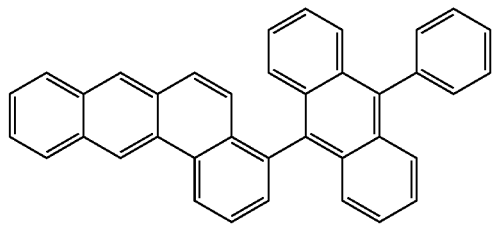

H2 (according to the invention)

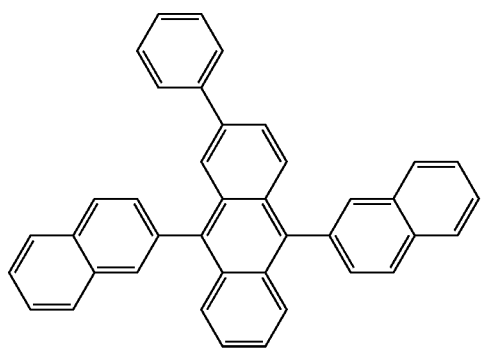

H3 (prior art)

TABLE 1-continued

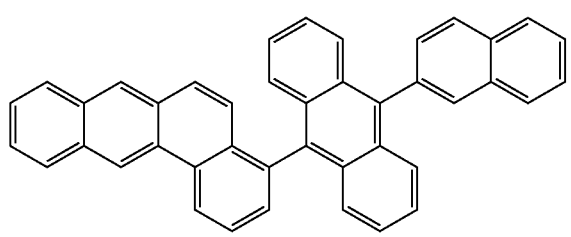

H4 (according to the invention)

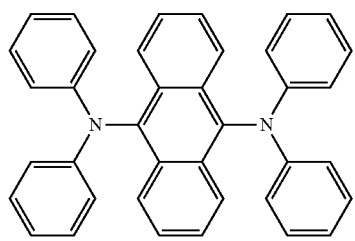

D1 (prior art)

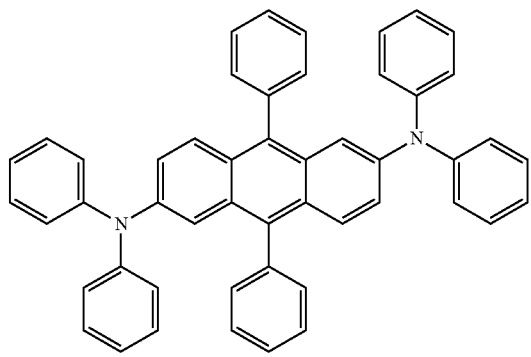

D2 (according to the invention)

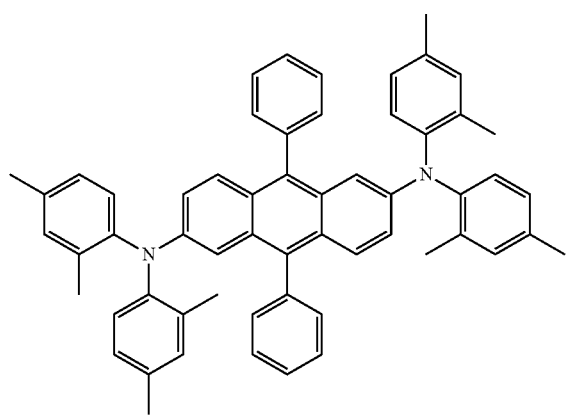

D3 (according to the invention)

TABLE 1-continued

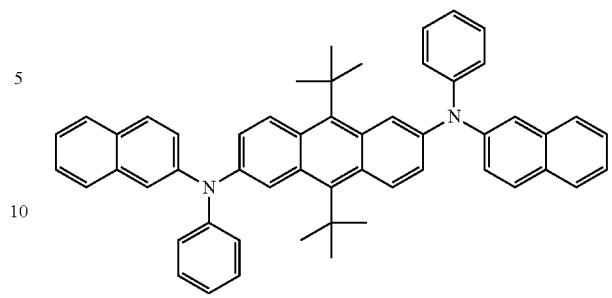

D4 (according to the invention)

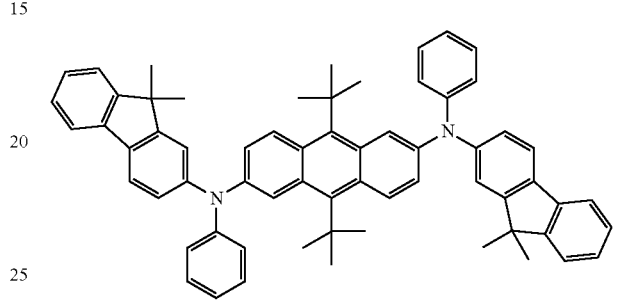

D5 (according to the invention)

All materials apart from PEDOT are applied by thermal vapour deposition in a vacuum chamber. The emission layer here always consists of a matrix material (host) and a dopant, with which the matrix material is admixed by co-evaporation. In Examples 1 and 2, the matrix material used is, for example, compound H1, which is in each case doped with one of dopants D1 to D3. The OLEDs exhibit green emission.

In order to characterise the OLEDs, the electroluminescence spectra, the current efficiency (measured in cd/A), the power efficiency (measured in lm/W) and the external quantum efficiency (EQE, measured in percent) as a function of the luminance, calculated from current/voltage/luminance characteristic lines (IUL characteristic lines), and the lifetime are determined. The lifetime is defined as the time after which the initial luminance of 25,000 cd/m$^2$ has dropped to half.

Table 2 shows Examples 1 to 12. In the OLEDs according to the invention, compounds D2-D5 are used as dopants in combination with matrix materials H2 and H4. In OLEDs in accordance with the prior art, dopant D1 is used, inter alia, in combination with matrix materials H1-H4.

For various dopants, different concentrations result in optimum results. Table 2 therefore shows data for components having optimised concentration ratios.

Only some of the examples are explained below. As revealed by the table, the results for other material combinations are qualitatively the same.

Dopants D2 and D3 according to the invention give significantly better results with respect to efficiency, lifetime and colour (higher CIE y coordinates) compared with dopant D1. This is shown by the comparison of Examples 3 to 6 (dopants D2 and D3 according to the invention) with Examples 1 and 2 (dopant D1). It is evident from the comparison of Examples 1 and 2 that the use of a benzanthracene-containing matrix material (H2) only brings a slight advantage in the case of dopant D1 compared with the use of matrix material H1. By contrast, a significant improvement in lifetime and efficiency and a slight improvement in the CIEY colour coordinates in the case of the use of dopants D2 and D3 are obtained on use of matrix material H2 compared with components which comprise matrix material H1. This is shown by the comparison of Examples 3 and 4 as well as 5 and 6 with one another.

TABLE 2

| Ex | Matrix | Dopant, concentration | Lifetime from 25000 cd/m² | Efficiency at 1000 cd/m² | EQE at 1000 cd/m² | CIE x/y at 1000 cd/m² |
|---|---|---|---|---|---|---|
| 1 (C) | H1 | D1, 10% | 110 h | 14.2 cd/A | 4.2% | 0.26/0.63 |
| 2 (C) | H2 | D1, 10% | 130 h | 14.4 cd/A | 4.3% | 0.27/0.63 |
| 3 (C) | H1 | D2, 3% | 235 h | 18.0 cd/A | 4.9% | 0.27/0.66 |
| 4 | H2 | D2, 3% | 310 h | 19.8 cd/A | 5.4% | 0.26/0.67 |
| 5 (C) | H1 | D3, 3% | 265 h | 17.6 cd/A | 4.8% | 0.26/0.66 |
| 6 | H2 | D3, 3% | 380 h | 20.5 cd/A | 5.6% | 0.26/0.67 |
| 7 (C) | H3 | D1, 10% | 120 h | 13.9 cd/A | 4.1% | 0.27/0.63 |
| 8 (C) | H4 | D1, 10% | 135 h | 14.3 cd/A | 4.2% | 0.27/0.63 |
| 9 (C) | H3 | D4, 4% | 220 h | 16.8 cd/A | 4.8% | 0.26/0.64 |
| 10 | H4 | D4, 4% | 295 h | 18.1 cd/A | 5.1% | 0.27/0.64 |
| 11 (C) | H3 | D5, 3% | 275 h | 17.9 cd/A | 4.9% | 0.26/0.66 |
| 12 | H4 | D5, 3% | 390 h | 21.2 cd/A | 5.8% | 0.26/0.66 |

The invention claimed is:

1. An organic electroluminescent device comprising an anode and a cathode and at least one electroluminescent layer arranged between the anode and cathode, wherein the electroluminescent layer comprises at least one compound of the formula (I)

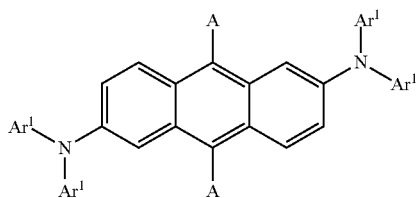

formula (I)

and at least one compound of the formula (IIa),

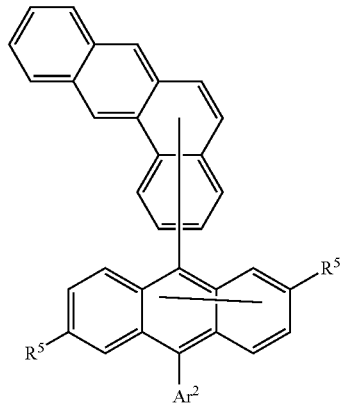

formula (IIa)

where the compound of the formula (I) is substituted by hydrogen at all free positions of the anthracene ring system and where the compound of the formula (IIa) is substituted by hydrogen at all free positions of the anthracene and benzanthracene ring system and where the following furthermore applies to the symbols occurring:

A is selected on each occurrence, identically or differently, from the following groups

where the symbol * denotes the bond to the anthracene group;

$Ar^1$ is selected on each occurrence, identically or differently, from the following groups

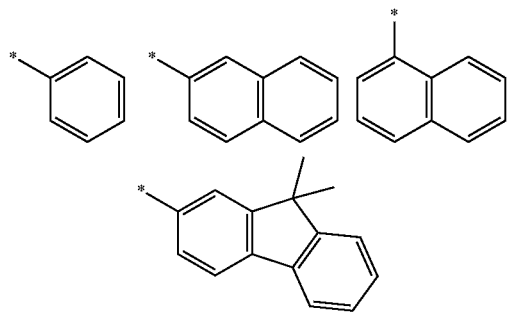

where the symbol * denotes the bond to the nitrogen atom and wherein the groups $Ar^1$ bonded to the same nitrogen atom in the compound of formula (I) are not identical;

$Ar^2$ is selected on each occurrence, identically or differently, from the following groups

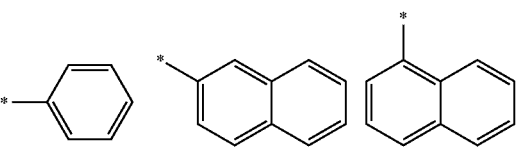

where the symbol * denotes the bond to the anthracene ring system, and the groups $Ar^2$ is substituted by hydrogen at all free positions;

$R^5$ is on each occurrence H, and wherein the bond between the benzanthracene group and the anthracene group in the compound of the formula (IIa) is in the 4-position of the benzanthracene group.

2. The organic electroluminescent device according to claim 1, wherein the compound of the formula (I) is employed as dopant and the compound of the formula (IIa) is employed as matrix material.

3. A process for the production of the organic electroluminescent device according to claim 1, which comprises applying one or more layers of the device from solution and/or by a sublimation process.

4. A mixture comprising at least one compound of the formula (I)

formula (I)

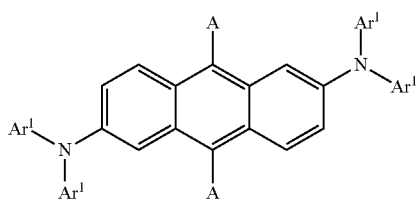

and at least one compound of the formula (IIa)

formula (IIa)

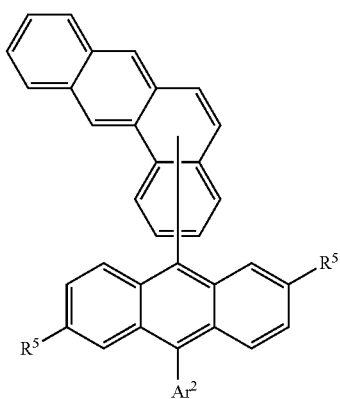

where the compound of the formula (I) is substituted by hydrogen at all free positions of the anthracene ring system and where the compound of the formula (IIa) is substituted by hydrogen at all free positions of the anthracene and benzanthracene ring system and where the following furthermore applies to the symbols occurring:

A is selected on each occurrence, identically or differently, from the following groups

where the symbol * denotes the bond to the anthracene group;

$Ar^1$ is selected on each occurrence, identically or differently, from the following groups:

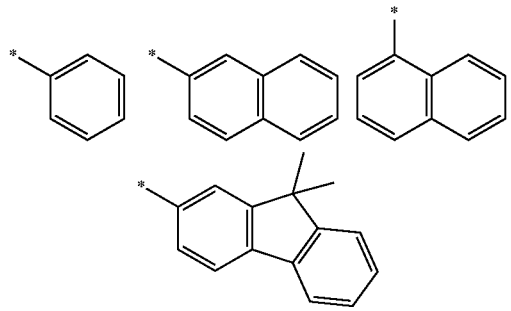

and wherein the groups $Ar^1$ bonded to the same nitrogen atom in the compound of formula (I) are not identical;

$Ar^2$ is selected on each occurrence, identically or differently, from the following groups

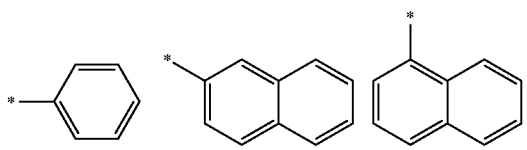

where the symbol * denotes the bond to the anthracene ring system, and the groups $Ar^2$ is substituted by hydrogen at all free positions;

$R^5$ is, on each occurrence, H;

and wherein the bond between the benzanthracene group and the anthracene group in the compound of the formula (II) is in the 4-position of the benzanthracene group.

5. A formulation comprising a mixture according to claim 4 and at least one solvent.

* * * * *